US006841310B2

(12) United States Patent
Dulman

(10) Patent No.: US 6,841,310 B2
(45) Date of Patent: Jan. 11, 2005

(54) RADIATION PATTERNING TOOLS, AND METHODS OF FORMING RADIATION PATTERNING TOOLS

(75) Inventor: H. Daniel Dulman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 253 days.

(21) Appl. No.: 10/072,440

(22) Filed: Feb. 5, 2002

(65) Prior Publication Data

US 2003/0152844 A1 Aug. 14, 2003

(51) Int. Cl.[7] ................................................ G03F 9/00
(52) U.S. Cl. ....................................................... 430/5
(58) Field of Search ............................. 430/5, 311, 313

(56) References Cited

U.S. PATENT DOCUMENTS

| 5,208,125 A | 5/1993 | Lowrey et al. ................. 430/5 |
| 5,217,830 A | 6/1993 | Lowrey ......................... 430/5 |
| 5,308,721 A | 5/1994 | Garofalo et al. ............... 430/5 |
| 2002/0177078 A1 * | 11/2002 | Blatchford ................... 430/313 |

OTHER PUBLICATIONS

Kobayashi, S. et al., "Development of Simplified Process for KrF Excimer Halt–tone Mask with Chrome–Shielding Method". 19th Annual BACUS Sympos. on Photomask Technology, Monterey, CA. Sep. 1999. SPIE vol. 3873 pp. 288–296.

Kobayashi, S. et al., "Development of Simplified Process for KrF Excimer Half–Tone Mask with Chrome–Shielding Method (II)", 20th Annual BACUS Sympos on Photomask Technology, Proceedings of SPIE vol. 4186 (2001). pp. 801–809.

Lim, S. et al., "Application of Alternating Phase–Shifting Masks to Sub–Quarter Micron Contact Holes", SPIE vol. 2726, feb. 1996, pp. 516–523.

Lim, S. et al., "Application of Alternating Phase–Shifting Masks to 200nm Contact Holes", SPIE vol. 2884, Jul. 1996, pp. 243–254.

* cited by examiner

Primary Examiner—S. Rosasco
(74) Attorney, Agent, or Firm—Wells St. John P.S.

(57) ABSTRACT

The invention includes, for example, a radiation patterning tool which can be utilized to form relatively circular contacts in situations in which an array of contacts has a different pitch along a row of the array than along a column of the array. An alternating phase shift can give a well-defined contact in the small pitch (dense) direction. Rim shifters are added in the larger pitch direction to force the circular form of the contact openings. In further aspects of the invention, side-lobe-suppressing patterns can be added between adjacent rims. The invention also includes methods of forming radiation patterning tools.

96 Claims, 53 Drawing Sheets

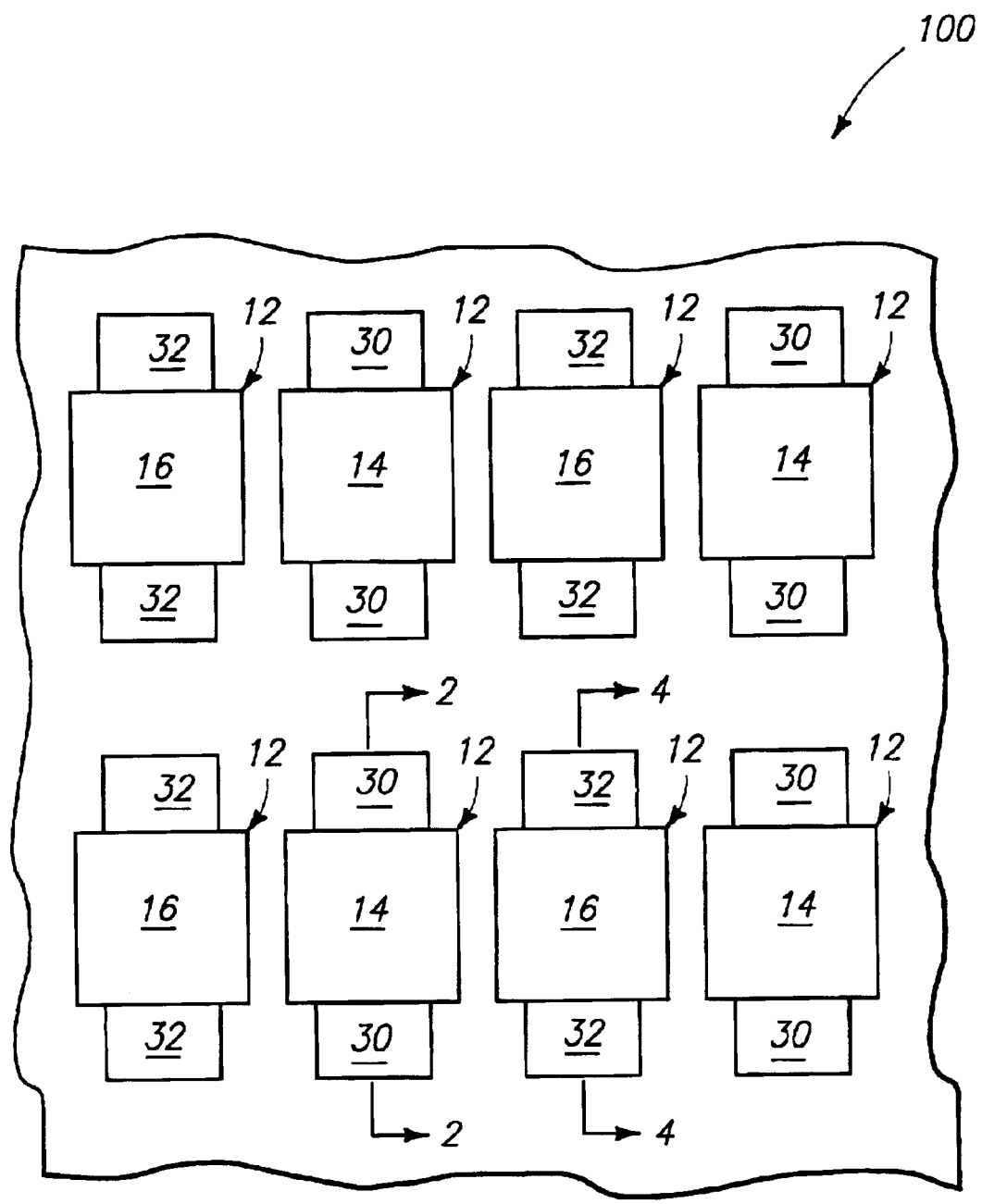

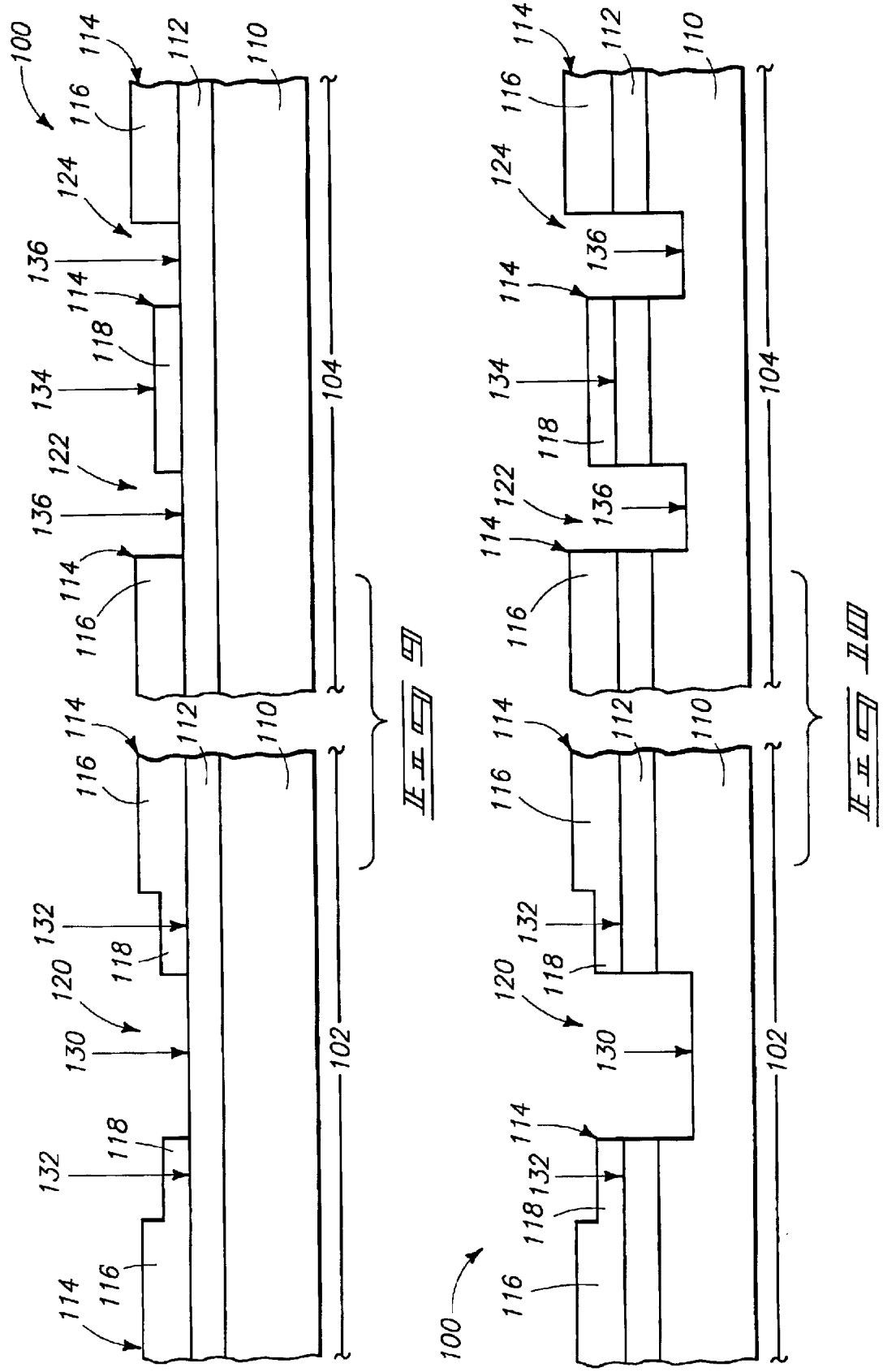

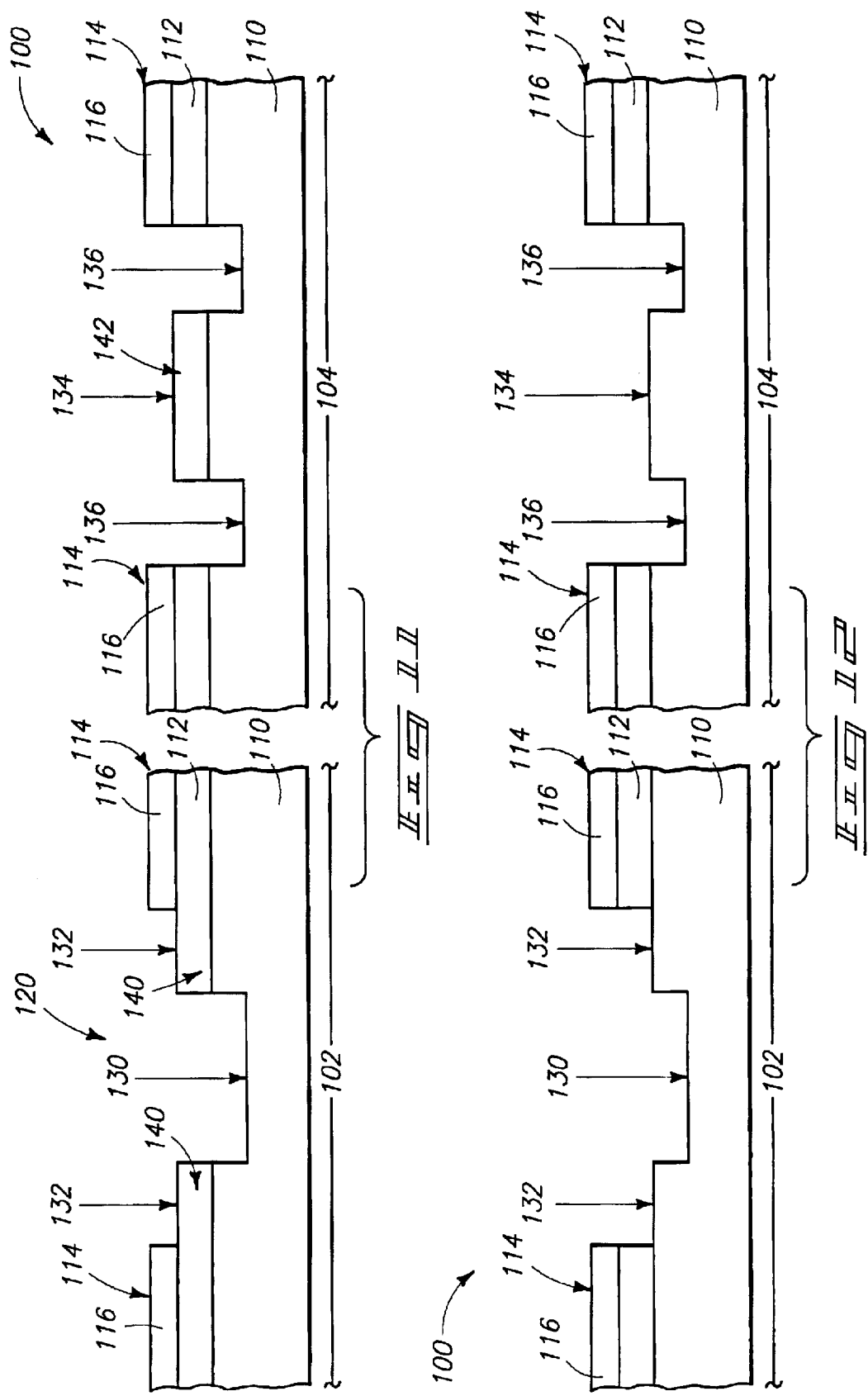

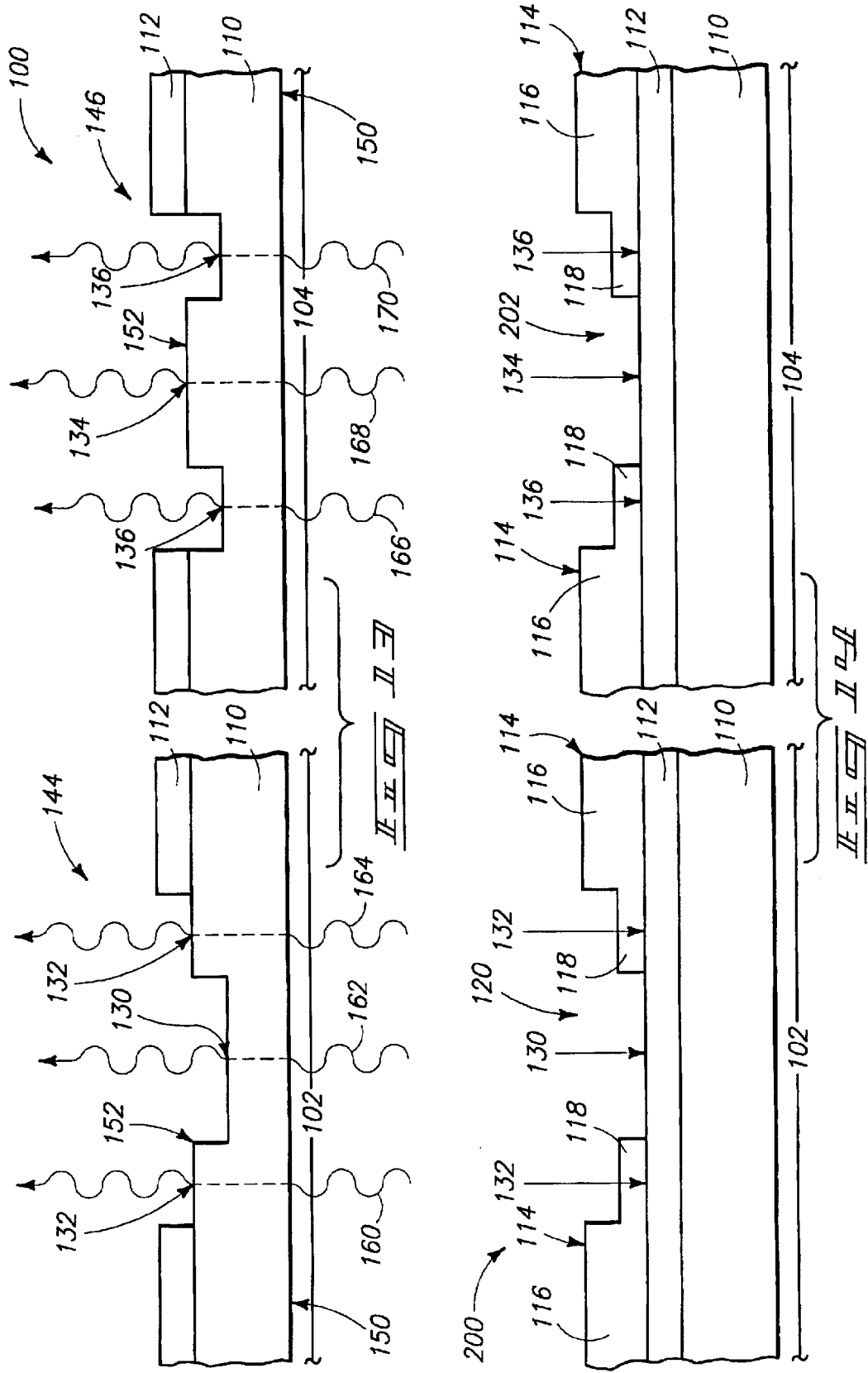

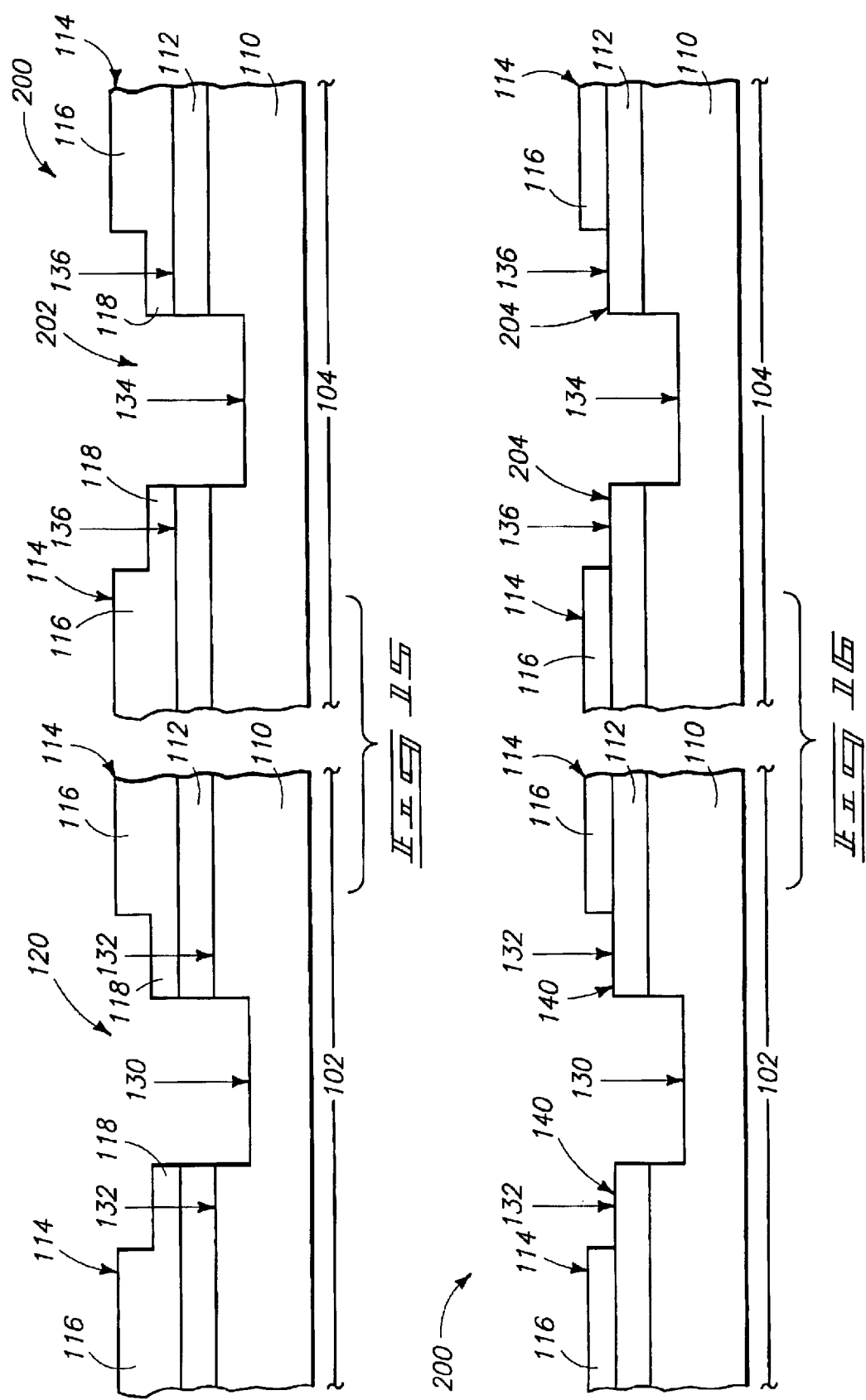

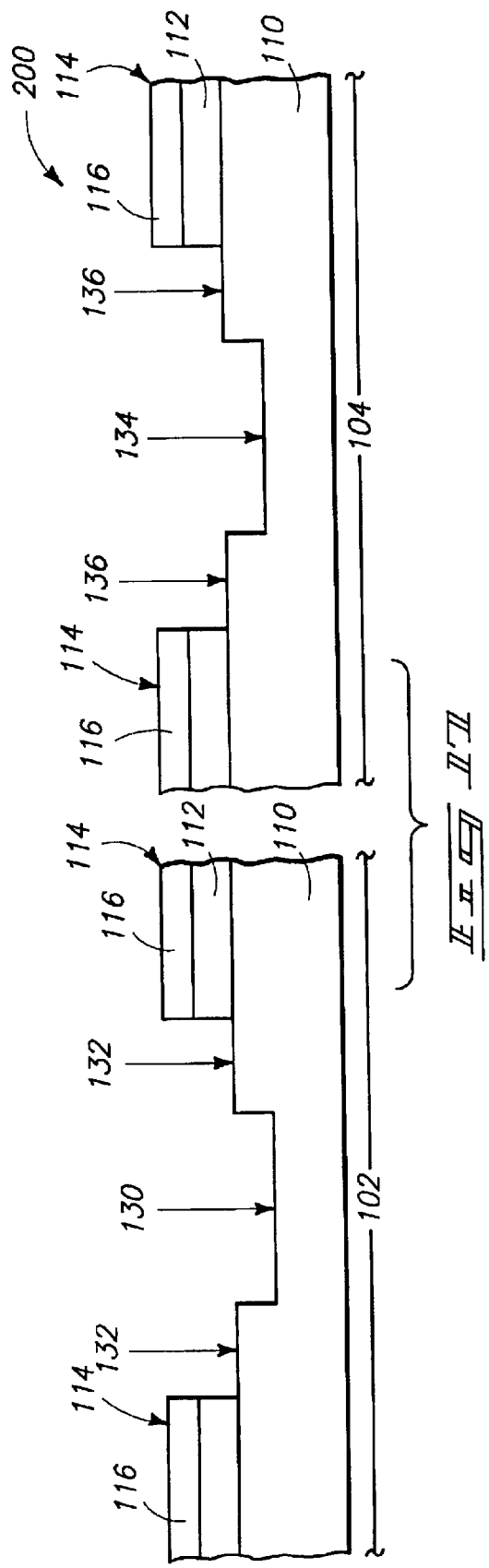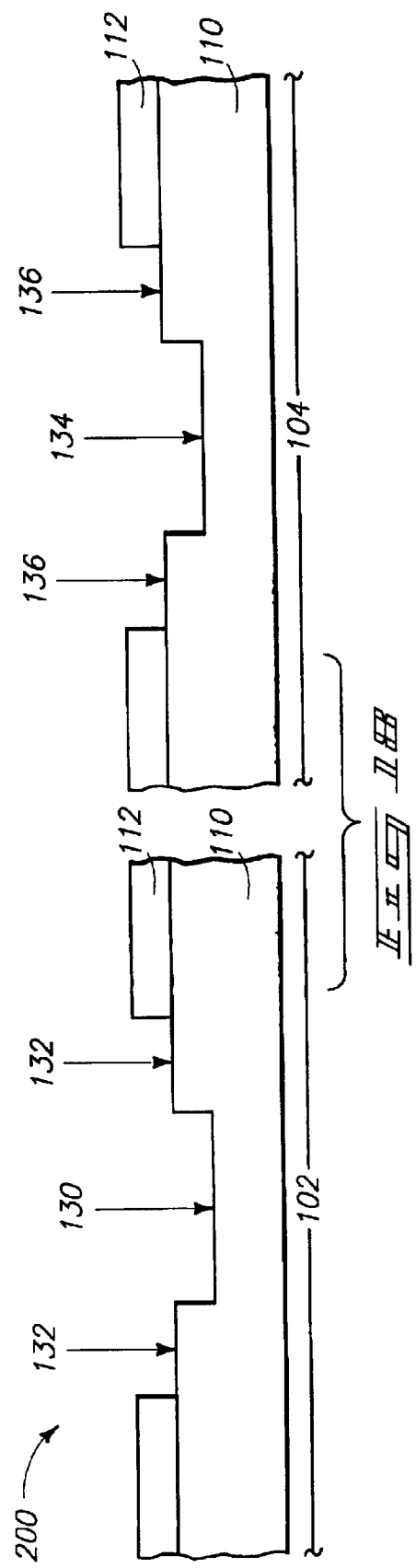

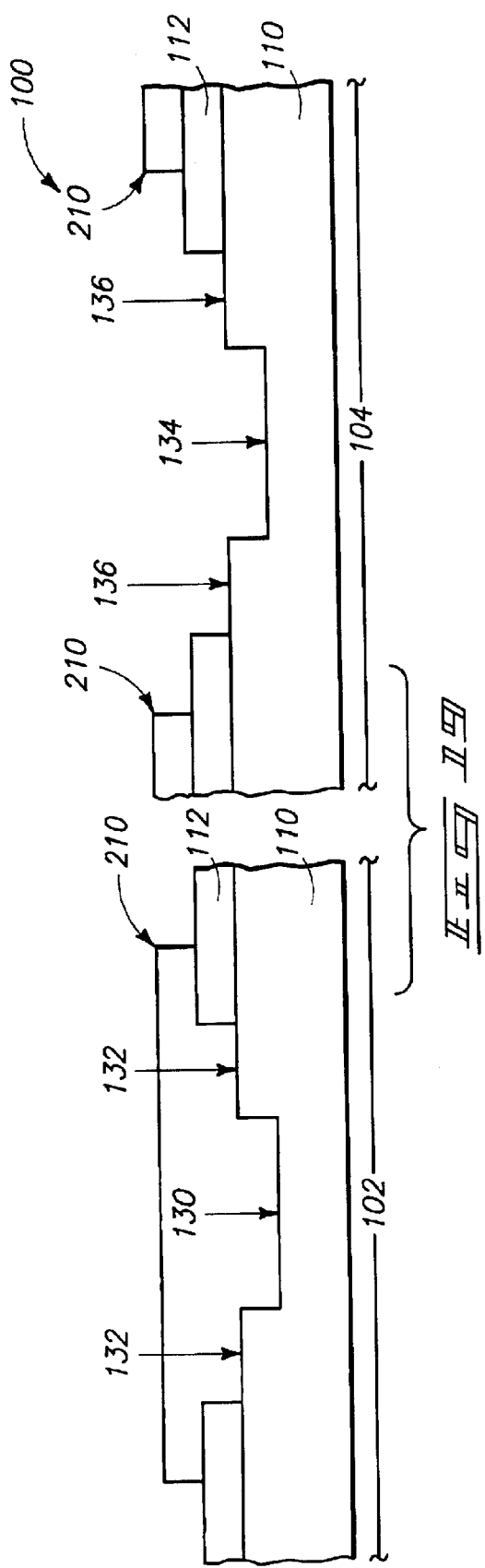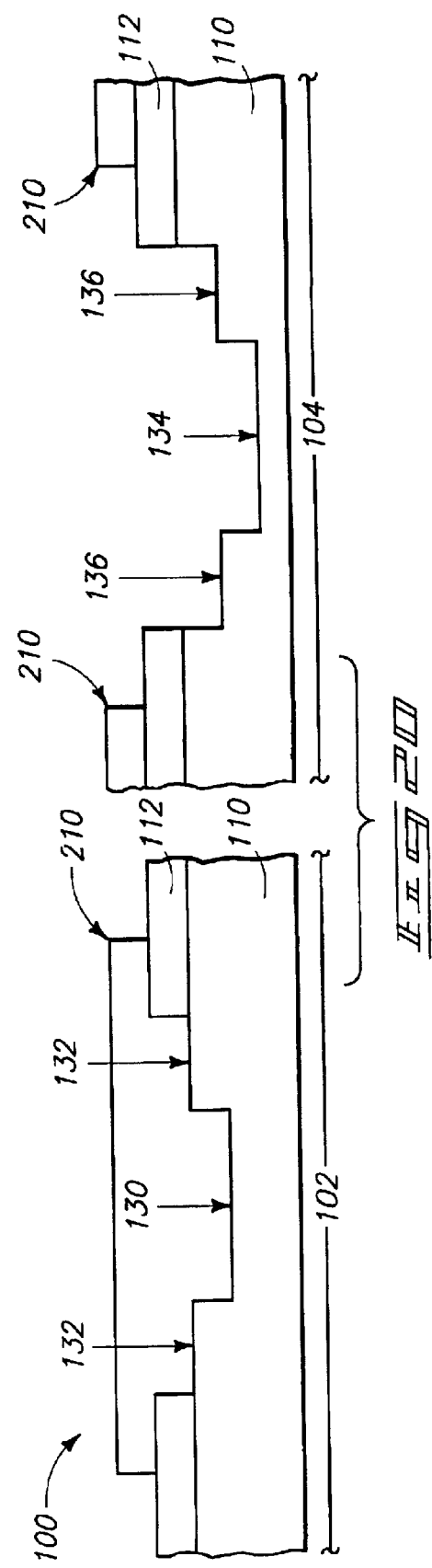

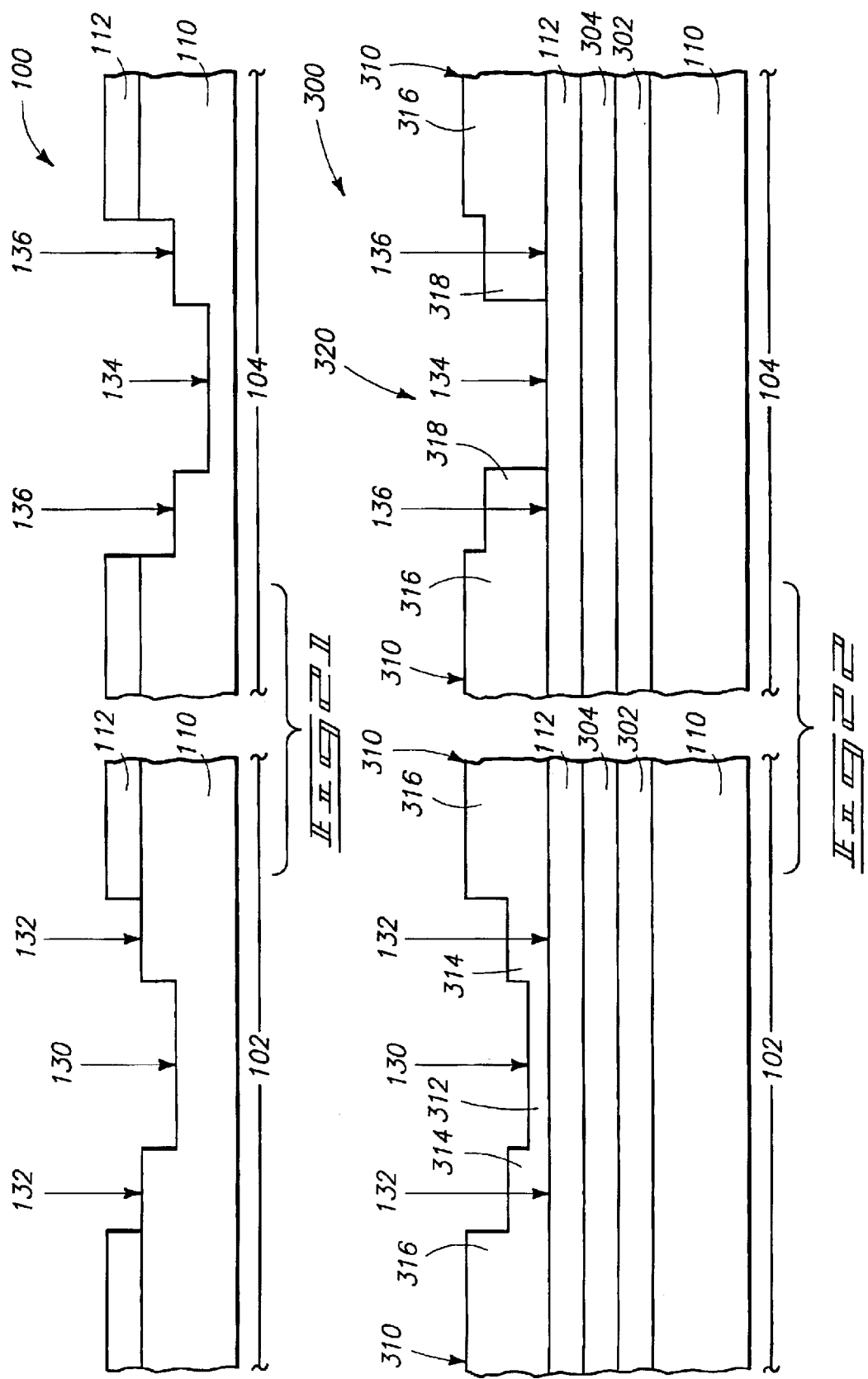

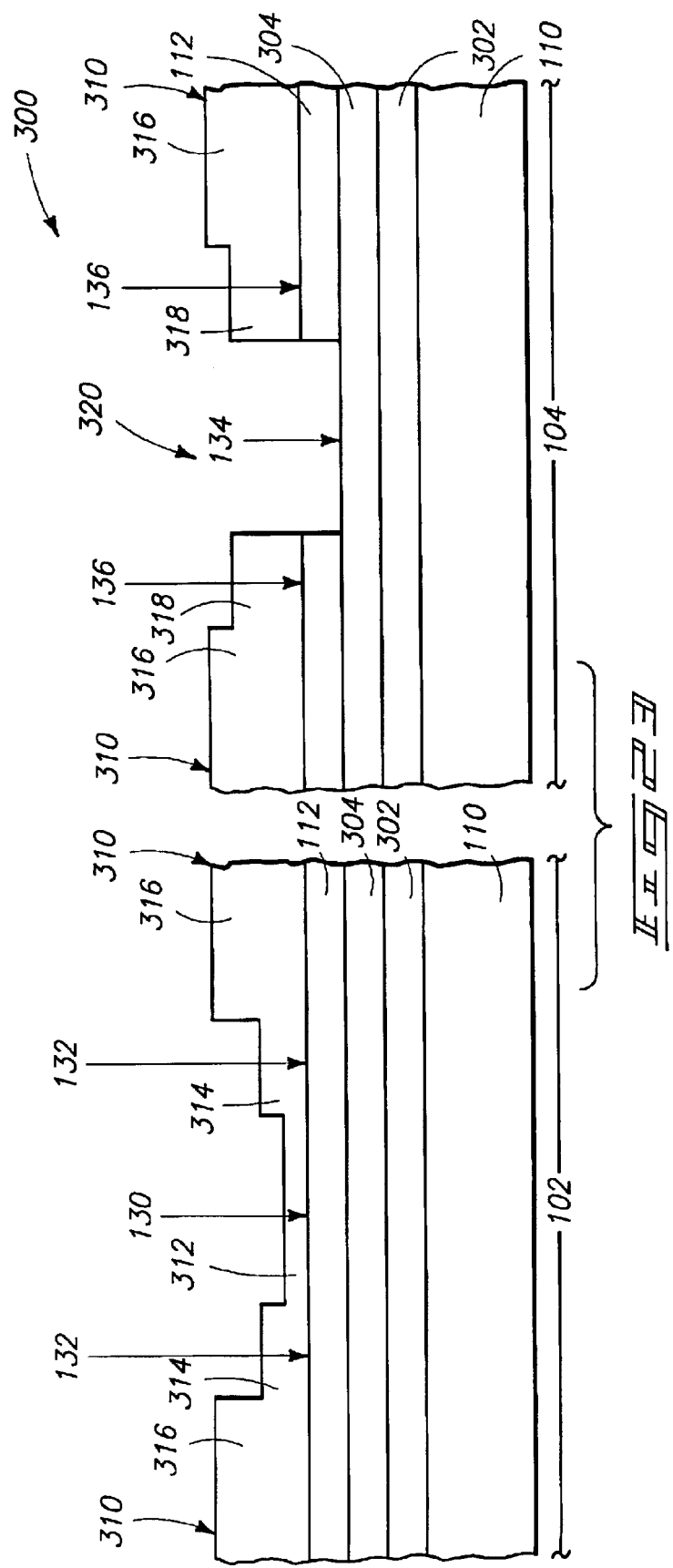

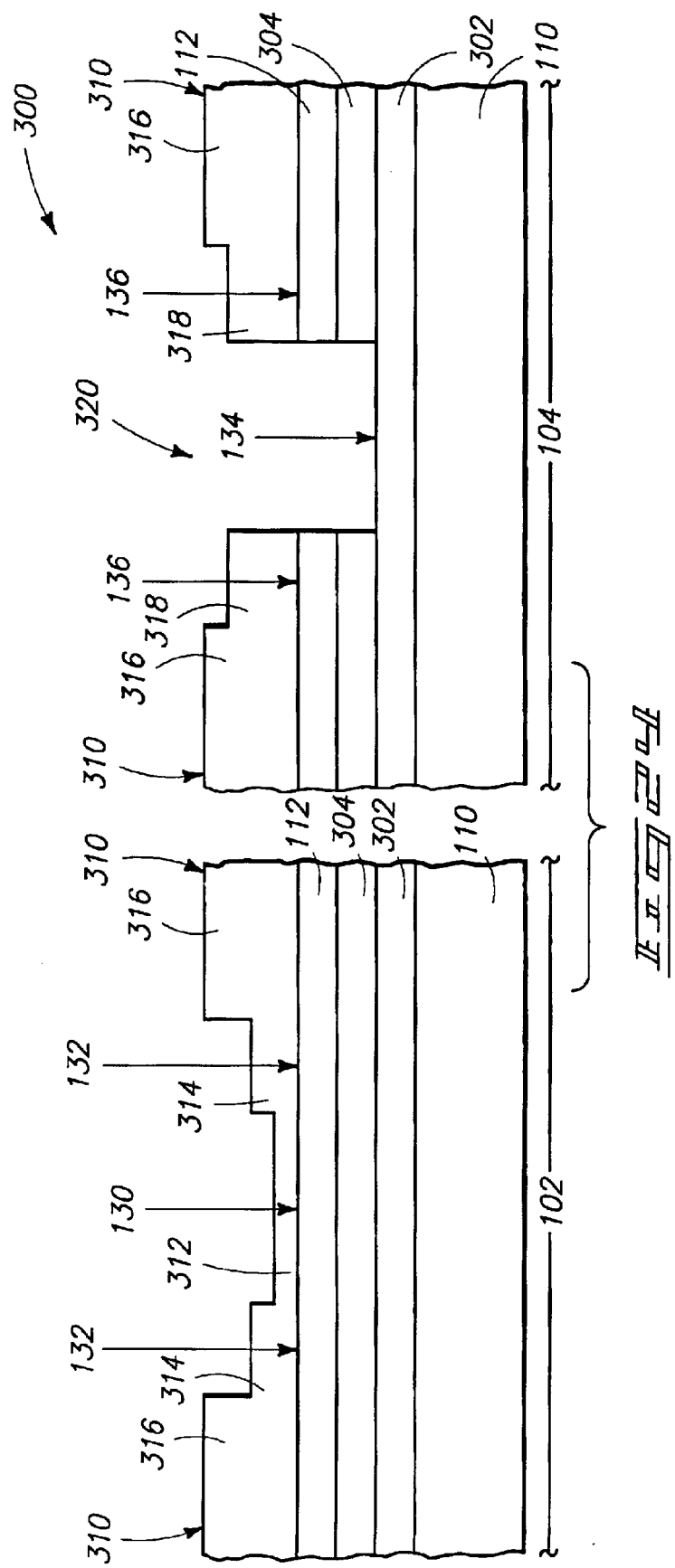

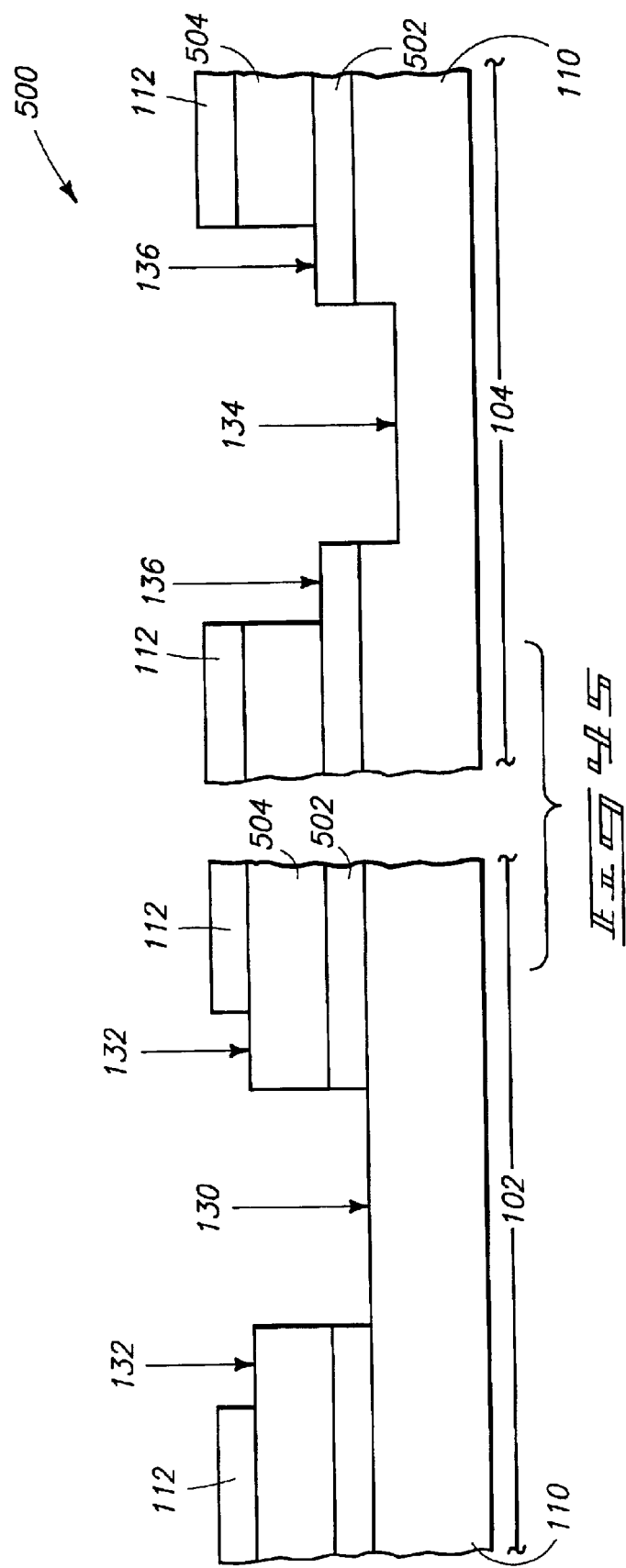

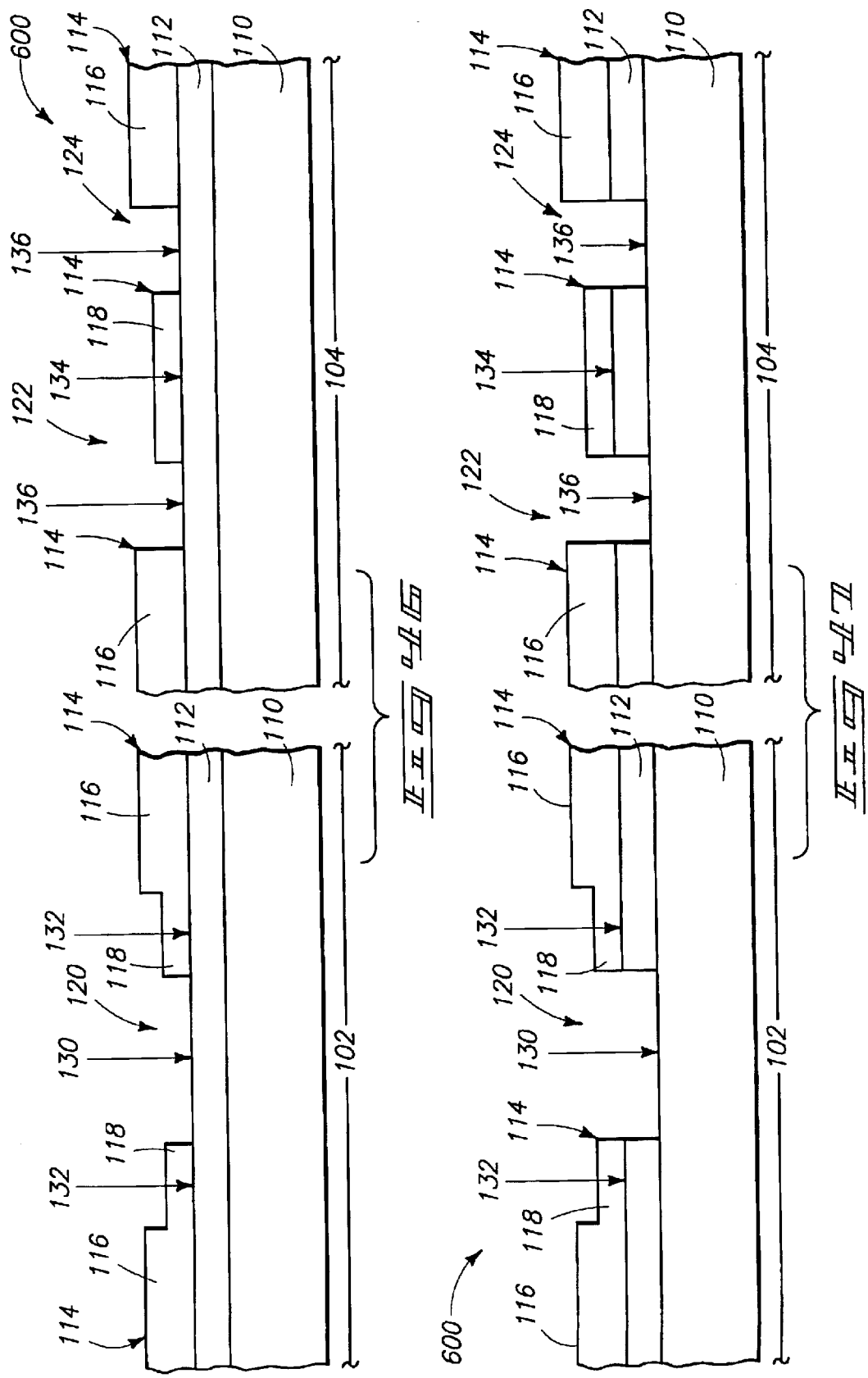

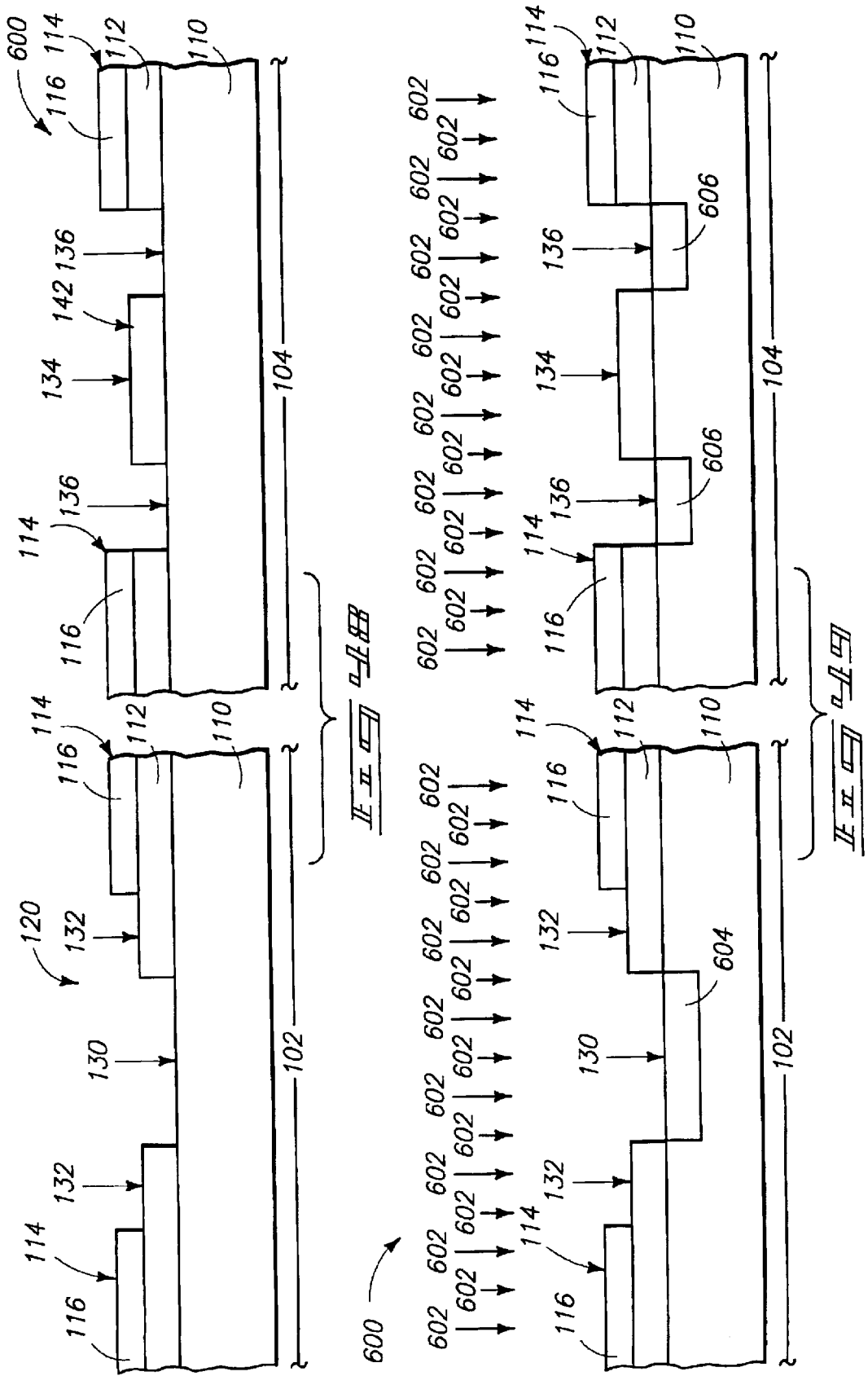

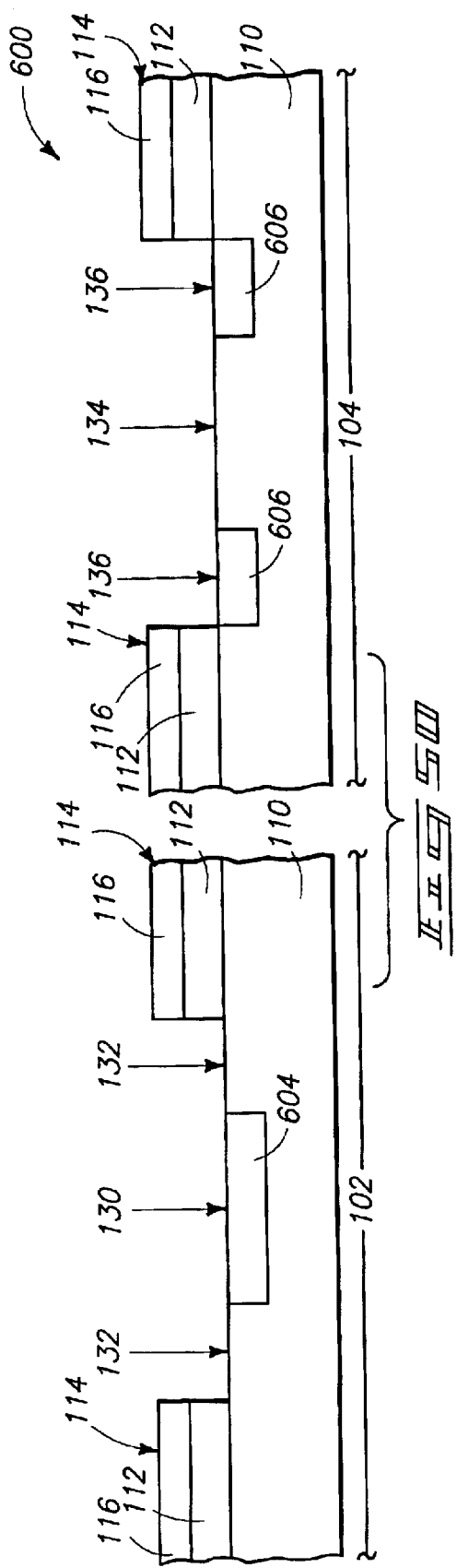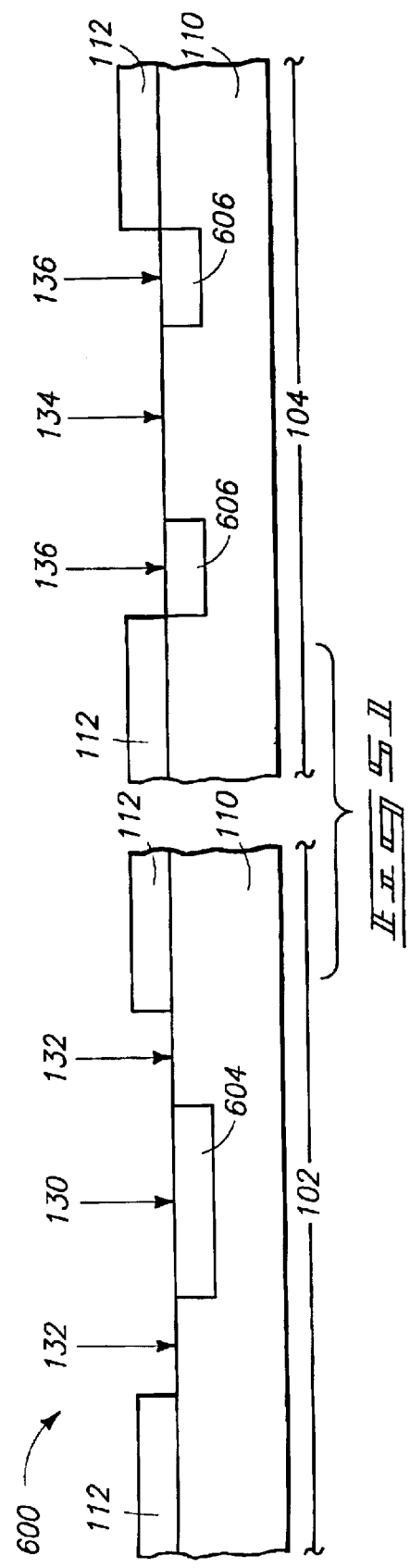

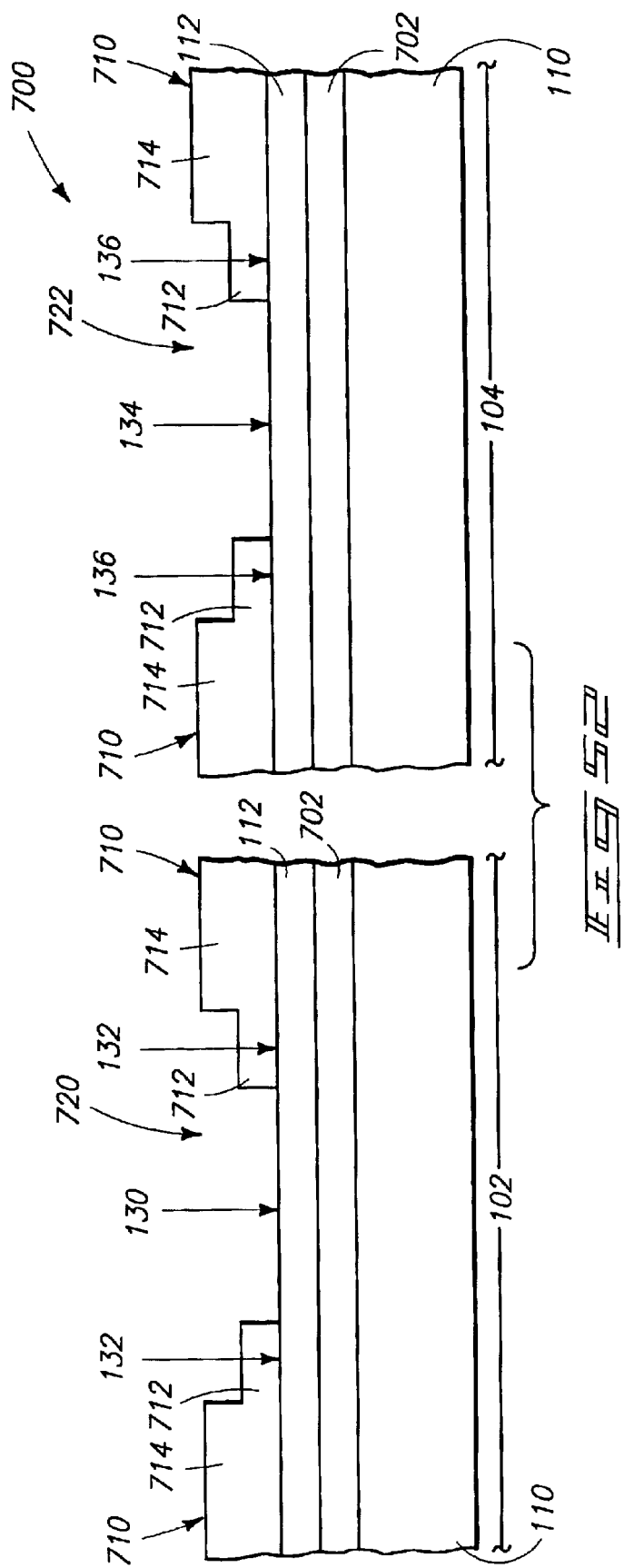

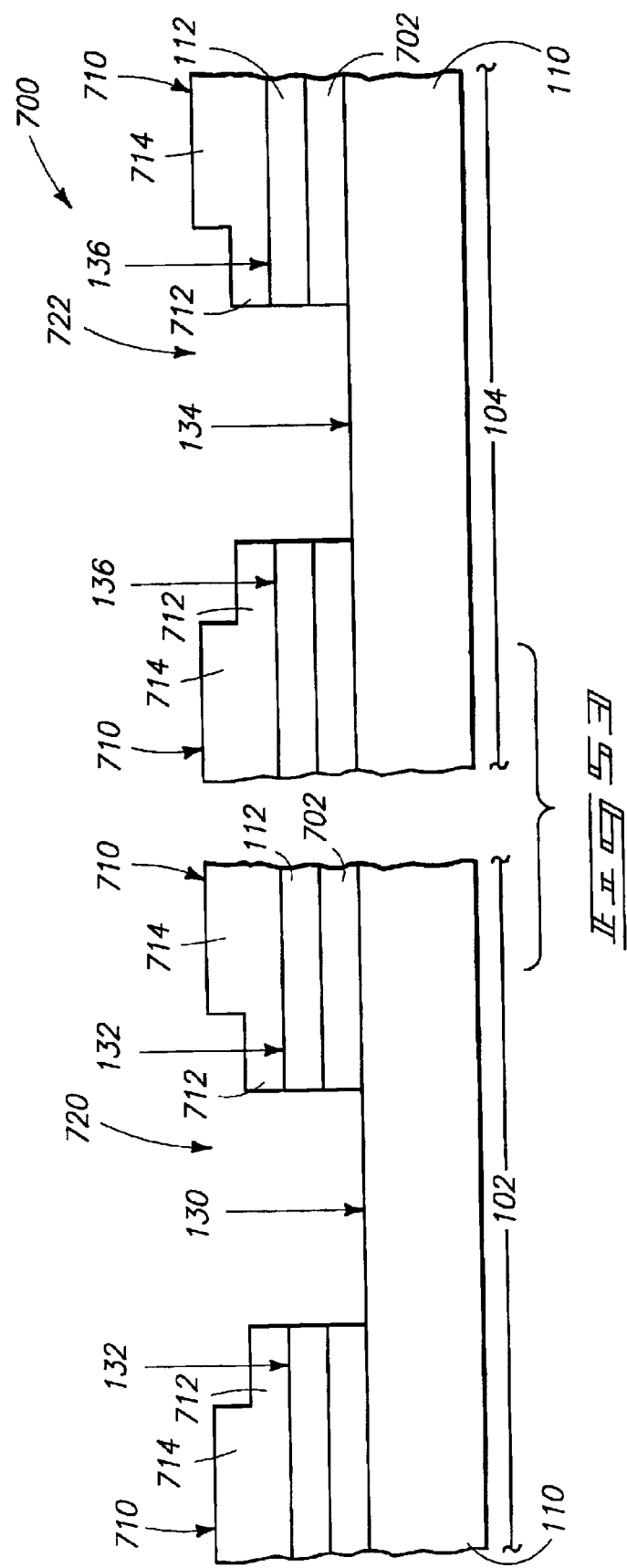

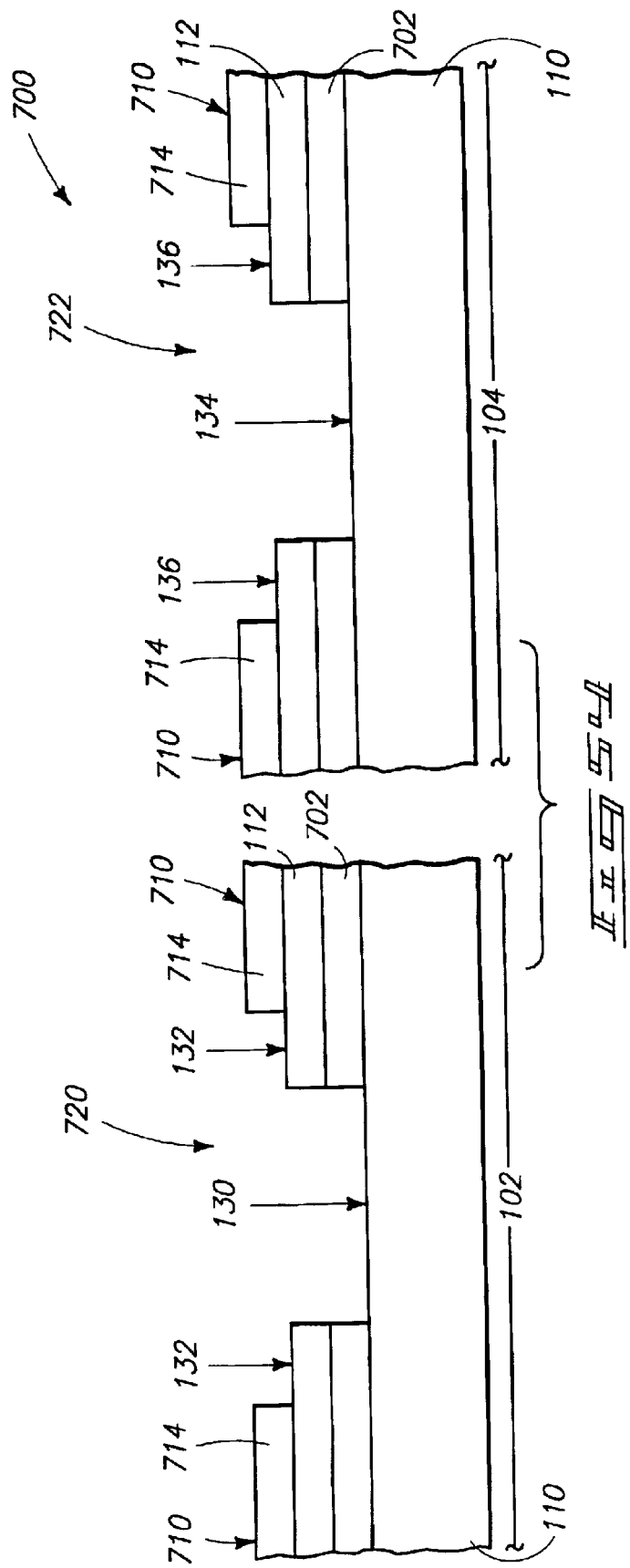

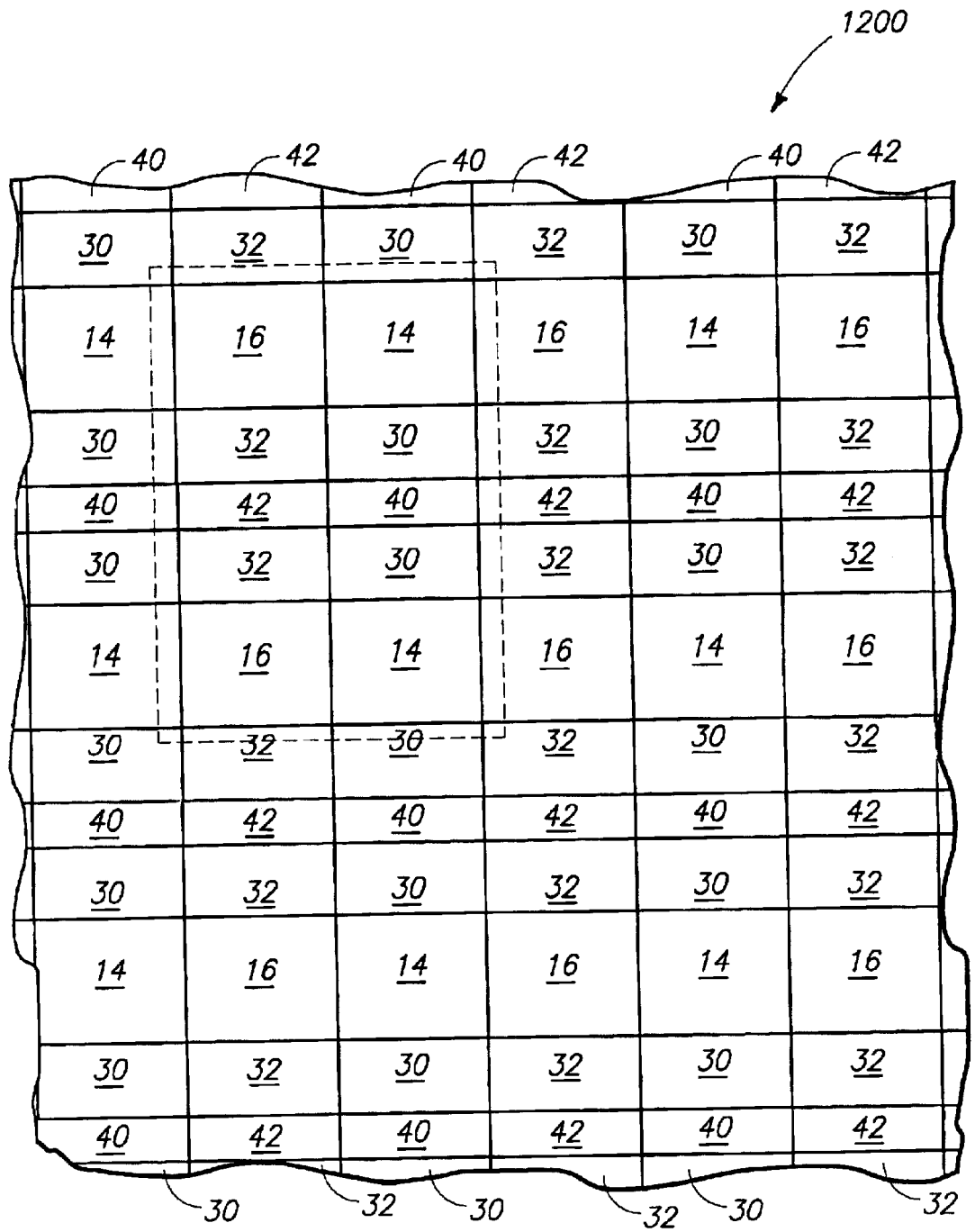

RADIATION PATTERNING TOOLS, AND METHODS OF FORMING RADIATION PATTERNING TOOLS

TECHNICAL FIELD

The invention pertains to radiation patterning tools, and to methods of forming radiation patterning tools. In particular aspects, the invention pertains to radiation patterning tools in which a rim is formed proximate a feature pattern. The rim is configured to impart a rotation in phase to light passing through the rim which is about 180 degrees from a rotation in phase imparted to the wavelength of light as it passes through the feature pattern.

BACKGROUND OF THE INVENTION

Photolithography is commonly used during formation of integrated circuits on semiconductor wafers. More specifically, a form of radiant energy (such as, for example, ultraviolet light) is passed through a radiation patterning tool and onto a semiconductor wafer. The radiation patterning tool can be, for example, a photomask or a reticle, with the term "photomask" traditionally being understood to refer to masks which define a pattern for an entirety of a wafer, and the term "reticle" traditionally being understood to refer to a patterning tool which defines a pattern for only a portion of a wafer. However, the terms "photomask" (or more generally "mask") and "reticle" are frequently used interchangeably in modern parlance, so that either term can refer to a radiation patterning tool that encompasses either a portion or an entirety of a wafer.

Radiation patterning tools contain light restrictive regions (for example, totally opaque or attenuated/half-toned regions) and light transmissive regions (for example, totally transparent regions) formed in a desired pattern. A grating pattern, for example, can be used to define parallel-spaced conductive lines on a semiconductor wafer. The wafer is provided with a layer of photosensitive resist material commonly referred to as photoresist. Radiation passes through the radiation patterning tool onto the layer of photoresist and transfers the mask pattern to the photoresist. The photoresist is then developed to remove either the exposed portions of photoresist for a positive photoresist or the unexposed portions of the photoresist for a negative photoresist. The remaining patterned photoresist can then be used as a mask on the wafer during a subsequent semiconductor fabrication step, such as, for example, ion implantation or etching relative to materials on the wafer proximate the photoresist.

Advances in semiconductor integrated circuit performance have typically been accompanied by a simultaneous decrease in integrated circuit device dimensions and a decrease in the dimensions of conductor elements which connect those integrated circuit devices. The demand for ever smaller integrated circuit devices brings with it demands for ever-decreasing dimensions of structural elements, and ever-increasing requirements for precision and accuracy in radiation patterning with reticles and photomasks.

A pattern which is frequently desired to be imparted to photoresist is a circle, and it can be particularly desired to form circles having diameters on the order of microns, and even more desired to form circles having diameters on the order of sub-microns. The circle can have numerous applications in forming semiconductor circuitry, such as, for example, applications in forming cylindrical openings. Difficulties exist in fabricating reticles which can pattern circles having diameters on the order of microns and sub-microns. Typically, ovals are patterned instead of the desired circles, which can cause more semiconductor real estate to be consumed than would be utilized if circles could be generated. It would be desirable to develop radiation patterning tools which could pattern circular shapes at the micron and sub-micron level, or at least generate more substantially circular shapes than are produced by present methods.

Other shapes, besides circular shapes, can be desired in various semiconductor processes. It is generally desired to accurately print the desired shapes, but such is frequently difficult. If a shape is not accurately printed, it can overlap in regions where it is not desired, and ultimately lead to circuit shorts, or other undesired problems. It is therefore desired to develop photolithographic methods and devices which can be utilized to accurately print desired shapes.

SUMMARY OF THE INVENTION

In particular aspects, the invention includes a radiation patterning tool which can be utilized to form relatively circular contacts in situations in which an array of contacts has a different pitch along a row of the array than along a column of the array. An alternating phase shift can give a well-defined contact in the small pitch (dense) direction. Rim shifters are added in the larger pitch direction to force the circular form of the contact openings. In further aspects of the invention, side-lobe-suppressing patterns can be formed between adjacent rims. Among the advantages of the invention is that a radiation patterning tool can be formed and utilized without an attenuated phase shift mask, but instead with only rim shifters provided in addition to the feature patterns otherwise present on the radiation patterning tool. Additionally, the rims of the rim shifters can be formed to be large enough (greater than or equal to 0.1 micron at 1×) to be readily fabricated with existing technology. Further, if the width and length of the rims are appropriately modified, side lobes can be eliminated, and accordingly "pseudo-contacts" (additional sub-resolution windows) can be avoided.

In one aspect, the invention encompasses a radiation patterning tool having a feature pattern with a periphery, and configured to impart a first rotation in phase to a wavelength of light passing through the feature pattern. The radiation patterning tool also includes a rim along a portion of the feature pattern periphery but not along an entirety of the feature pattern periphery. The rim is configured to impart a second rotation in phase to the wavelength of light when the wavelength passes through the rim. The second rotation in phase is from about 170° to about 190° relative to the first rotation in phase.

In a particular aspect, the invention encompasses a radiation patterning tool comprising an array of feature patterns arranged in rows and columns. The feature patterns are configured to rotate a phase of a wavelength of light as the light passes through the feature patterns. The feature patterns include a first type which imparts a first rotation to the phase, and a second type with imparts a second rotation to the phase. The second rotation is from about 170° to about 190° relative to the first rotation. The two types of feature patterns alternate with one another along rows of the array. A plurality of first rims are provided and configured to impart the first rotation to the phase of wavelength of light. The first rims are along edges of the second type of feature patterns. Also, a plurality of second rims are provided along edges of the first type of feature patterns. The second rims are configured to impart the second rotation to the phase of the wavelength of light. The first and second rims are along columns of the array.

The invention also encompasses methods of forming radiation patterning tools.

BRIEF DESCRIPTION OF THE DRAWINGS

Preferred embodiments of the invention are described below with reference to the following accompanying drawings. The file of this patent contains at least one drawing executed in color. Copies of this patent with color drawing(s) will be provided by the Patent and Trademark Office upon request and payment of the necessary fee.

FIG. 8 is a diagrammatic, top view of a fragment of a radiation patterning tool encompassed by the present invention. FIG. 8 illustrates cross-sectional views 2 and 4 which are utilized in the drawings 9–58 which follow. Specifically, each of drawings 9–58 comprises a pair of fragments of a radiation patterning tool shown in cross-sectional view. A leftmost fragment of the pair is shown along the line 2—2 of FIG. 8, and a rightmost fragment of the pair is shown along the line 4—4 of FIG. 8. FIG. 8 shows a completed structure, and the embodiments of FIGS. 9–58 correspond to exemplary processing which can form such completed structure.

FIG. 9 shows a radiation patterning tool substrate at a preliminary processing step of a first embodiment method of the present invention for forming a radiation patterning tool. A pair of fragments of the substrate are illustrated, with a leftmost fragment of the pair corresponding to line 2—2 of FIG. 8, and the rightmost fragment of the pair corresponding to a cross-section along the line 4—4 of FIG. 8.

FIG. 10 is a diagrammatic, cross-sectional view of the FIG. 9 fragments shown at a processing step subsequent to that of FIG. 9.

FIG. 11 is a diagrammatic, cross-sectional view of the FIG. 9 fragments shown at a processing step subsequent to that of FIG. 10.

FIG. 12 is a diagrammatic cross-sectional view of the FIG. 9 fragments shown at a processing step subsequent to that of FIG. 11.

FIG. 13 is a diagrammatic, cross-sectional view of the FIG. 9 fragments shown at a processing step subsequent to that of FIG. 12.

FIG. 14 is diagrammatic, cross-sectional view of a pair of fragments of a reticle substrate shown at a preliminary processing step of a second embodiment method of the present invention. A leftmost of the shown fragments corresponds to a cross-sectional view along the line 2—2 of FIG. 8, and a rightmost fragment corresponds to a view along the line 4—4 of FIG. 8.

FIG. 15 shows the FIG. 14 fragments at a processing step subsequent to that of FIG. 14.

FIG. 16 shows the FIG. 14 fragments at a processing step subsequent to that of FIG. 15.

FIG. 17 shows the FIG. 14 fragments at a processing step subsequent to that of FIG. 16.

FIG. 18 shows the FIG. 14 fragments at a processing step subsequent to that of FIG. 17.

FIG. 19 shows the FIG. 14 fragments at a processing step subsequent to that of FIG. 18.

FIG. 20 shows the FIG. 14 fragments at a processing step subsequent to that of FIG. 19.

FIG. 21 shows the FIG. 14 fragments at a processing step subsequent to that of FIG. 20.

FIG. 22 illustrates a fragmentary, cross-sectional view of a semiconductor substrate shown at a preliminary processing step of a third embodiment method of the present invention. Specifically, FIG. 22 illustrates a pair of fragments of the substrate, with the leftmost fragment corresponding to the view along the line 2—2 of FIG. 8 and the rightmost fragment corresponding to a view along the line 4—4 of FIG. 8.

FIG. 23 is a view of the FIG. 22 fragments shown at a processing step subsequent to that of FIG. 22.

FIG. 24 is a view of the FIG. 22 fragments shown at a processing step subsequent to that of FIG. 23.

FIG. 32 illustrates a pair of fragments of the substrate, with the leftmost of the fragments corresponding to the view along the line of 2—2 of FIG. 8 and a rightmost of the fragments corresponding to the view along the line 4—4 of FIG. 8.

FIG. 40 shows the FIG. 39 fragments at a processing step subsequent to that of FIG. 39.

FIG. 45 shows the FIG. 39 fragments at a processing step subsequent to that of FIG. 44.

FIG. 46 illustrates a diagrammatic, cross-sectional view of a radiation patterning tool substrate at a preliminary processing step of yet another embodiment of the present invention. FIG. 46 illustrates a pair of fragments, with a leftmost fragment corresponding to the view 2—2 of FIG. 8, and a rightmost fragment corresponding to the view 4—4 of FIG. 8.

FIG. 47 shows the FIG. 46 fragments at a processing step subsequent to that of FIG. 46.

FIG. 48 shows the FIG. 46 fragments at a processing step subsequent to that of FIG. 47.

FIG. 49 shows the FIG. 46 fragments at a processing step subsequent to that of FIG. 48.

FIG. 50 shows the FIG. 46 fragments at a processing step subsequent to that of FIG. 49.

FIG. 51 shows the FIG. 46 fragments at a processing step subsequent to that of FIG. 50.

FIG. 52 shows a radiation patterning tool substrate at a preliminary processing step of yet another embodiment of the present invention. FIG. 52 diagrammatically illustrates a pair of fragments in cross-sectional view, with a leftmost of the fragments corresponding to a cross section along the line 2—2 of FIG. 8, and the rightmost of the fragments corresponding to a view along the line 4—4 of FIG. 8.

FIG. 53 shows the FIG. 52 fragments at a processing step subsequent to that of FIG. 52.

FIG. 54 shows the FIG. 52 fragments at a processing step subsequent to that of FIG. 53.

FIG. 63 is a diagrammatic, top view of a fragment of yet another embodiment radiation patterning tool encompassed by the present invention.

DETAILED DESCRIPTION OF THE PREFERRED EMBODIMENTS

In particular aspects, the invention encompasses new radiation patterning tool constructions, as well as various methods for forming radiation patterning tool constructions. Exemplary radiation patterning tool constructions encompassed by the present invention are described with reference to FIGS. 1–5, 8 and 59–63.

Figure 1:
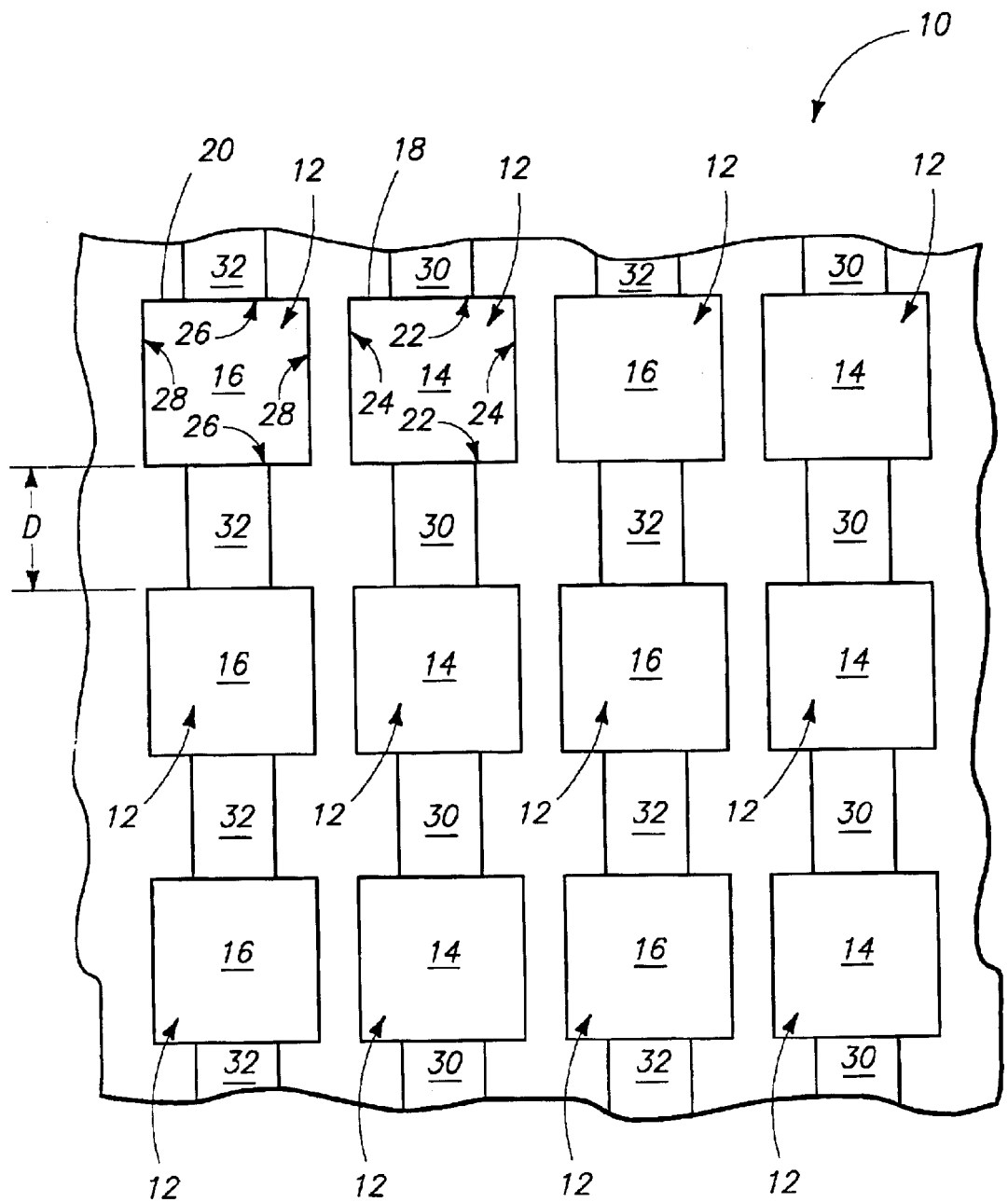
FIG. 1 is a diagrammatic, top view of a fragment of a first embodiment radiation patterning tool encompassed by the present invention.

Referring initially to FIG. 1, a first embodiment radiation patterning tool construction 10 comprises an array of feature patterns 12 arranged in vertically-extending columns and horizontally-extending rows. The feature patterns 12 are divided between a pair of defined types. Specifically, some of the feature patterns 12 are a first type 14 (also referred to herein as first feature patterns) and others are a second type 16 (also referred to herein as second feature patterns). The first type of feature pattern rotates a phase of a wavelength of light to a first orientation as the wavelength passes through it; and the second type of feature pattern rotates the phase of the wavelength of light to a second orientation as the wavelength passes through it. The second orientation can be from about 170° to about 190° relative to the first orientation, can be about 180° relative to the first orientation, and can be exactly 180° relative to the first orientation. The light passing through feature patterns 12 of radiation patterning tool 10 will ultimately be utilized to form features on a photoresist exposed to the light after it has passed through radiation patterning tool 10. The features formed in the photoresist can be in any desired pattern. In particular applications, the features are substantially circular, and can, for example, be exact circles to within errors of measurement.

In the shown embodiment, the first and second types of feature patterns alternate with one another along rows of the array, but do not alternate with one another along columns of the array.

Each of the feature patterns has a periphery, and in the illustration of FIG. 1 a periphery of a first feature pattern 14 is labeled with the numeral 18, and a periphery of a second feature pattern 16 is labeled with numeral 20. The shown, preferred peripheries 18 and 20 are rectangular in shape, and in the specific embodiment of FIG. 1 are actually square in shape. Periphery 18 of the first feature pattern 14 has a first pair of opposing sides 22, and a second pair of opposing sides 24; and periphery 20 of second feature pattern 16 has a first pair of opposing sides 26 and a second pair of opposing sides 28.

A plurality of first rims 30 are formed along the opposing sides 22 of first feature patterns 14, and a plurality of second rims 32 are formed along opposing sides 26 of second feature patterns 16. First rims 30 impart a rotation in phase to the wavelength of light passing through the rims which is preferably from about 170° to about 190° from the rotation phase caused by first feature pattern 14, and which more preferably is about 180° relative to the rotation phase caused by first feature pattern 14, and even more preferably is exactly 180° relative to the rotation in phase caused by the first feature pattern. In contrast, second rims 32 cause a rotation in phase of the wavelength of light passing through the rims of from about 170° to about 190° relative to the rotation of phase caused by second feature pattern 16, more preferably of about 180° relative to the rotation in phase caused by second feature pattern 16, and even more preferably of exactly 180° relative to the rotation in phase caused by the second feature pattern.

From the discussion above, it is apparent that the invention can include embodiments wherein the rotation in phase caused by second feature patterns 16 is exactly out of phase with the rotation caused by first feature patterns 14; wherein the rotation in phase caused by second rims 32 is identical to that caused by first feature patterns 14; and wherein the rotation in phase caused by first rims 30 is identical to that caused by second feature patterns 16.

It is noted that for purposes of interpreting this disclosure and the claims that follow, a stated relative orientation in rotations in phase is to be understood to encompass the described orientation, and in addition to encompass any orientation corresponding to (n*360°) plus the stated relative correspondence between the rotations in phase, where n is an integer. For instance, if it is stated that a second type feature generates a rotation in phase which is 180° relative to the rotation caused by a first type feature, it is to be understood that the actual differences in rotation could be 180°, 540°, 900°, etc. Another way of expressing the same concept is that it is the net difference in phases described herein and recited in the claims, rather than a total difference in the phases.

An effect of the rims 30 and 32 can be to alter a shape of an image of light passing through feature patterns 14 and 16, and specifically to form the light into a more circular shape than would occur in the absence of rims 30 and 32. In the shown embodiment, the feature patterns 14 and 16 have a shorter pitch between them along rows of the array than along columns of the array, and the rims are provided only in the longer pitch direction (i.e., only along the columns of the array). In other words, the rims are provided only partially around the peripheries of the feature patterns, rather than being entirely around such peripheries. Such can simplify fabrication of the illustrated structure, in that it is easier to fabricate rims within the relatively wide expanses of the long pitch direction than within the narrow expanses of the short pitch direction, and in some applications that were not be sufficient room in the short pitch direction for the rims. Additionally, it is found that rims formed along only the long pitch direction can be sufficient to improve an image generated by the feature patterns substantially, and to collapse ovals that would otherwise be generated into more circular shapes.

In the embodiment of FIG. 1, adjacent feature patterns along a column are separated from one another by a distance "D", and the individual rims extend an entirety of such distance between the feature patterns.

Figure 2:
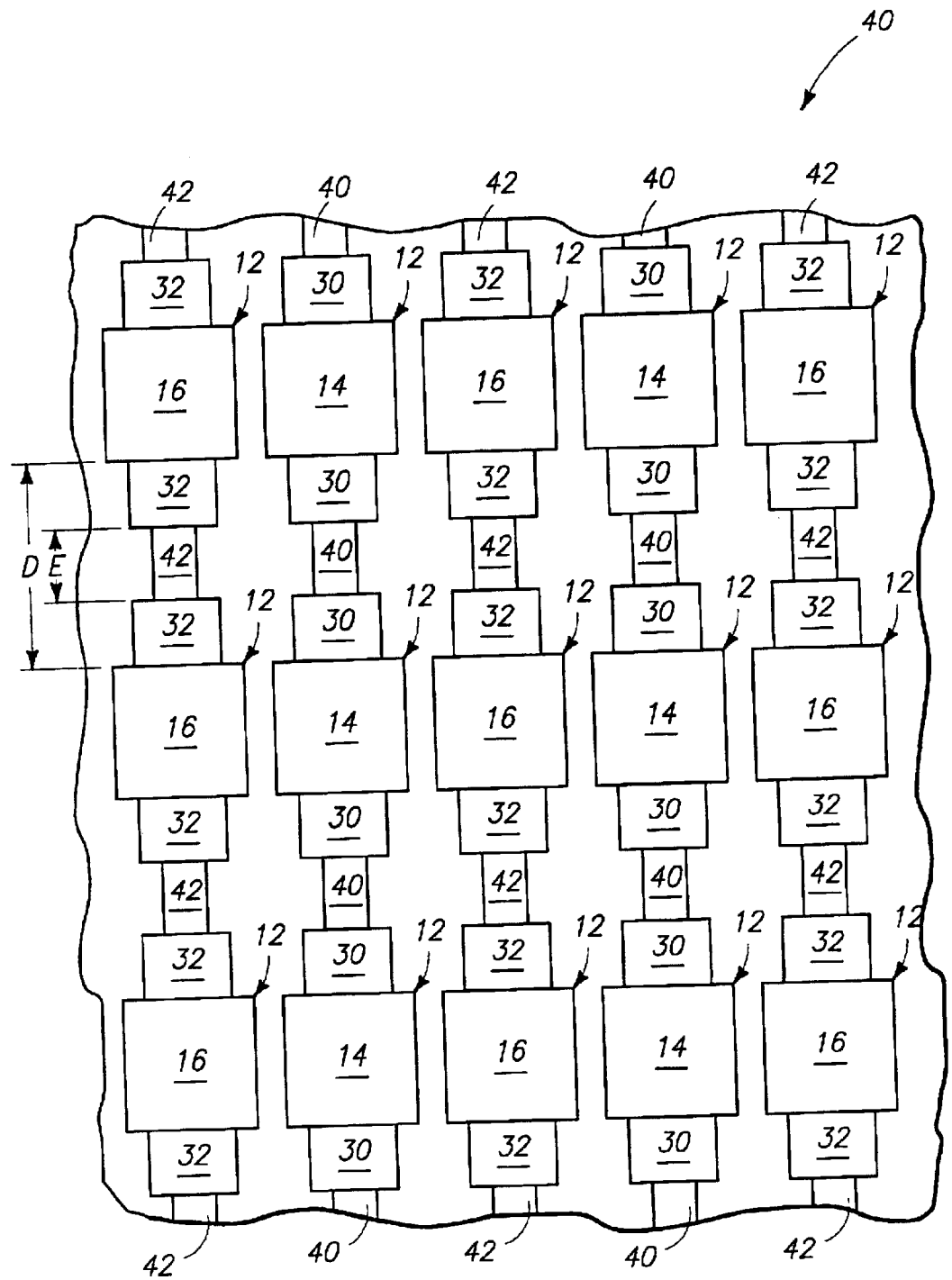
FIG. 2 is a diagrammatic, top view of a fragment of a second embodiment radiation patterning tool encompassed by the present invention.

Referring to FIG. 2, a second embodiment radiation patterning tool 40 is illustrated. Similar numbering is utilized for describing the tool 40 as is utilized above in describing the tool 10 of FIG. 1, where appropriate. Accordingly, tool 40 comprises first feature patterns 14, second feature patterns 16, first rims 30 and second rims 32. Also, the feature patterns are arranged in an array having columns and rows, and there is a distance "D" between adjacent feature patterns along the columns of the array. The distance "D" of the tool 40 can be the same or different than the distance "D" of the tool 10 of FIG. 1, and in typical embodiments the distance "D" of tool 40 will be larger than that of tool 10. In either tool 10 of FIG. 1 or tool 40 of FIG. 2, distance "D" can be about the size of feature pattern which is ultimately to be formed with the tool.

The rims 30 and 32 do not extend an entirety of the distance between adjacent feature patterns along columns of the array, but rather adjacent rims along columns of the array are separated from one another by a distance "E".

In the shown embodiment, side lobe suppressing patterns 40 and 42 are provided between adjacent rims along the columns of the array. The side lobe suppressing patterns 40 are a different type of pattern than the side lobe suppressing patterns 42. Specifically, the side lobe suppressing patterns 40 are preferably configured to rotate the wavelength of light passing through them by from about 170° to about 190° relative to the rotation imparted by the rims 30 on either side of the patterns 40. In contrast, the side lobe suppressing patterns 42 are preferably configured to rotate the wavelength of light by from about 170° to about 190° relative to the rotation imparted light by the rims 32 on either side of the patterns 42.

Since the rims 32 preferably rotate the wavelength of light by from about 170° to about 190° relative to the rotation imparted by rims 30, it should be understood that side lobe suppressing pattern 42 actually rotates the wavelength of light by about the same amount as rims 30; and side lobe suppressing pattern 40 actually rotates the wavelength of light by about the same amount as rims 32. Preferably, the rotation caused by side lobe suppressing pattern 40 will be about 180°, or exactly 180° relative to that caused by rims 30; and the rotation of light caused by side lobe suppressing patterns 42 will be about 180°, or exactly 180° relative to the rotation caused by rims 32.

A distinction between the side lobe suppressing patterns 40 and 42, relative to the feature patterns 14 and 16, is that side lobe suppressing patterns 40 and 42 do not correspond to any image that is ultimately printed on a photoresist exposed to light passing through tool 40. Instead, side lobe suppressing patterns 40 and 42 only have a function of altering an image formed by light passing through features patterns 14 and 16. A pattern which generated a separate and distinct image would be a feature pattern, and not a side lobe suppressing pattern.

The side lobe suppressing patterns 40 and 42 can cause images defined by light passing through feature patterns 14 and 16 to be more circular than the images would be in the absence of the side lobe suppressing patterns. Accordingly, it can be preferred to utilize embodiments exemplified by tool 40 instead of embodiments exemplified by tool 10 of FIG. 1. However, the introduction of the side lobe suppressing patterns 40 and 42 adds additional complexity to fabrication of a radiation patterning tool, and such can cause embodiments exemplified by tool 10 to be preferred under particular conditions.

Figure 3:
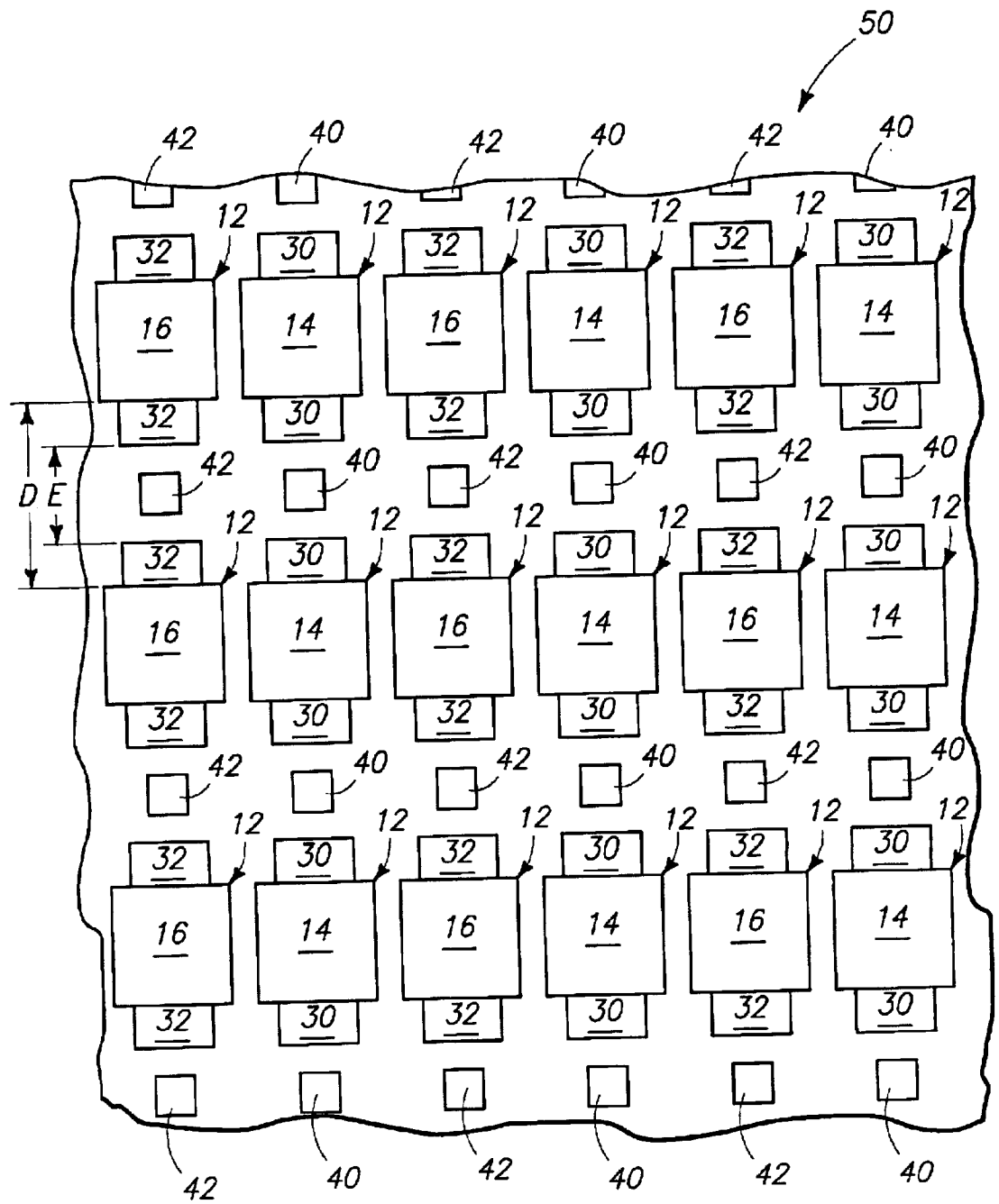
FIG. 3 is a diagrammatic, top view of a fragment of a third embodiment radiation patterning tool encompassed by the present invention.

Referring to FIG. 3, another exemplary embodiment of a radiation patterning tool encompassed by the present invention is illustrated as a tool 50. In referring to FIG. 3, similar numbering is utilized as was used above in describing the embodiments of FIGS. 1 and 2, where appropriate. Accordingly, tool 50 comprises first feature patterns 14, second feature patterns 16, first rims 30 and second rims 32. Also, as with the embodiments above, a pair of first rims are associated with each of the first feature patterns, and a pair of second rims are associated with each of the second feature patterns.

Tool 50 further includes first type side lobe suppressing patterns 40, and second type side lobe suppressing patterns 42, with the first type side lobe suppressing patterns being between first rims along columns of a feature pattern array, and the second type side lobe suppressing patterns being between second rims along the columns of the feature pattern array. A distance between feature patterns along the columns of the array is "D" and a distance between adjacent rims along the columns of the array is "E". In contrast to the tool 40 of FIG. 2, the side lobe suppressing patterns of tool 50 do not extend an entirety of the distance "E" between adjacent rims along columns of the feature pattern array.

Figure 4:
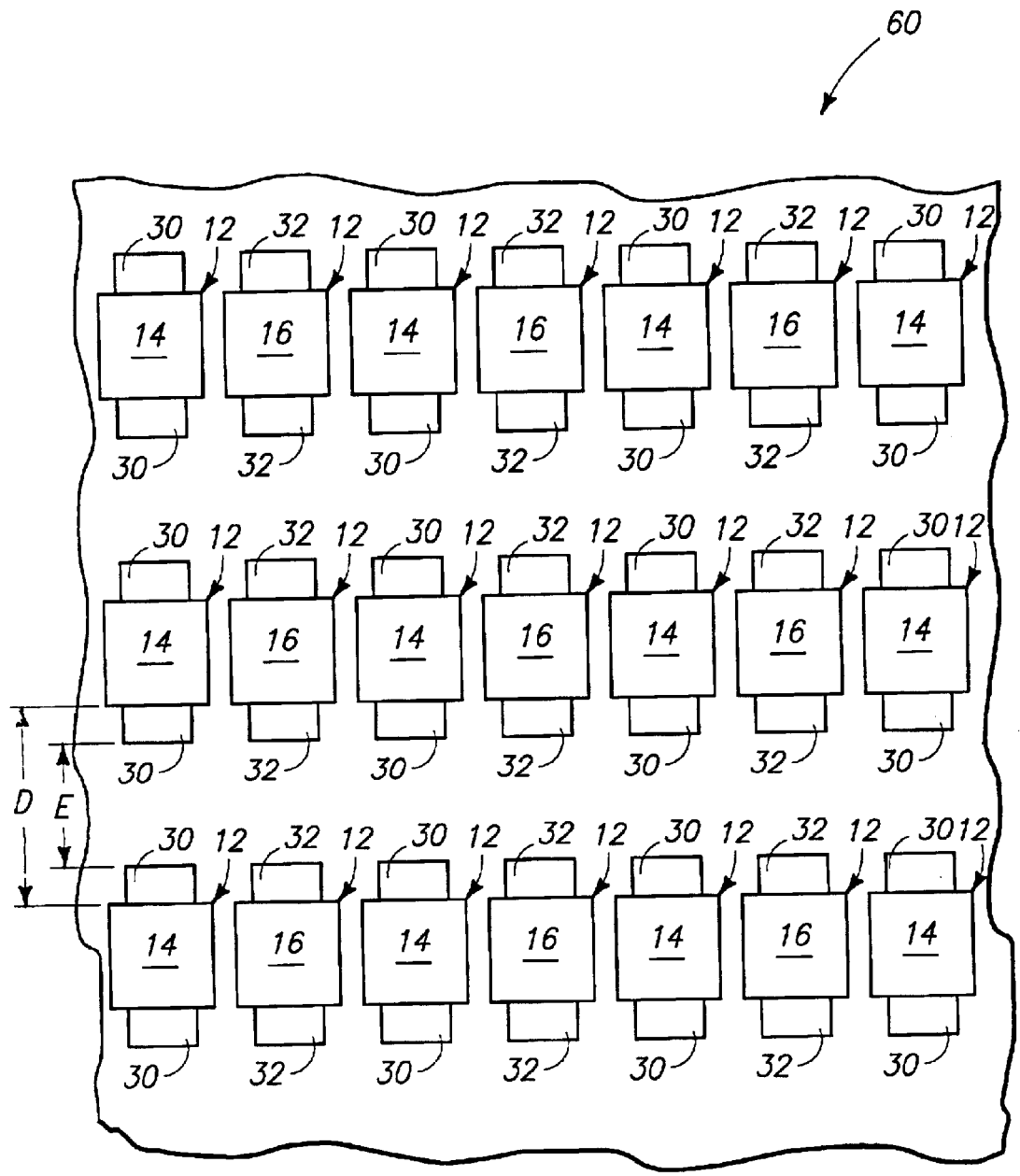
FIG. 4 is a diagrammatic, top view of a fragment of a fourth embodiment radiation patterning tool encompassed by the present invention.

Another exemplary embodiment of a radiation patterning tool is illustrated in FIG. 4 as a tool 60. The numbering utilized in FIG. 4 is identical to that of FIGS. 1–3, where appropriate. The embodiment of FIG. 4 is similar to that of FIG. 3, except for the absence of the side lobe suppressors (40 and 42 of FIG. 3).

Figure 5:
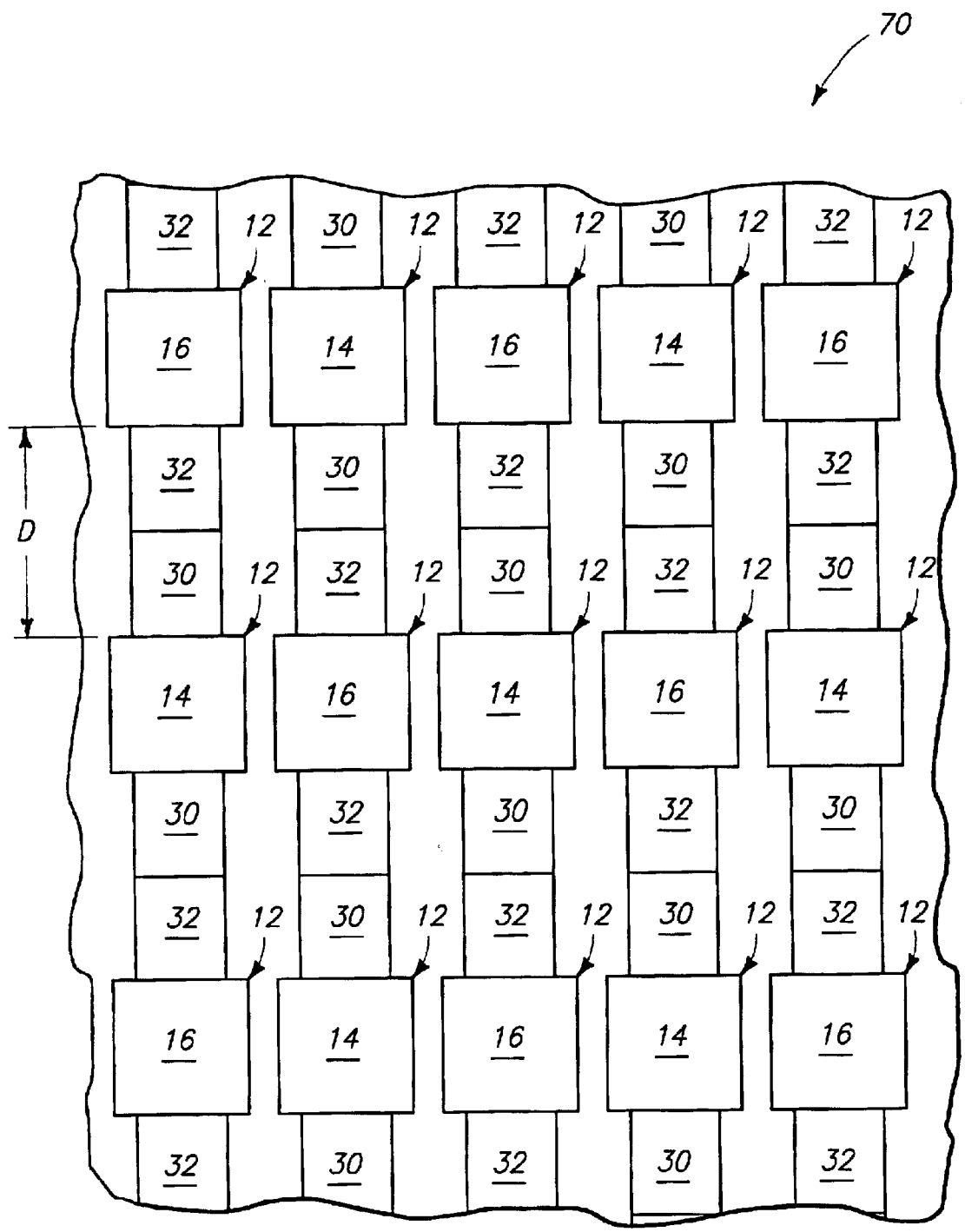
FIG. 5 is a diagrammatic, top view of a fragment of a fifth embodiment radiation patterning tool encompassed by the present invention.

Although each of the embodiments of FIGS. 1–4 illustrated applications in which first and second feature patterns alternate with one another along rows of an array, but not along columns, it is to be understood that the invention encompasses other embodiments wherein the feature pattern types alternate along columns. An exemplary device is illustrated as a tool 70 in FIG. 5. The numbering in FIG. 5 is identical to that utilized above in describing the embodiments of FIGS. 1–4, where appropriate. Accordingly, tool 70 comprises first and second feature patterns 14 and 16, respectively; and comprises first and second rims 30 and 32, respectively.

A distance between adjacent feature patterns along columns of an array of the feature patterns is "D", and in the shown embodiment the rims extend across an entirety of distance "D". Accordingly, a first rim 30 abuts a second rim 32 at about a central location of distance "D". It is to be understood, however, that the invention encompasses other embodiments wherein the rims do not extend entirely across the distance "D", but instead are separated by a space, such as, for example, a space comparable to that of FIGS. 2, 3 and 4. In such embodiments, a side lobe suppressor can optionally be provided between adjacent rims along columns of the array. However, it is considered that it may be preferred to avoid utilization of side lobe suppressors in embodiments in which adjacent rims are different types relative to one another.

FIGS. 59–63 illustrate additional radiation patterning tool constructions 800, 900, 1000, 1100 and 1200 which can be formed in various aspects of the present invention. The constructions of FIGS. 59–63 are labeled with identical number to that utilized in describing the constructions of FIGS. 1–5.

Figure 6:
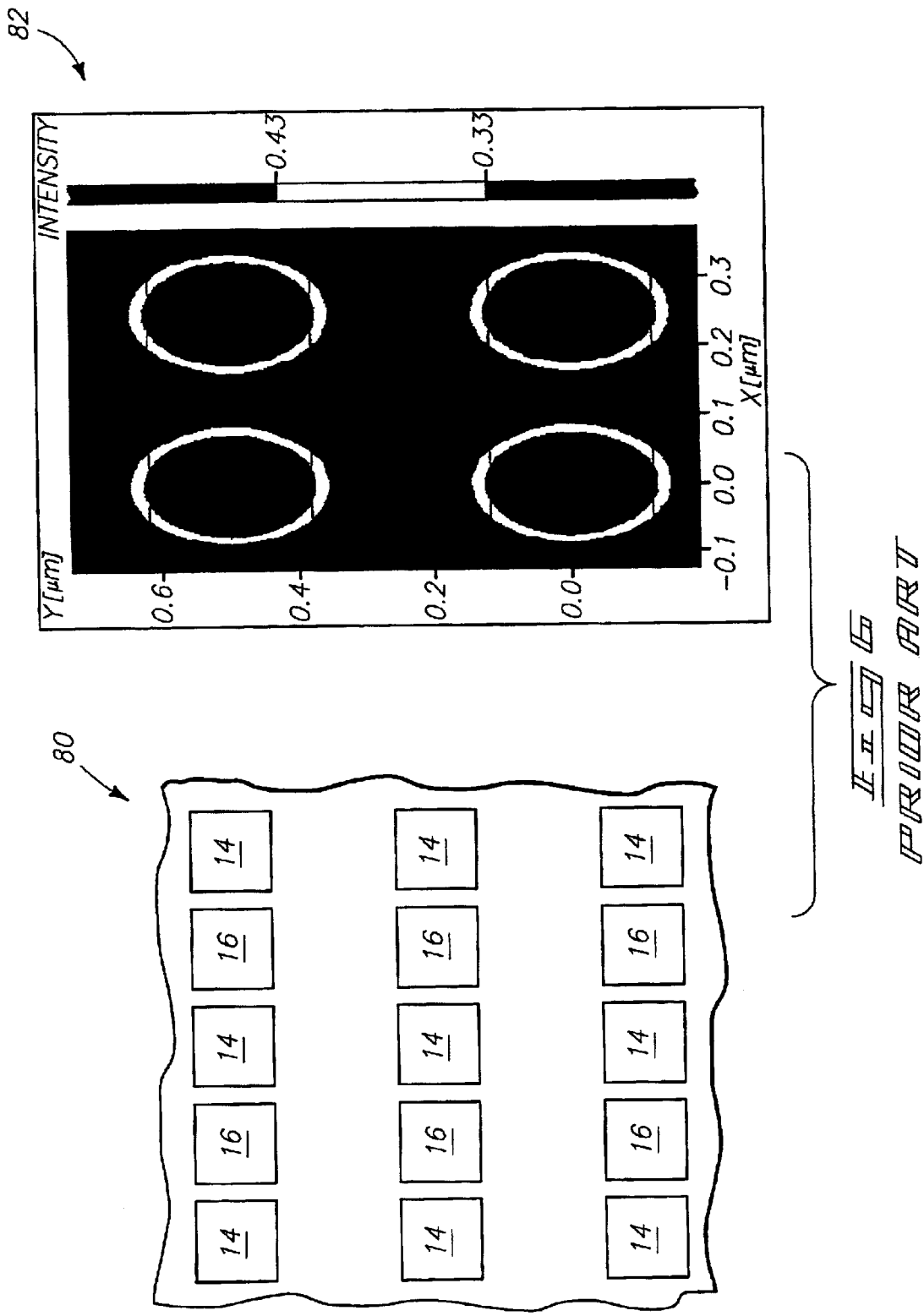
FIG. 6 a colored illustration showing a top view of a fragment of a prior art radiation patterning tool (specifically, a reticle), and a graph showing a simulated contact pattern formed from the reticle with a spatial coherence of the lithography system (sigma) of 0.35. The system wavelength for the simulation was 248 nanometers, and the numerical aperture was 0.70.
Figure 7:
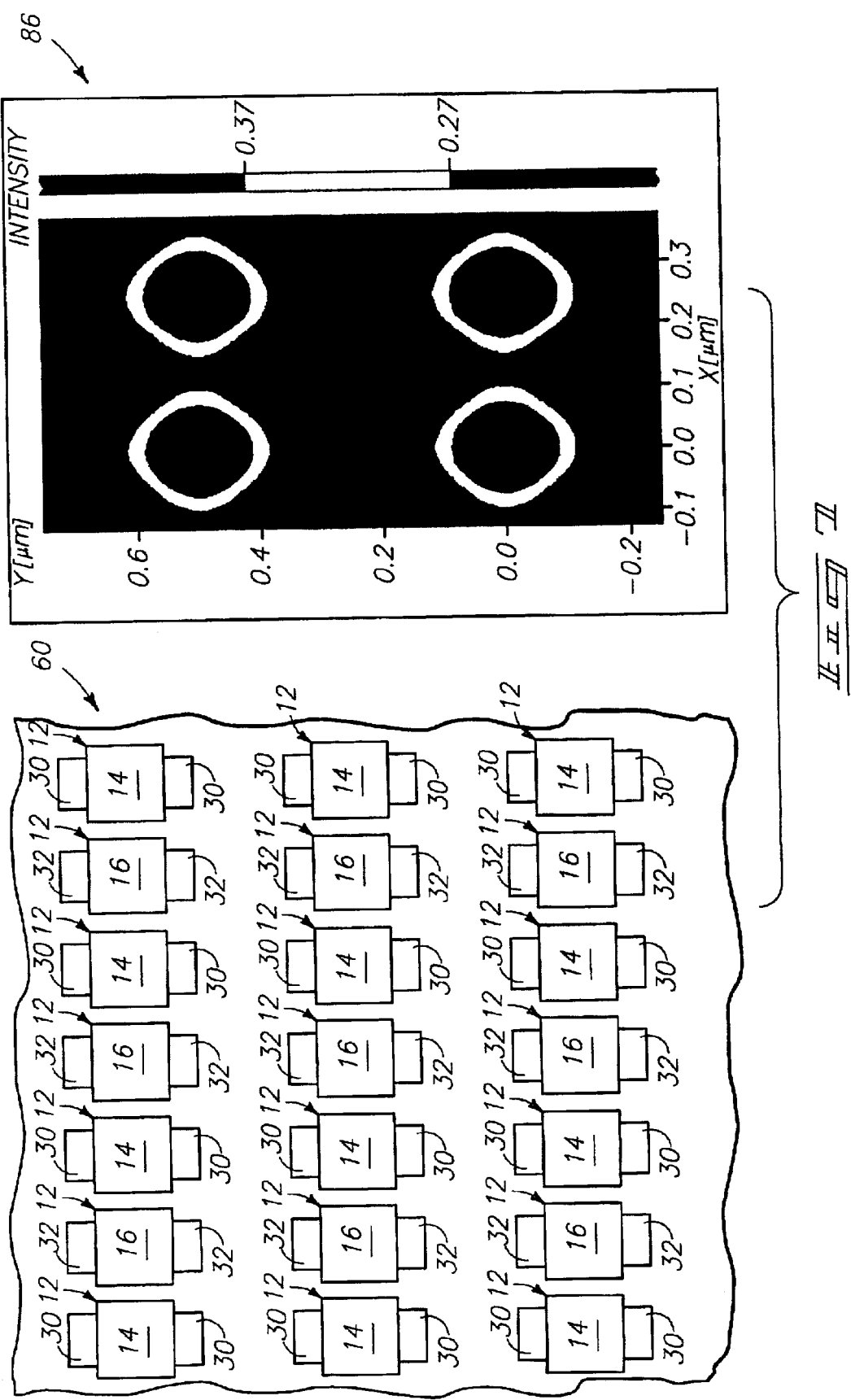
FIG. 7 is a colored illustration showing a top view of a fragment of a radiation patterning tool (specifically, a reticle) encompassed by the present invention, and also showing a graph at sigma 0.35 of simulated contact openings formed from the radiation patterning tool. The system wavelength for the simulation was 248 nanometers, and the numerical aperture was 0.70.

FIGS. 6 and 7 illustrate advantages that can be obtained utilizing methodology of the present invention relative to that of the prior art. Specifically, FIG. 6 illustrates a prior art radiation patterning tool 80 comprising first and second feature patterns 14 and 16 (utilizing the numbering that was used above in describing FIGS. 1–5), but lacking rims along peripheries of the feature patterns. FIG. 6 also shows a graph 82 which illustrates simulated images formed by light passing through the feature patterns. The graph 82 was generated utilizing assumed spatial coherence (sigma) of 0.35. It is noted that the simulated images are ovals, rather than desired circles. In contrast, FIG. 7 illustrates the radiation patterning tool 60 of FIG. 4, together with a graph 86 illustrating simulated images expected at spatial coherence (sigma) values of 0.35. The graph of FIG. 7 shows that a radiation patterning tool of the present invention can form images that more closely approximate desired circles than can the radiation patterning tools of the prior art. It is noted that lithography masks typically comprise both relatively dense patterns, and relatively less dense (or isolated) patterns. Isolated patterns can be printed with a low sigma (0.35), even utilizing prior art methods, but dense patterns present problems for prior art methodologies.

Numerous methods can be utilized to form radiation patterning tools encompassed by the present invention. Several exemplary methods are described with reference to FIGS. 9–58. Prior to discussing such methods, it is useful to establish a frame of reference relative to an exemplary radiation patterning tool of the present invention. Accordingly, FIG. 8 illustrates a fragment of an exemplary radiation patterning tool 100. The tool 100 is described using the same numbering that was used in describing the embodiments of FIGS. 1–5. Tool 100 comprises first feature patterns 14 and second feature patterns 16; and further comprises first rims 30 and second rims 32. The first rims are adjacent to the first feature patterns 14, and the second rims are adjacent to the second feature patterns 16. Preferably, second feature patterns 16 and first rims 30 rotate a wavelength of light by about 180° relative to a rotation that occurs when the light passes through first feature pattern 14. Also preferably, second rims 32 rotate the light by about 0° relative to the rotation caused by passing light through first feature pattern 14, and accordingly rotate the light by about 180° relative to the rotation caused by passing the light through second feature patterns 16.

A cross-section 2—2 is defined through a first feature pattern 14 and a pair of first rims 30; and a second cross-section 4—4 is defined through a second feature pattern 16 and a pair of second rims 32. The views of FIGS. 9–58 will be oriented relative to FIG. 8 such that each of the views will show two fragments of a radiation patterning tool, with a leftmost fragment corresponding to the view 2—2 and the rightmost view corresponding to the view 4—4. The views of FIGS. 9–58 correspond to various processing steps which can be utilized for forming a radiation patterning tool, and accordingly it should be understood that most of the views will correspond to structures shown at processing steps other than the completed processing of FIG. 8.

A first embodiment method for forming a radiation patterning tool is described with reference to FIGS. 9–13. Referring initially to FIG. 9, a construction 100 is illustrated at a preliminary stage. More specifically, a pair of fragments 102 and 104 of construction 100 are illustrated, with the fragments corresponding to the cross sections along lines 2—2 and 4—4 referred to above in describing FIG. 8.

Fragments 102 and 104 comprise a base 110 which is preferably transparent to a desired wavelength of light, such as, for example, a wavelength in the ultraviolet wavelength range. The actual desired wavelength of light will be a wavelength suitable for patterning photoresist, and such can vary depending on the composition of the photoresist. Typical wavelengths suitable for processing photoresist are well-known in the art. The transparent base material 110 preferably rotates a phase of the desired wavelength of light as the light passes through material 110. Base 110 can comprise, for example, one or more of quartz, calcium fluoride, barium fluoride, and solid solutions comprising one or more of calcium fluoride, strontium fluoride, and barium fluoride.

A mask 112 is over base 110, and preferably is opaque relative to the desired wavelength of light. Opaque mask 112 is physically against base 110 in the shown embodiment. In the claims that follow, mask 112 can be referred to as an opaque layer and base 110 can be referred to as a transparent material, to indicate the relative transmittance of mask 112 and base 110 to a desired wavelength of light. It is to be understood, however, that unless it is specifically stated, opaque layer 112 need not have 0% transmittance relative to the desired wavelength of light; and also unless it is specifically stated, base 110 need not have 100% transmittance of the desired wavelength of light. In exemplary embodiments, opaque layer 112 comprises chromium, and blocks more than 99% of the desired wavelength of light from passing therethrough; and base layer 110 comprises, consists essentially of, or consists of quartz, and allows greater than 90% transmittance of the desired wavelength of light therethrough.

A patterned photoresist mask 114 is provided over regions 102 and 104. Patterned mask 114 has thick regions 116 and thin regions 118. The photoresist masking layer 114 can comprise either positive or negative photoresist. The patterned mask 114 has an opening 120 extending therethrough and associated with fragment 102, and also has openings 122 and 124 extending therethrough and associated with fragment 104.

The formation of the shown photoresist mask configuration can be accomplished by typical photolithographic patterning techniques in which a photoresist material is provided over an entirety of layer 112, and then exposed to patterned radiation. Portions of the photoresist exposed to the radiation have a different stability to further processing conditions than do portions which are not exposed to the radiation. For instance, portions of the photoresist exposed to the radiation can have a different solubility in a solvent than do portions which are not exposed to the radiation. The photoresist is exposed to the processing conditions to remove desired portions, and thus form openings 120, 122 and 124. Additionally, if the exposure dose is varied across the photoresist during the photolithographic patterning, some portions of the remaining photoresist can be thicker (portions 116) than other portions (118).

Fragment 102 has a feature pattern location 130 defined therein, and rim locations 132 defined adjacent the feature pattern location. Rim locations 132 can be considered as material beneath the thinned regions 118 of photoresist 114, and feature pattern location 130 can be considered as material beneath the opening 120 extending through patterned photoresist mask 114.

Fragment 104 has a feature pattern location 134 defined therein, and rim locations 136 defined adjacent the feature pattern location. Feature pattern location 134 can be considered as material beneath the thinned photoresist 118, and rim locations 136 can be considered as material beneath openings 122 and 124. For purposes of the discussion that follows, feature pattern location 130 can be referred to as a first feature pattern location, and feature pattern location 134 can be referred to as a second feature pattern location. Also, rim locations 132 can be referred to as first rim locations, and rim locations 136 can be referred to as second rim locations.

Referring to FIG. 10, openings 120, 122 and 124 are extended through opaque material 112 and into base 110. In embodiments in which opaque material 112 comprises chromium, a suitable etch through the opaque material comprises a chlorine-based plasma etch; and in embodiments in which base 110 comprises quartz, a suitable etch into the base comprises a fluorine-based plasma etch.

Referring to FIG. 11, photoresist 114 is exposed to conditions which thin the photoresist, and ultimately remove some of the photoresist. Such exposure removes the already thin portions 118 (FIG. 10) while leaving the portion 116 (now thinned after exposure to the processing conditions) remaining over opaque material 112. The removal of portions 118 exposes segments 140 of opaque material 112 within first rim locations 132, and exposes a segment 142 of opaque material 112 within second feature pattern location 134. Suitable conditions for removing the photoresist can include, for example, exposure of the photoresist to solvent, and/or ashing of the photoresist.

Referring to FIG. 12, exposed segments 140 and 142 (FIG. 11) of opaque material 112 are removed with an etch selective for opaque material 112 relative to base 110. A suitable etch selected for a chromium material 112 relative to a quartz base 110 is, for example, a chlorine-based plasma etch.

Referring to FIG. 13, photoresist 114 (FIG. 12) is removed to leave a construction 144 relative to fragment 102 and a construction 146 relative to fragment 104. Construction 144 comprises a first feature pattern within location 130 that is recessed into base 110, and first rims within locations 132 which are not recessed into base 110. The recess within location 130 should be sufficiently deep within the material of base 110 so that a desired wavelength of light passing through location 130 has a phase which is shifted by from about 170° to about 190° relative to the phase of the light passing through rim locations 132. It is noted that construction 146 comprises a second feature pattern at location 134 which is at a same elevational level as the first rims at location 132, and comprises second rims 136 which are at a same elevational location within base 110 as the first feature pattern at location 130 of construction 144. Accordingly, when a desired wavelength of light passes through constructions 144 and 146, the phase of light passing through the first feature pattern location 130 will be the same as the phase passing through the second rim locations 136, and will be shifted in phase from about 170° to about 190° relative to the light passing through first rim locations 132 and second feature pattern location 134. In particular embodiments, the rotation imparted to a wavelength of light in passing through the regions 130 and 136 relative to the regions 132 and 134 is either about 180°, or exactly 180°.

Constructions 144 and 146 comprise a lower surface 150 and an upper surface 152. Typically, when the constructions are incorporated into a photolithographic device as a reticle or photomask, light will pass from surface 150, through base 110, and out surface 152. Accordingly, constructions 144 and 146 will typically be inverted relative to the shown configuration when incorporated into photolithographic equipment. Rays 160, 162, 164, 166, 168 and 170 of light are shown entering through bottom surface 150 of base 110 and exiting through upper surface 152 in the various locations 130, 132, 134 and 136 to illustrate the change in phase occurring in the light as it passes through base 110.

The constructions 144 and 146 can correspond to the final constructions illustrated in FIG. 8, with the construction comprising the first rims and first feature pattern, and the construction 146 comprising the second rims and second feature pattern. The constructions 144 and 146 can also, or alternatively, correspond to any of the final feature pattern constructions of FIGS. 1–5 and 59–63. Also, although lobe suppressor regions are not shown in the construction of FIG. 13, it is to be understood that such lobe suppressor regions could be incorporated into the processing of FIGS. 9–13.

Another method for forming a radiation patterning tool in accordance with the present invention is described with reference to FIGS. 14–21. The method of FIGS. 14–21 can be particularly useful when the rims which are to be formed are narrow, and difficult to etch with the processing described in the embodiment of FIGS. 9–13. In describing the embodiment of FIGS. 14–21, identical numbering is used as was used above in describing the embodiment of FIGS. 9–13, where appropriate.

Referring initially to FIG. 14, a construction 200 is illustrated comprising the fragments 102 and 104. Each of fragments 102 and 104 comprises base 110, opaque material 112 and photoresist 114. Further, the photoresist 114 comprises a thick portion 116 and a thin portion 118. A first feature pattern location 130 is defined with respect to fragment 102, and first rim locations 132 are defined adjacent first feature pattern location 130. A second feature pattern location 134 is defined with reference to fragment 104, and second rim locations 136 are defined adjacent feature pattern location 134.

Fragment 104 of FIG. 14 has differences relative to FIG. 9 in that there is an opening 202 extending to second feature pattern location 134, and there are no openings extending to the second rim locations 136. Fragment 102 of FIG. 14 is, however, identical to the fragment 102 of FIG. 9, and accordingly comprises an opening 120 over first feature pattern location 130.

Referring to FIG. 15, openings 120 and 202 are extended into base 110.

Referring to FIG. 16, photoresist 114 is exposed to suitable conditions to remove the thinned portion 118 (FIG. 15), while leaving thickened portions 116 over layer 112. The removal of portions 118 exposes segments 140 of opaque material 112 within first rim locations 132, and also exposes segments 204 of opaque material 112 within second rim locations 136.

Referring to FIG. 17, the exposed segments 140 and 204 (FIG. 16) of opaque material 112 are removed.

Referring to FIG. 18, photoresist 114 (FIG. 17) is removed.

Referring to FIG. 19, a protective mask 210 is formed over first feature pattern location 130 and first rim locations 132 of region 102, and is shown to extend over peripheral portions of region 104. Mask 210 can comprise, for example, photoresist. It is noted that the processing of FIG. 18 is optional, and that portions 116 of photoresist 114 (FIG. 17) can remain over construction 100 during formation of protective mask 210. The extension of mask 210 over region 104 is optional, and is shown to indicate that the shown processing can tolerate a remnant of mask 210 being over region 104 during subsequent process steps. Alignment of masking material 210 is non-critical in the sense that the mask does not have to be tightly aligned to the rim location or feature pattern locations associated with region 102, but rather simply should cover such locations.

Referring to FIG. 20, openings within region 104 are extended with an etch into base 110. Such extends second feature pattern location 134 into the base, and also extends second rim locations 136 into the base.

Referring to FIG. 21, protective mask 210 (FIG. 20) is removed to leave a final construction comprising a first feature pattern at location 130, first rims at locations 132, a second feature pattern at location 134, and second rims at locations 136. Preferably, the light of a desired wavelength passing through first rims 132 and second feature location 134 will have a rotation in phase of 360° (which corresponds to a 0° net rotation in phase), and light passing through first feature pattern location 130 and second rim locations 136 will have a rotation in phase of 180° relative to the light passing through first rim locations 132 and second feature pattern location 134. The construction of FIG. 21 can thus correspond to the final construction of FIG. 8, or to any of the constructions of FIGS. 1–5 and 59–63.

The methods of FIGS. 9–21 are relatively simplistic, in that they start with a simple substrate (typically quartz) beneath an opaque material (typically a material comprising chromium). The invention can, however, encompass more complex methodologies, such as methodologies in which a substrate comprises multiple components. An example of such method is described with reference to FIGS. 22–31. In referring to FIGS. 22–31, similar numbering is used as was used above in describing FIGS. 9–21, where appropriate.

Referring to FIG. 22, a construction 300 comprises a fragment 102 and a fragment 104. Fragments 102 and 104 comprise a base 110 which can comprise, consist essentially of, or consist of quartz. Constructions 102 and 104 also comprise a layer 112 of opaque material provided over base 110. Between layer 112 and base 110 are provided layers 302 and 304. Layer 302 can be an attenuating and/or phase shifting material, with an exemplary material comprising molybdenum and silicon, such as, for example, molybdenum silicide. Other exemplary materials include titanium nitride, tantalum nitride, tantalum oxide, tantalum silicide, zirconium silicon oxide, and chromium fluoride. Layer 304 can comprise a phase shifting layer, such as, for example, silicon dioxide or quartz, but preferably has less attenuation of a desired (working) wavelength than does layer 302. In particular embodiments, attenuating layer 302 can comprise one or more of silicon, chromium, molybdenum and aluminum; and phase shifting layer 304 can comprise one or more of silicon, oxygen and nitrogen. In particular applications, one or both of the phase shifting layers can comprise calcium fluoride, barium fluoride, magnesium fluoride, and/or solid solutions comprising one or more of calcium fluoride, strontium fluoride and barium fluoride. In particular aspects of the invention, layers 302 and 304 can be considered a first phase shifting layer and a second phase shifting layer, respectively.

Construction 300 can include other materials in addition to those shown, and can, for example, include thin anti-reflection layers at one or more of the interfaces between layers 110 and 302, 302 and 304, or 304 and 112.

A first feature pattern location 130 is defined within region 102 together with first rim locations 132; and a second feature pattern location 134 is defined within region 104 together with second rim locations 136.

Patterned photoresist 310 is formed over regions 102 and 104. Patterned photoresist 310 has 3 different thicknesses over region 102, and specifically comprises a thinnest portion 312 over first feature pattern location 130, an intermediate thickness region 314 over first rim locations 132, and a thickest portion 316 exterior of the rim locations and first feature pattern location. Additionally, photoresist 310 has two different thicknesses over region 104, and specifically comprises the largest thickness 316 exterior of second feature pattern location 134 and second rim locations 136, and comprises an intermediate thickness 318 over second rim locations 136. The intermediate thickness 318 is greater than the intermediate thickness 314 over first rim locations 132. An opening 320 extends through photoresist 310 to expose a segment of opaque layer 112 within second feature pattern location 134. The patterned resist 310 can be formed by, for example, exposing a photoresist material to four different doses of radiation prior to development of the resist with solvent or other suitable conditions.

Referring to FIG. 23, construction 300 is exposed to etching conditions which remove opaque material 112 from second feature pattern location 134. A suitable etching condition for removing a chromium-containing opaque material 122 is an anisotropic etch utilizing a chlorine-based plasma.

Referring to FIG. 24, opening 320 is extended through phase shifting layer 304 and to attenuating layer 302 with a suitable etch. An exemplary etch is a fluorine-based plasma. The selectivity of the plasma for layer 304 to 302, or vice versa, can be adjusted by varying the etchant materials present in a reaction chamber, a pressure within the reaction chamber, a radio frequency power, etc.

Figure 25:
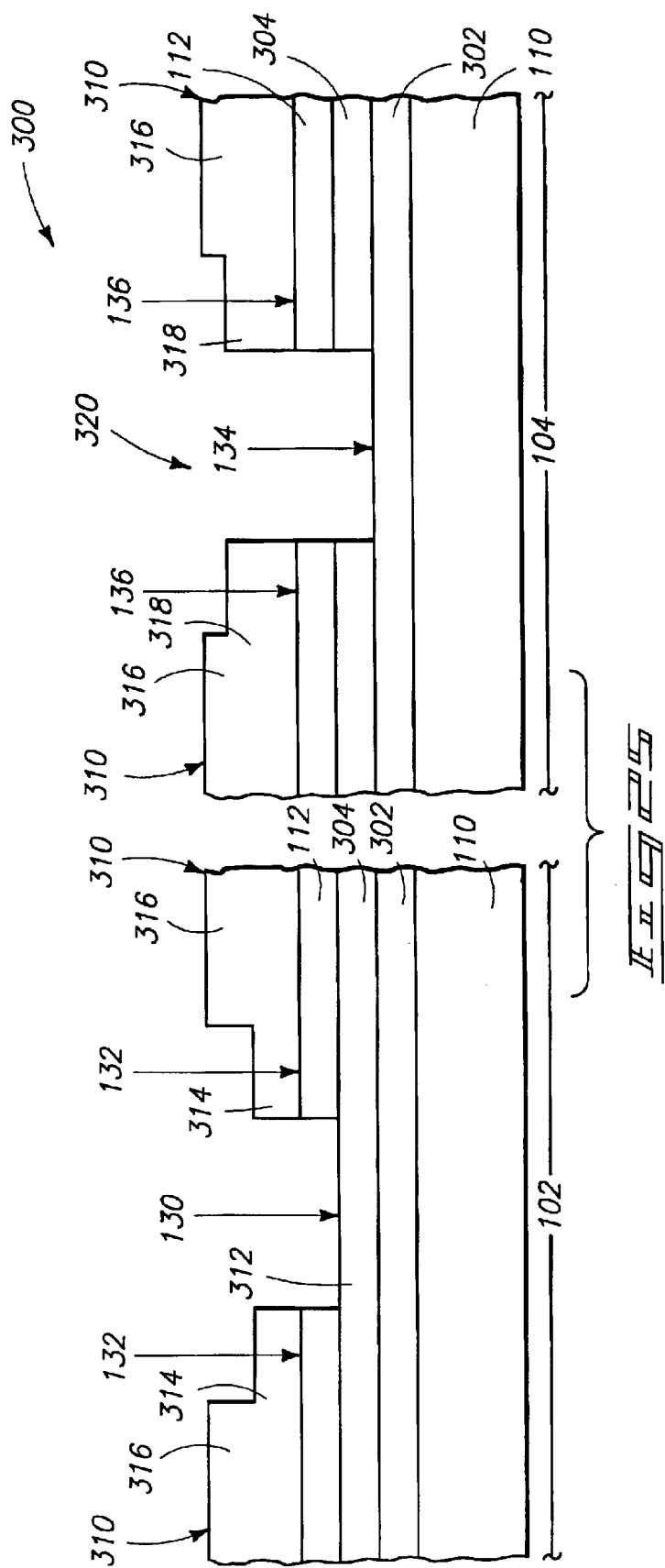
FIG. 25 is a view of the FIG. 22 fragments shown at a processing step subsequent to that of FIG. 24.

The photoresist 310 associated with region 102 can be considered to comprise a stepped pattern, with the thinnest region 312 comprising a first step, the intermediate region 314 comprising a second, higher step, and the region 316 comprising a third and yet higher step. The photoresist of construction 300 can be exposed to a solvent (or subjected to other suitable processing) to remove the thinnest step 312, and reduce a thickness of steps 314 and 316. After such removal, a segment of opaque layer 112 is exposed within first feature pattern location 130. FIG. 25 illustrates construction 300 after such segment is removed to expose a portion of layer 304 within first feature pattern location 130.

Figure 26:
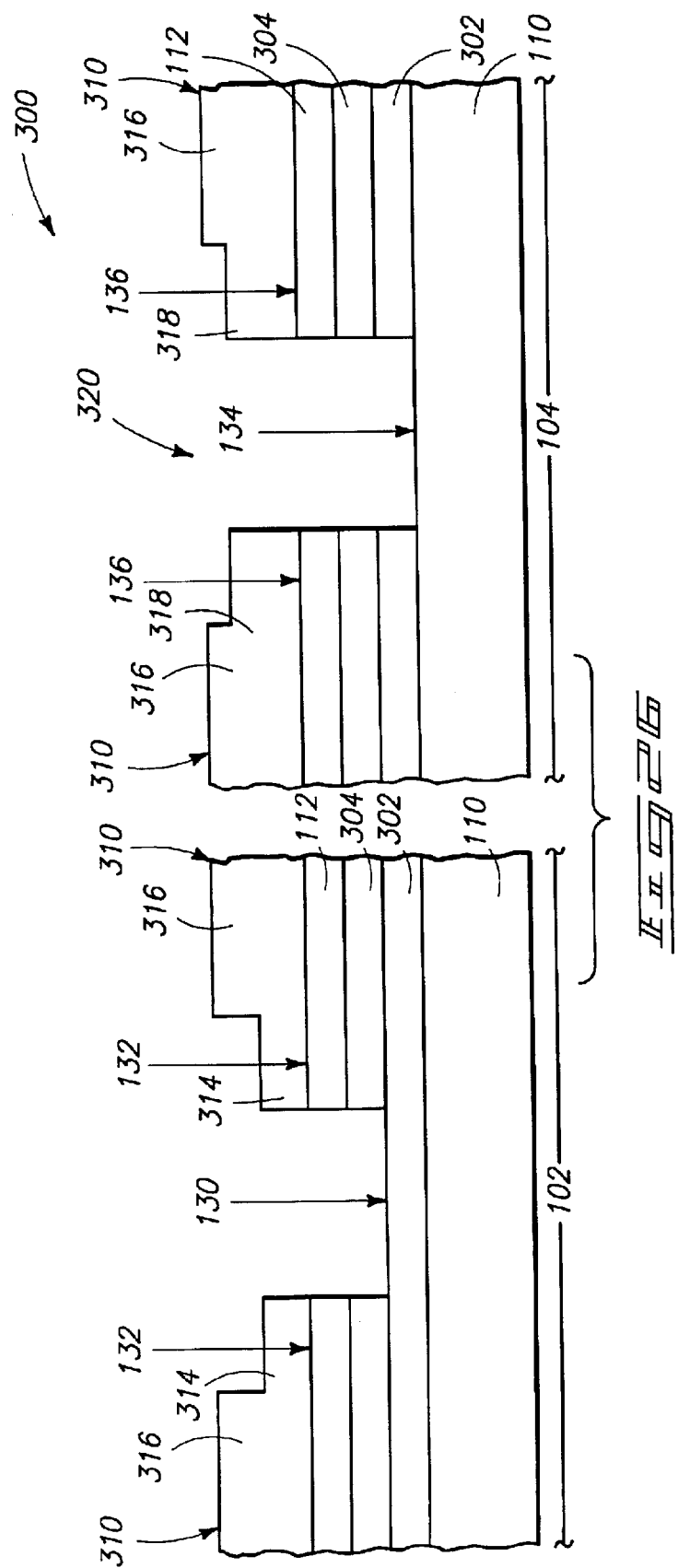
FIG. 26 is a view of the FIG. 22 fragments shown at a processing step subsequent to that of FIG. 25.

Referring to FIG. 26, construction 300 is exposed to an etch which is essentially non-selective for materials 304 and 302, and which accordingly extends an opening over first feature pattern location 130 through material 304, while extending an opening over second feature pattern location 134 through material 302.

Figure 27:
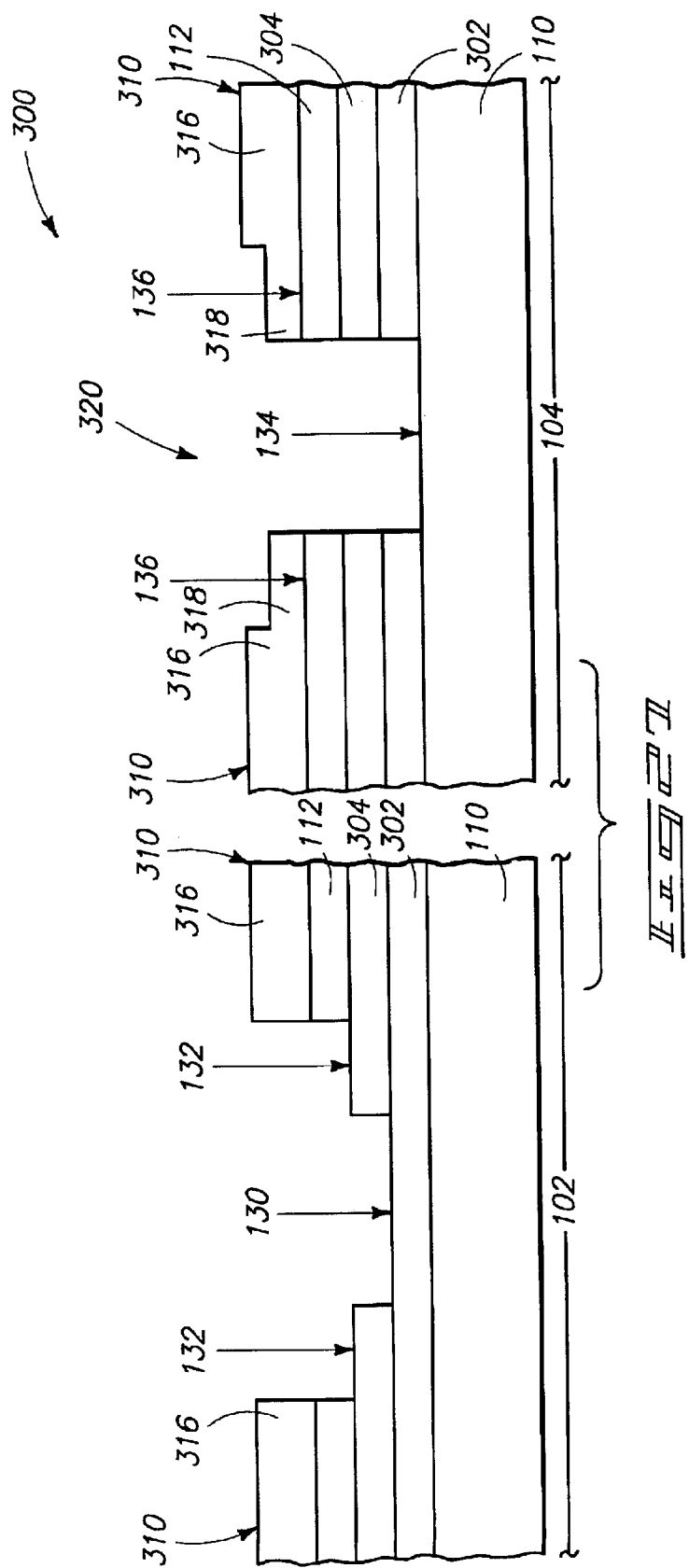
FIG. 27 is a view of the FIG. 22 fragments shown at a processing step to that of FIG. 26.

Referring to FIG. 27, construction 300 is illustrated after being exposed to suitable processing to remove photoresist portion 314 (FIG. 26) from over rim locations 132 to expose a segment of opaque material 112, and after removal of the exposed segment of opaque material 112. Accordingly, portions of layer 304 are exposed within first rim locations 132.

Figure 28:
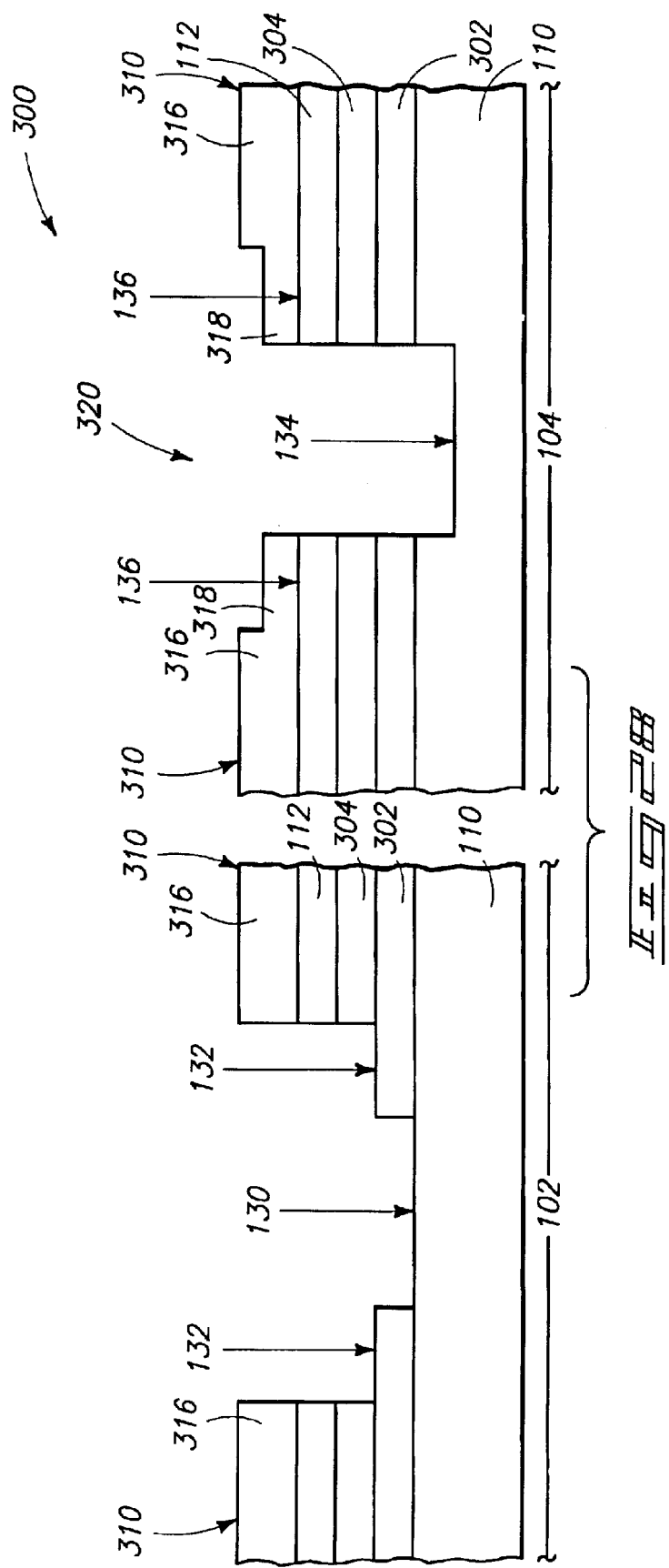
FIG. 28 is a view of the FIG. 22 fragments shown at a processing step subsequent to that of FIG. 27.

Referring to FIG. 28, wafer construction 300 is illustrated after being exposed to an etch which is relatively non-selective for material of base 110 and layers 302 and 304. Accordingly, the etch has extended through layer 304 in first rim locations 132, extended through layer 302 in first feature pattern location 130, and extended into the exposed portion of base 110 in second feature pattern location 134. The etch has thus simultaneously etched in first rim locations 132, first feature pattern location 130 and second feature pattern location 134.

Figure 29:
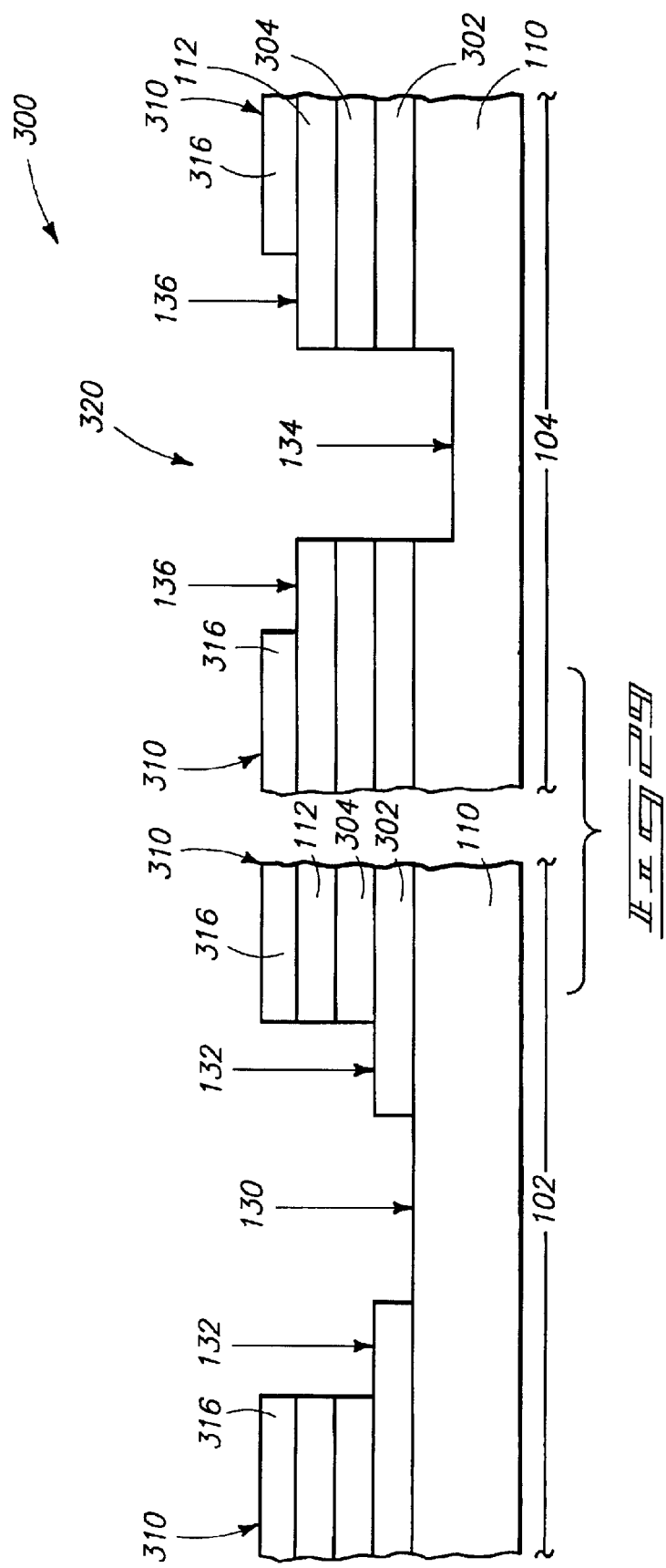
FIG. 29 is a view of the FIG. 22 fragments shown at a processing step subsequent to that of FIG. 28.

Referring to FIG. 29, photoresist 310 is exposed to a solvent (or other suitable processing conditions) which reduces a thickness of the photoresist, and accordingly removes the photoresist from over segments of opaque material 112 within second rim locations 136, but leaves photoresist remaining over other regions of fragments 102 and 104. Specifically portions of the thicker regions 316 of the photoresist are not removed.

Figure 30:
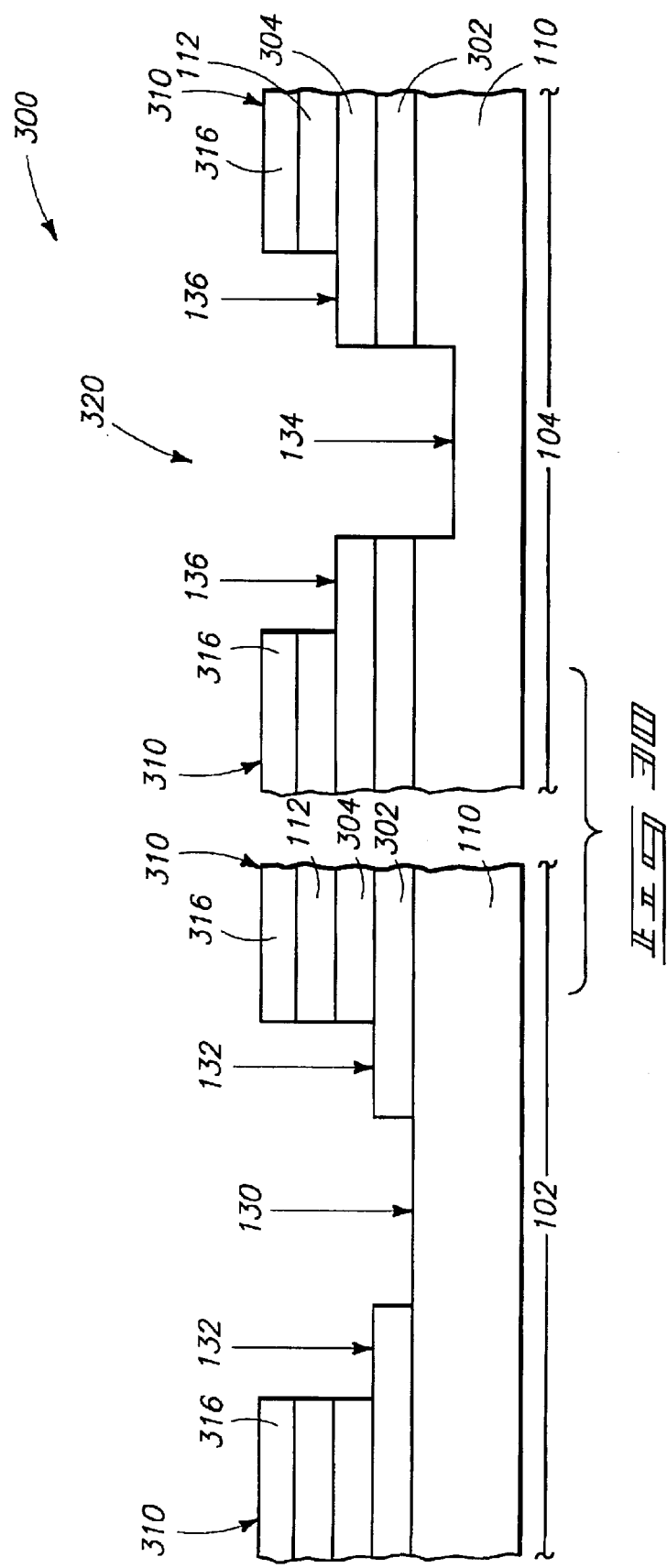
FIG. 30 is a view of the FIG. 22 fragments shown at a processing step subsequent to that of FIG. 29.

Referring to FIG. 30, the exposed segments of layer 112 within second rim locations 136 are removed with an etch substantially selective for the material of layer 112 relative to exposed materials of base 110 and layers 302 and 304. If material 112 comprises chromium, a suitable etch can utilize a chlorine-based plasma.

Figure 31:
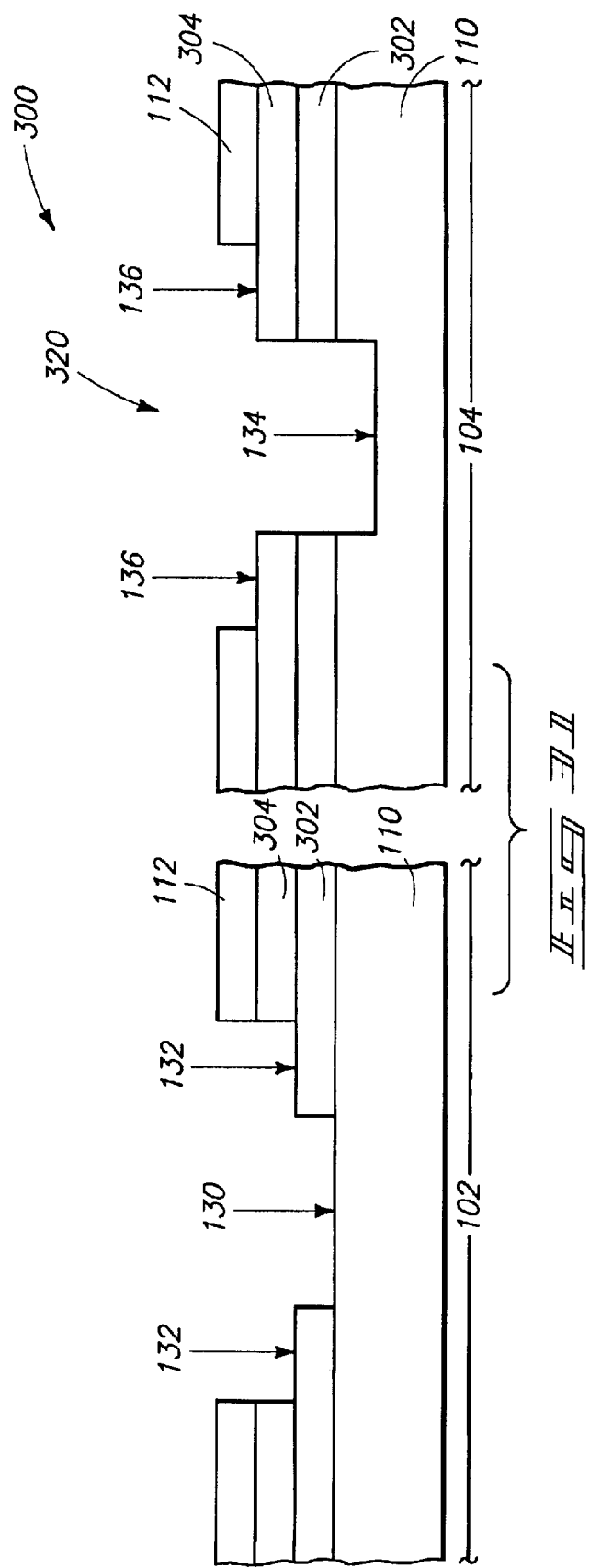
FIG. 31 is a view of the FIG. 22 fragments shown at a processing step subsequent to that of FIG. 30.

Referring to FIG. 31, the remaining photoresist 310 (FIG. 30) is removed.

The construction of FIG. 31 can be considered to comprise a first feature pattern in location 130, first rims in locations 132, a second feature pattern at location 134, and second rims at locations 136. Preferably, the second feature pattern at location 134 causes a rotation in a phase of a desired wavelength which is about 180° different than a rotation in phase caused by the first feature pattern at location 130. Also, first rims 132 preferably cause a rotation in the wavelength of light which is about 180° from the caused by the first feature pattern at location 130. Additionally, second rims 136 preferably cause a rotation in the wavelength of light so that the light is 180° out of phase relative to the light passing through the second feature pattern at location 134. Accordingly, the wavelength of light passing through rims at locations 136 will preferably be in phase with the light passing through first feature pattern at location 130, and the light passing through rims at locations 132 will preferably be in phase with the light passing through second feature pattern at location 134.

The construction 300 of FIG. 31 can correspond to any of the constructions described with reference to the radiation patterning tools of FIGS. 1–5, 8 and 59–63. Specifically, the construction 300 of FIG. 31 can be considered to have a first feature pattern at location 130 which comprises a pattern etched through first phase shifting layer 302, second phase shifting layer 304, opaque layer 112, and to an upper surface of base 110; and a second feature pattern at location 134 which comprises a pattern etched through first phase shifting layer 302, second phase shifting layer 304, and into base 110. Additionally, construction 300 can be considered to include first rims at locations 132 which comprise patterns etched through second phase shifting layer 304 and opaque 112, and to an upper surface of first phase shifting layer 302; and to include second rims at locations 136 which comprise patterns etched through opaque layer 112 and to an upper surface of second phase shifting layer 304.

To the extent that the embodiment of FIG. 31 is utilized for forming one or more of the radiation patterning tools of FIGS. 1–5, 8 or 59–63, it is noted that the first rims will preferably extend along opposing sides of the first feature pattern, but will not extend entirely around the first feature pattern; and that the second rims will preferably extend along opposing sides of the second feature patterns, but not entirely around the second feature patterns. It should be understood, however, that methodology described herein can also be utilized in applications in which rims are formed entirely around a periphery of a feature pattern.

Figure 32:
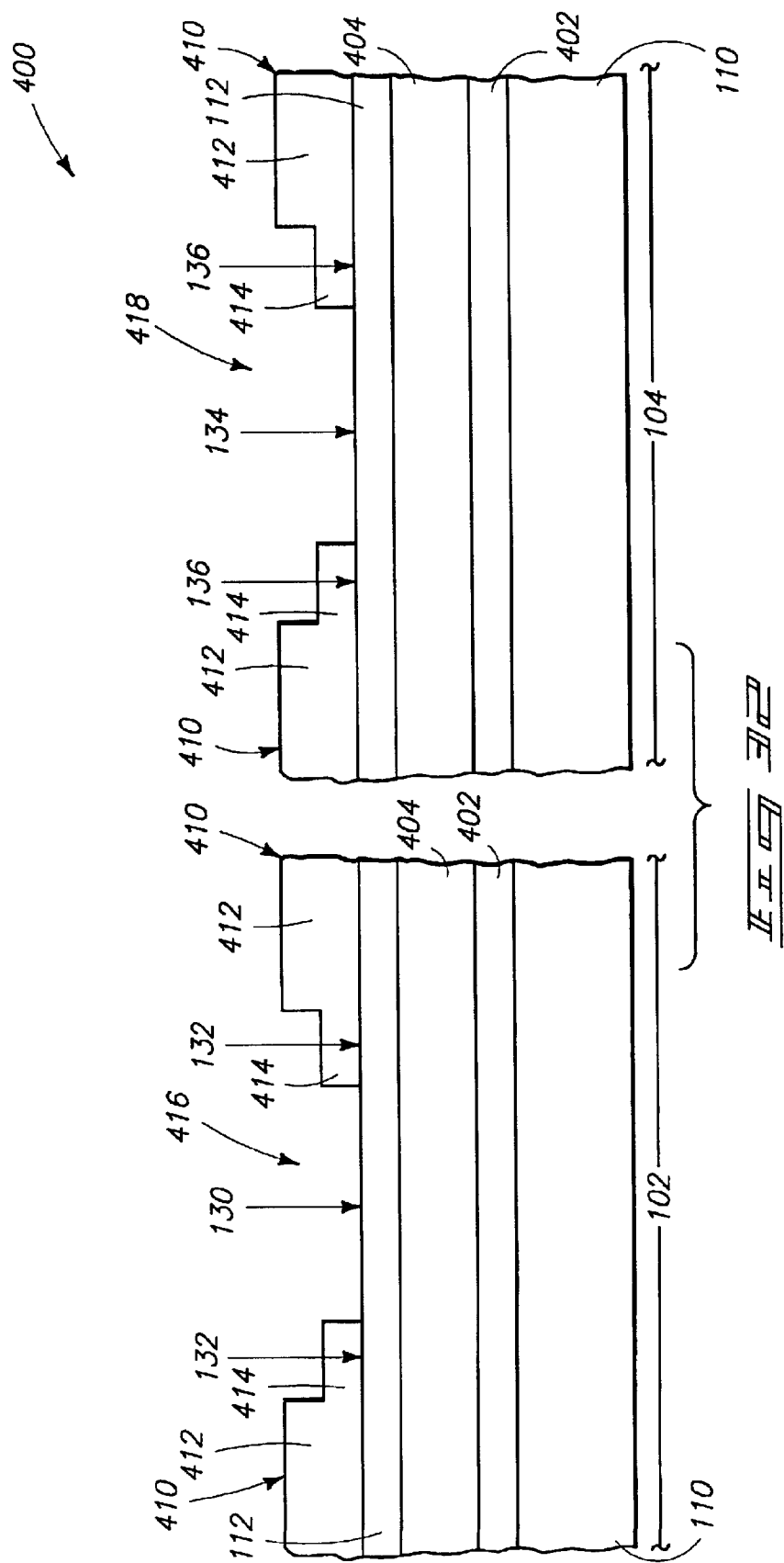
FIG. 32 is a diagrammatic, cross-sectional view of a reticle substrate shown at a preliminary processing step of a fourth embodiment method of the present invention.

Another embodiment of the invention is described with reference to FIGS. 32–38. Referring initially to FIG. 32, a construction 400 comprises a base 110, and an opaque layer 112. Between the base 110 and opaque layer 112 is an attenuating and/or reflecting layer 402, and a phase shifting layer 404. Phase shifting layer 404 can comprise, for example, silicon dioxide or quartz; and layer 402 can comprise, for example, molybdenum silicide, titanium nitride, tantalum silicide, zirconium silicon oxide, and/or chromium fluoride. Preferably, layer 404 will allow at least 90% transmission, and more preferably about 100% transmission, of a working wavelength of light passing through construction 400; and also preferably the combined thicknesses of layers 402 and 404 are such that the working wavelength of light has a phase rotated by 360° (or a multiple thereof) when passing through the combined layers 402 and 404. The layer 404 can give 180° of the total phase shift obtained from the combined layers 402 and 404, or can contribute a different component of the total phase shift.

Photoresist 410 is provided over fragments 102 and 104 of the construction 400. Photoresist 410 is patterned to comprise a thick portion 412, and a thinner portion 414 over fragment 102, and also to comprise the thick portion 412 and thinner portion 414 over fragment 104. Additionally, the photoresist defines an opening 416 extending therethrough to expose a segment of opaque material 112 relative to fragment 102, and defines another opening 418 extending therethrough to define a segment of opaque material 112 relative to fragment 104.

A first feature pattern location 130 is defined within the opening 416 associated with fragment 102, and first rim locations 132 are defined by the thinned photoresist portions 414 associated with region 102. Also, a second feature pattern location 134 is defined within the opening 418 associated with region 104, and second rim locations 136 are defined by the thinned photoresist portions 414 associated with fragment 104.

Figure 33:
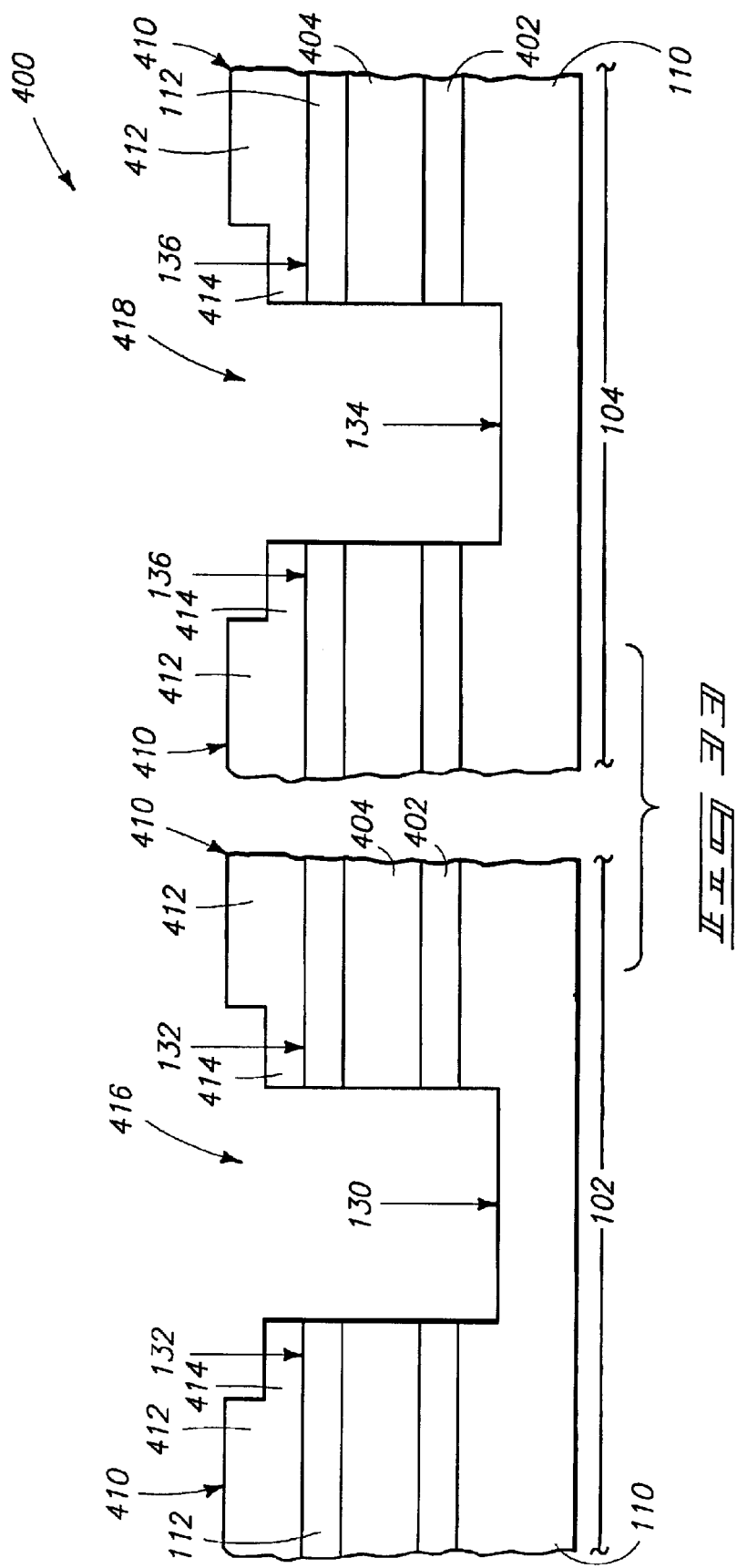
FIG. 33 is a view of the FIG. 32 fragments shown at a processing step subsequent to that of FIG. 32.

Referring to FIG. 33, openings 416 and 418 are extended through opaque layer 112, phase shifting layers 402 and 404, and into base 110. Accordingly the first and second feature pattern locations 130 and 134 are extended into base 110.

Figure 34:
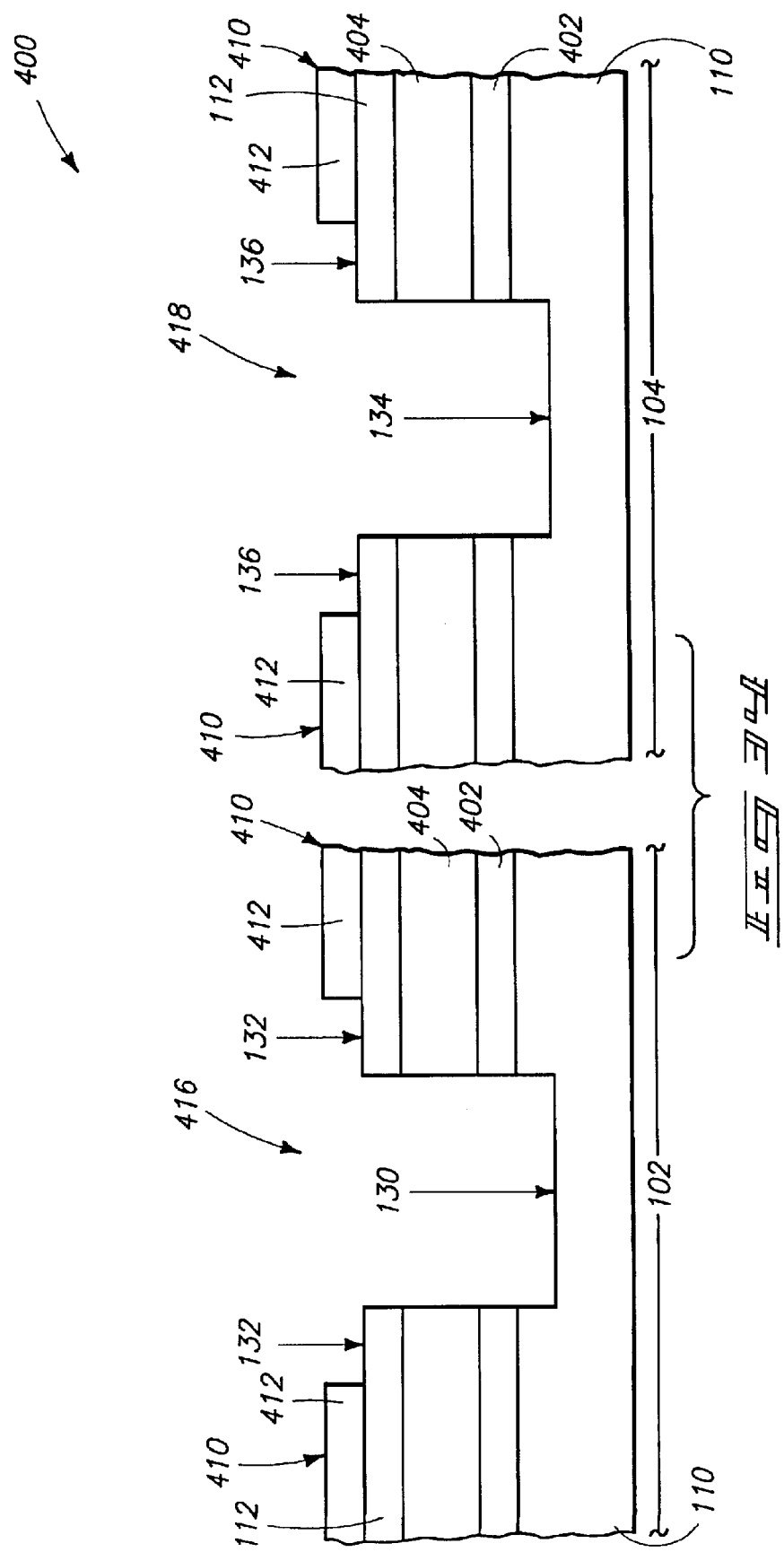
FIG. 34 is a view of the FIG. 32 fragments shown at a processing step subsequent to that of FIG. 33.

Referring to FIG. 34, the photoresist 410 is exposed to a solvent (or other suitable processing conditions) which removes the thinner portion 414 (FIG. 33), while leaving (but thinning) the thicker portion 412. Such exposes segments of opaque material 112 within first and second rim locations 132 and 136.

Figure 35:
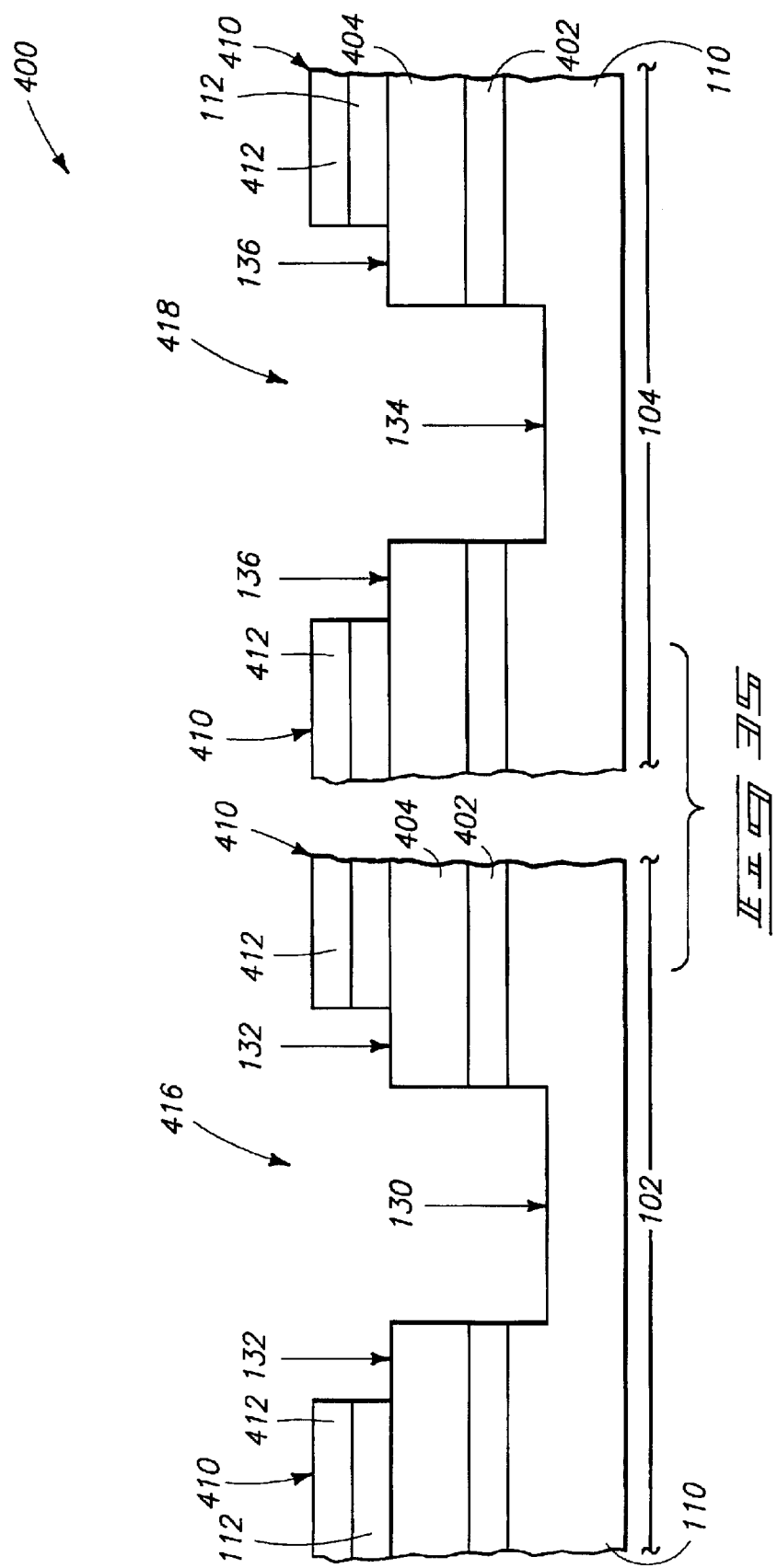
FIG. 35 is a view of the FIG. 32 fragments shown at a processing step subsequent to that of FIG. 34.

Referring to FIG. 35, the exposed segments of opaque material 112 (FIG. 34) are removed to extend first and second rim locations 132 and 136 to an upper surface of layer 404.

Figure 36:
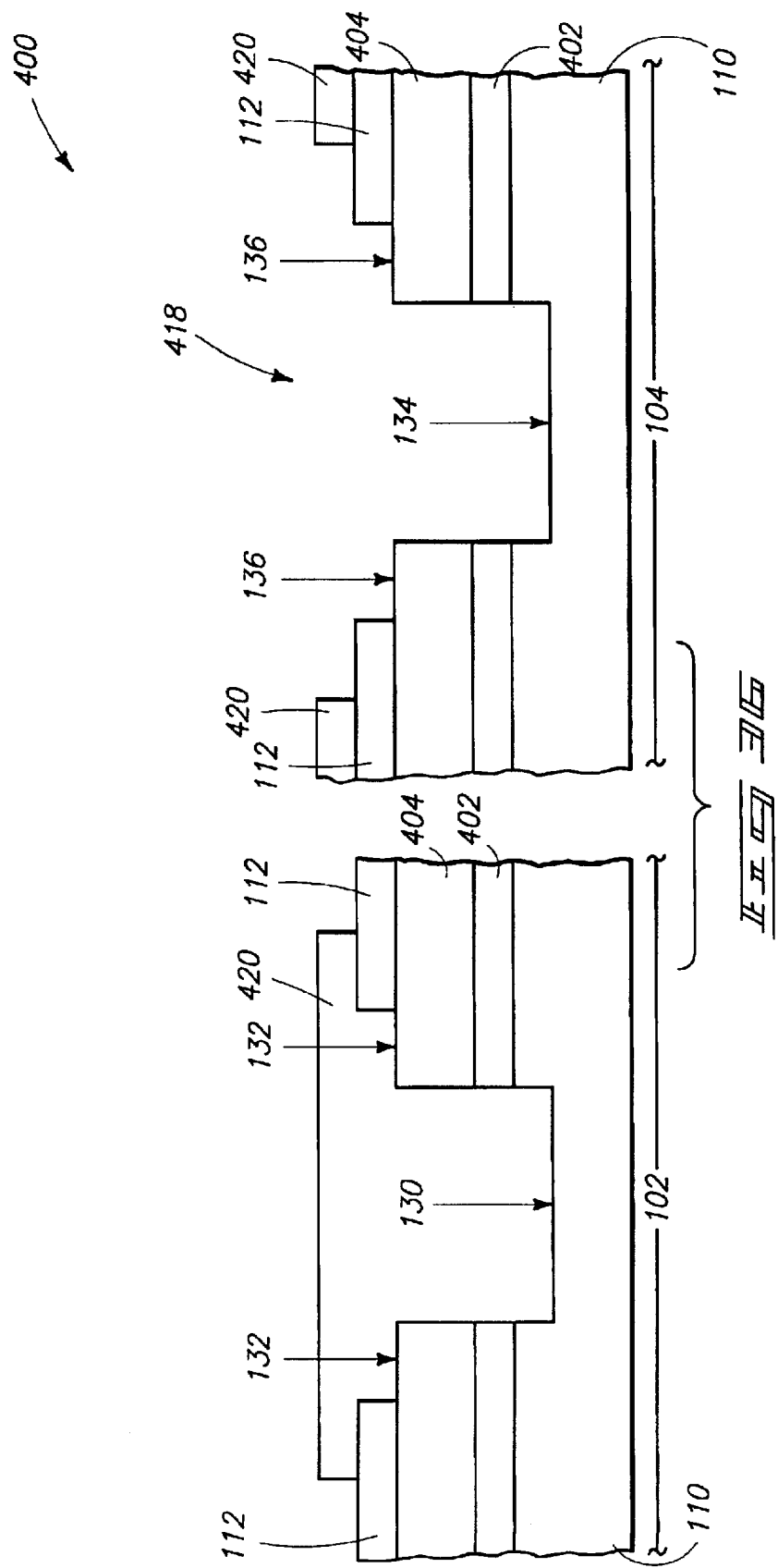
FIG. 36 is a view of the FIG. 32 fragments shown at a processing step subsequent to that of FIG. 35.

Referring to FIG. 36, a protective mask 420 is formed over fragment 102, and specifically is formed to protect first rim locations 132 and first feature pattern 130. Portions of the protective mask 420 are shown also extending over fragment 104, although the extension of mask 420 over fragment 104 is not particularly pertinent to the further processing. Mask 420 can comprise, for example, photoresist. In the shown embodiment, the photoresist 410 (FIG. 35) has been removed prior to formation of protective mask 420, but it is to be understood that the invention encompasses other embodiments (not shown) wherein photoresist 410 is left in place and protective mask 420 is formed over the resist 410.

Figure 37:
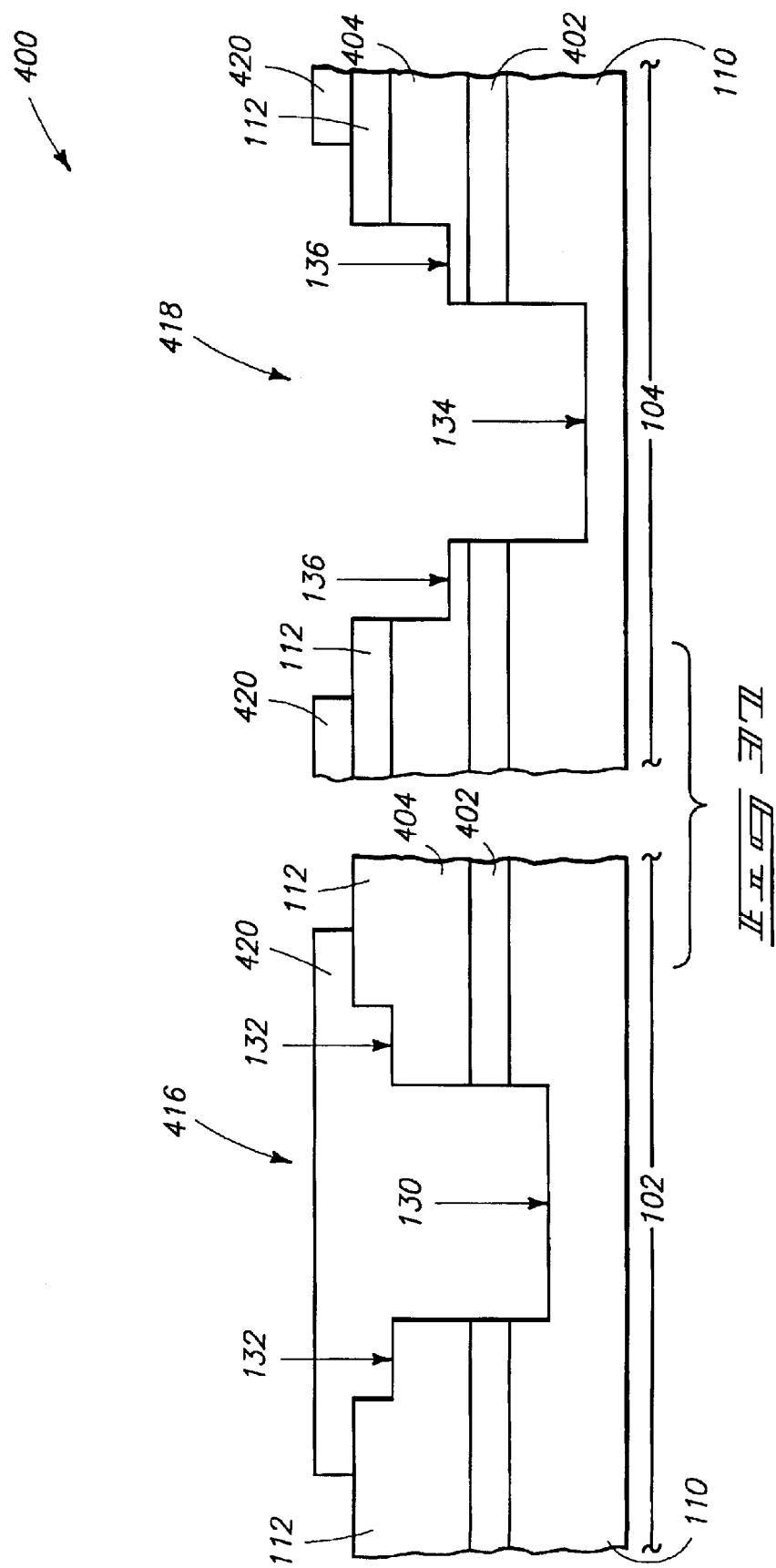
FIG. 37 is a view of the FIG. 32 fragments shown at a processing step subsequent to that of FIG. 36.

Referring to FIG. 37, an etch is utilized to extend second feature pattern location 134 deeper into base 110, and to extend second rim locations 136 into phase shifting layer 404. A suitable etch can utilize a fluorine-based plasma.

Figure 38:
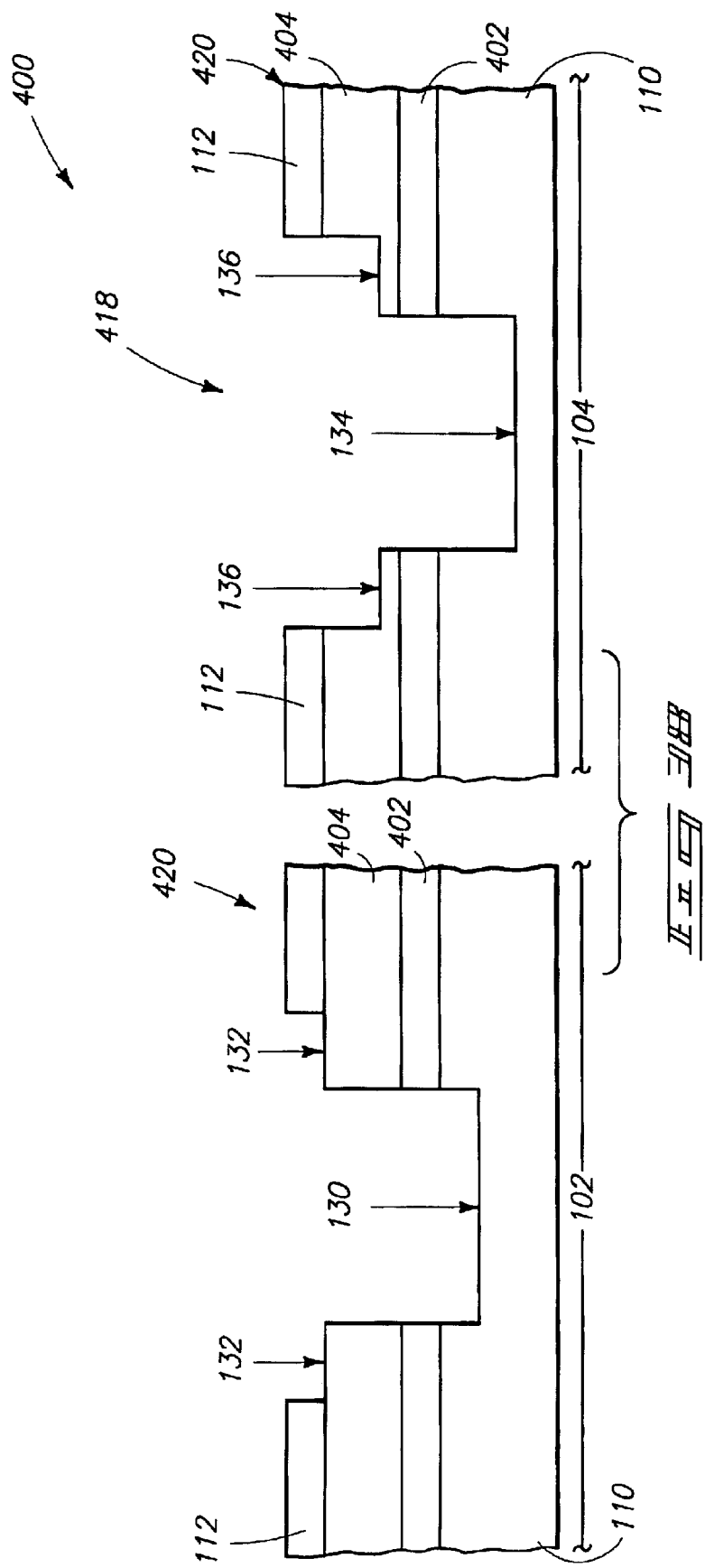
FIG. 38 is a view of the FIG. 32 fragments shown at a processing step subsequent to that of FIG. 37.

Referring to FIG. 38, protective mask 420 (FIG. 37) is removed. The resulting structure has a first feature pattern at location 130, a second feature pattern at location 134, first rims at locations 132, and second rims at locations 136. Preferably, light passing through the first feature pattern is in phase with light passing through the second rims; and light passing through the second feature pattern is in phase with light passing through the first rims. Further, preferably the light passing through the first feature pattern is shifted in phase by from about 170° to about 190° relative to light passing through the first feature pattern, and more preferably is shifted by about 180° in phase relative to the light passing through the first feature pattern. The light passing through second rims at locations 136 can actually be shifted by about 540° relative to light passing through second feature pattern 134, with the net effect of a 540° rotation of phase is same as a 180° rotation of phase (i.e., 540=180+360). Also, the total rotation in phase between light passing through first rims 132 and light passing through second feature pattern 134 can be 720°, but since 720° is a multiple of 360 (specifically, it is 2×360) the net rotation in phase is 0°, or in other words light passing through first rims 132 is in phase with light passing though second feature pattern 134.

Figure 39:
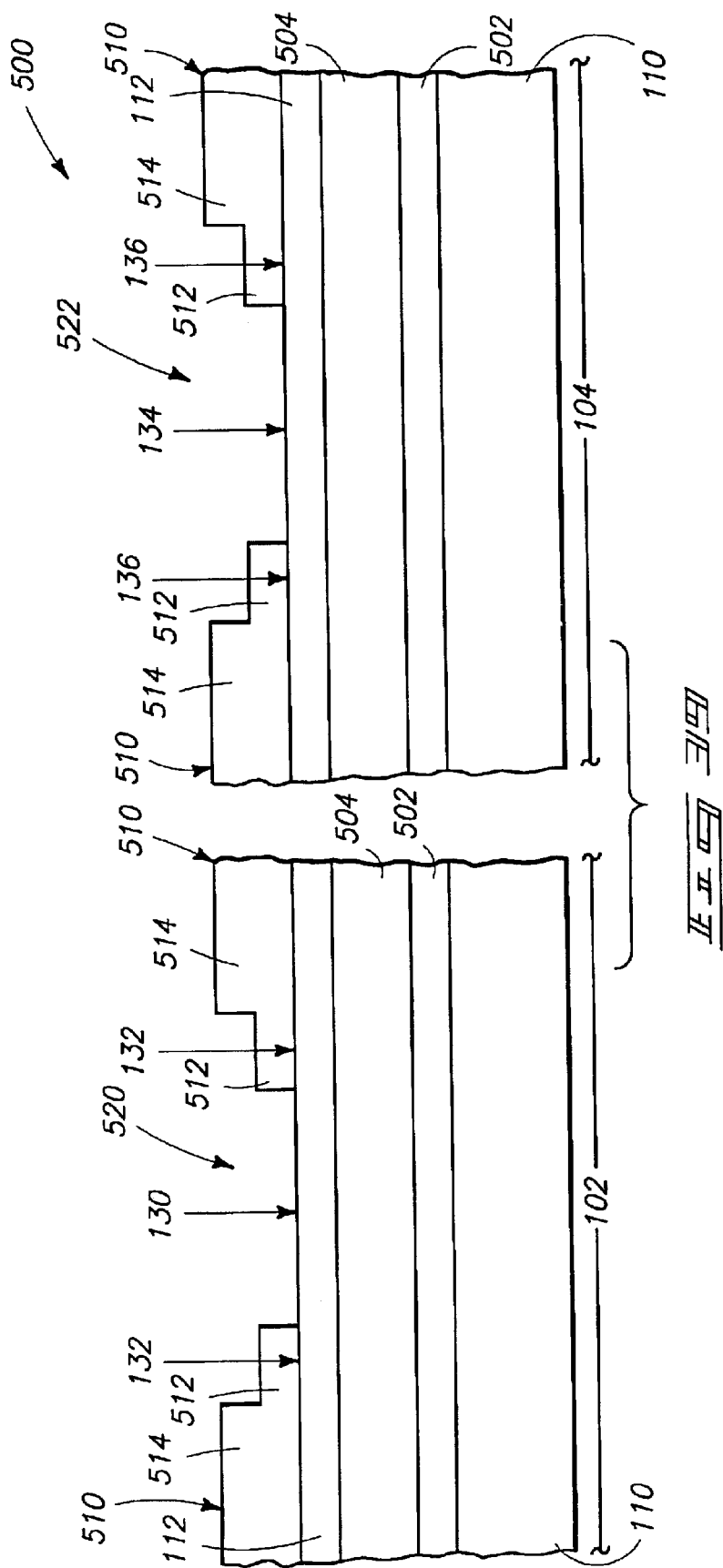
FIG. 39 is a diagrammatic, cross-sectional view of a radiation patterning tool shown at a preliminary processing step of a method of the present invention.

Another embodiment is described with reference to FIGS. 39–45. Referring initially to FIG. 39, a construction 500 is illustrated which comprises a pair of fragments 102 and 104. Each of the fragments includes a base 110 and an opaque layer 112. Layers 502 and 504 are between the base and opaque layer. Layer 502 can comprise an attenuating and/or reflecting layer, which also induces a small phase shift (with a suitable material comprising one or both of chromium and aluminum) such as, for example, materials utilized in beamsplitters. Layer 504 can comprise a material which provides at least 90% transmission of a desired wavelength of light, and more preferably about 100% transmission of the desired wavelength of light, with suitable materials being, for example, quartz or silicon dioxide. The material of layer 502 can be chosen to give a similar phase shift that occurs during propagation of the wavelength of light through air, and fabrication of a radiation patterning tool from construction 500 can be simplified if layer 502 comprises a material which can be selectively etched relative to base 110 and layer 504.

A first feature pattern location 130 is defined relative to fragment 102, and first rim locations 132 are defined proximate feature pattern location 130. Also, a second feature pattern location 134 is defined relative to fragment 104, and second rim locations 136 are defined adjacent to second feature pattern 134.

A photoresist 510 is provided over fragments 102 and 104. Photoresist 510 has an opening 520 extending therethrough to expose a segment of opaque layer 112 within first feature pattern location 130, and has an opening 522 extending therethrough to expose another segment of opaque material 112 within second feature pattern location 134. Photoresist 510 has thin portions 512 over first rim locations 132 and second rim locations 136, and has thicker portions 514 outwardly of the thin portions 512.

Figure 40:
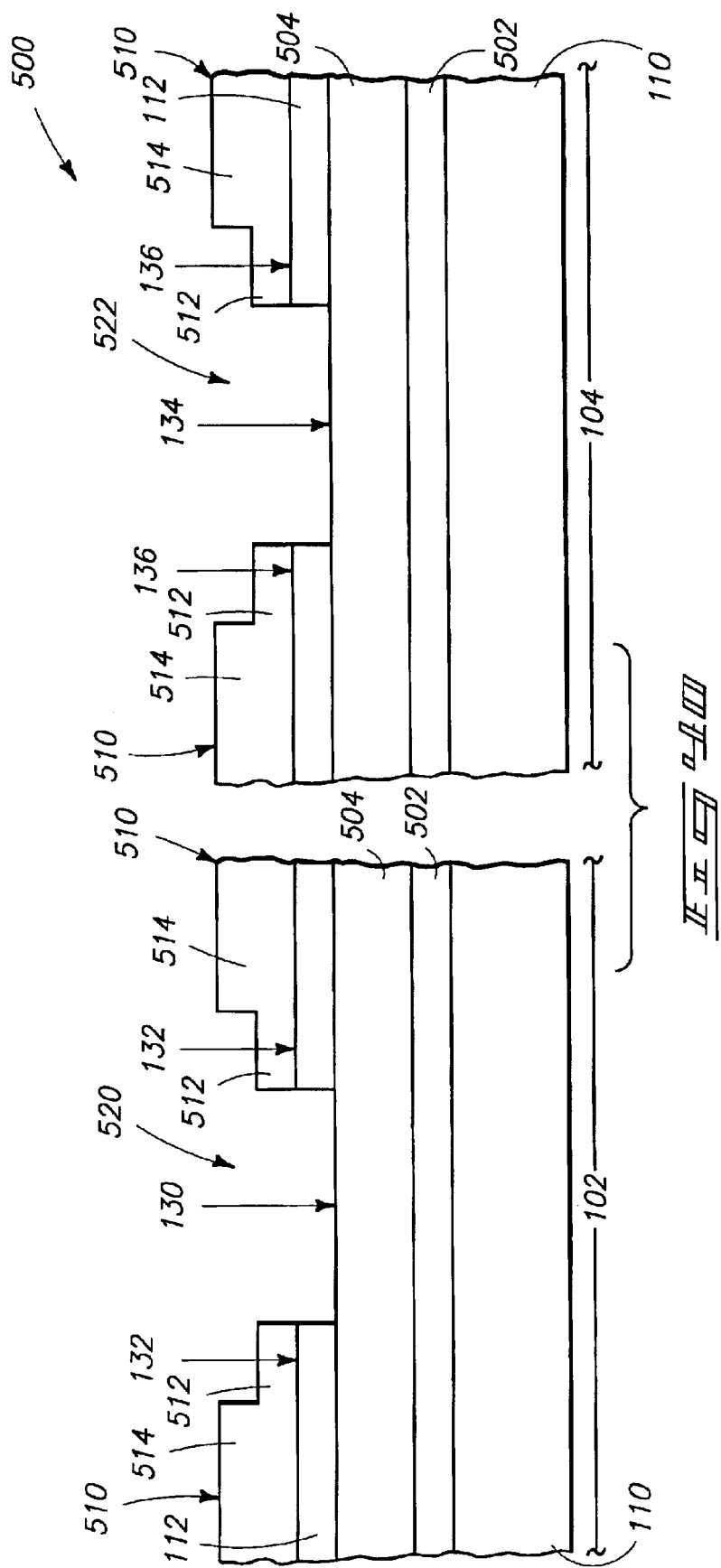
FIG. 40 illustrates a pair of fragments, with the leftmost fragment corresponding to the view 2—2 of FIG. 8, and the rightmost fragment corresponding to the view 4—4 of FIG. 8.

Referring to FIG. 40, exposed segments of opaque material 112 are subjected to an etch to extend openings 520 and 522 to an upper surface of layer 504.

Figure 41:
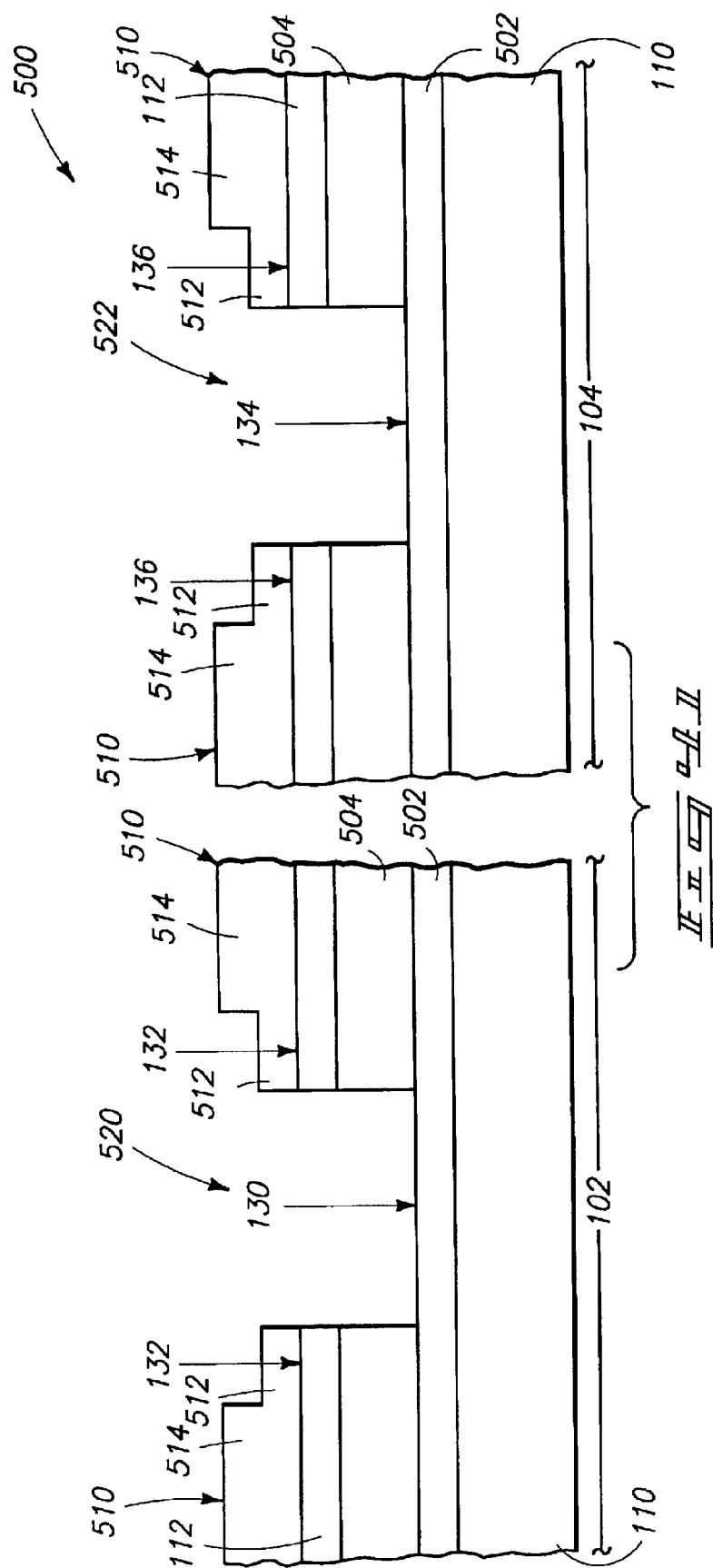
FIG. 41 shows the FIG. 39 fragments at a processing step subsequent to that of FIG. 40.

Referring to FIG. 41, exposed portions of layer 504 are subjected to an etch to extend openings 520 and 522 to an upper surface of layer 502.

Figure 42:
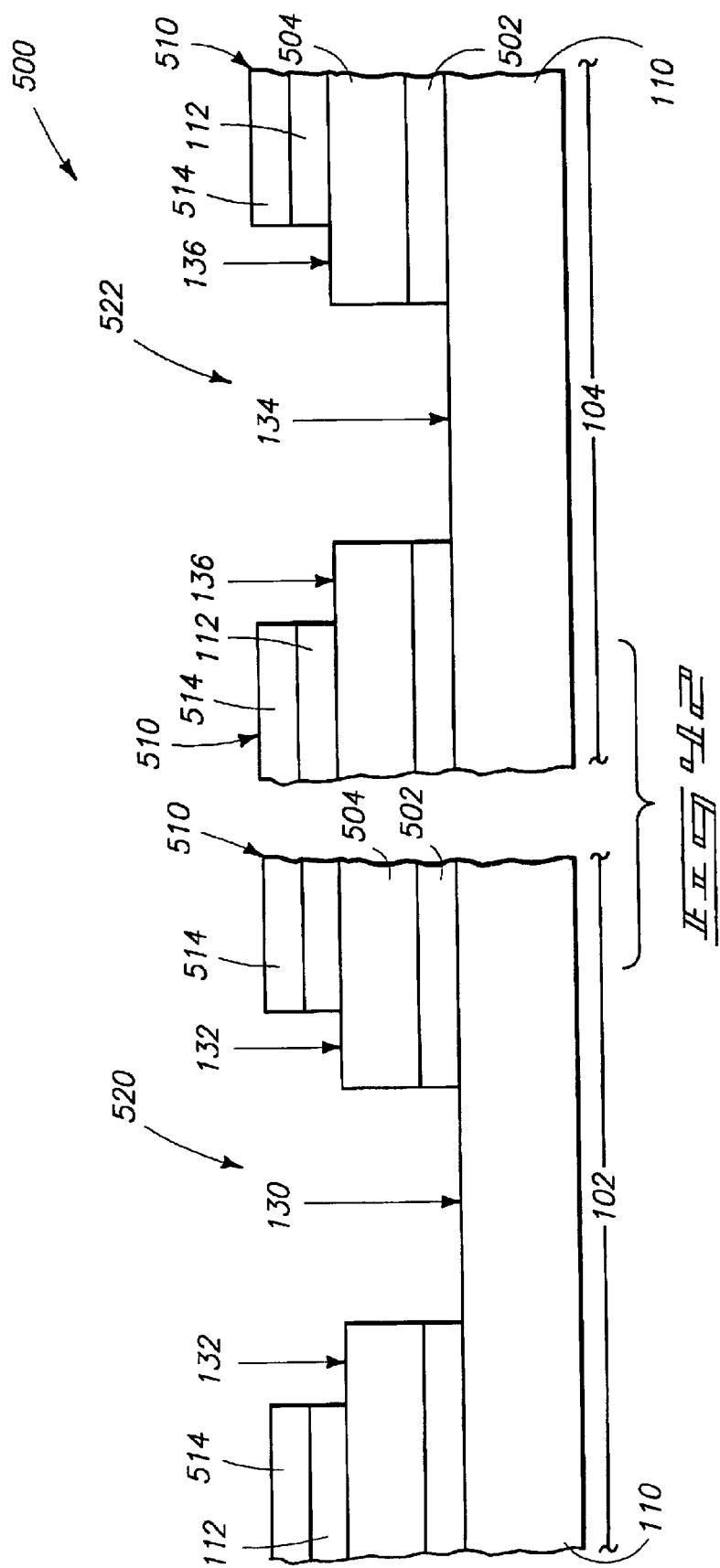
FIG. 42 shows the FIG. 39 fragments at a processing step subsequent to that of FIG. 41.

Referring to FIG. 42, photoresist 510 is exposed to a solvent (or other suitable processing conditions) to remove thinned portions of the photoresist (FIG. 41), and subsequently an etch is utilized to remove exposed portions of layers 112 and 502. Since layers 502 and 112 will both typically comprise metals, they can be etched simultaneously, utilizing an etch substantially selective for the quartz of layers 504 and 110. A suitable etch can be, for example, an etch utilizing a chlorine-based plasma. In alternative embodiments, layers 112 and 502 can be etched one at a time relative to one another. The structure of FIG. 42 has first and second feature pattern locations 130 and 134 extending to an upper surface of base 110, and first and second rim locations 132 and 136 extending to an upper surface of layer 504.

Figure 43:
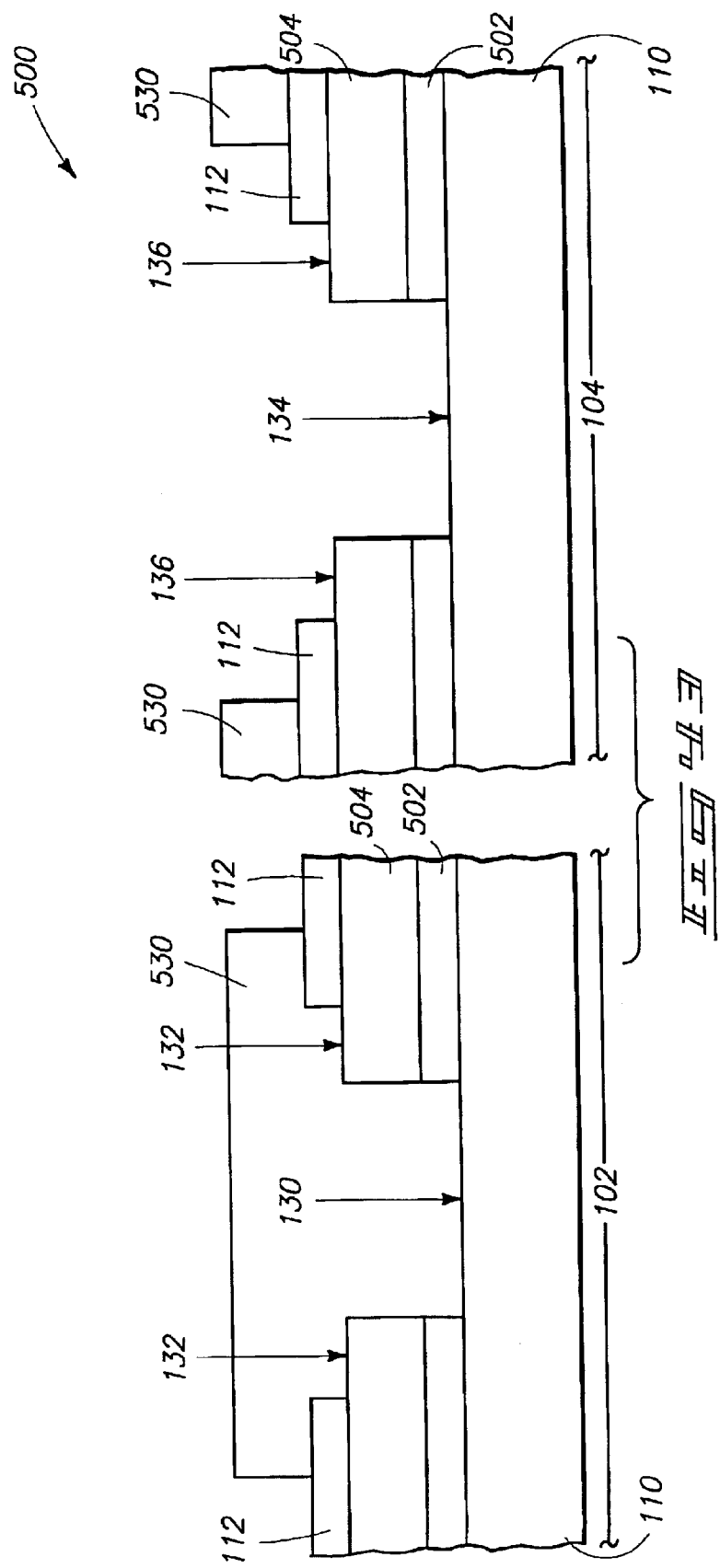
FIG. 43 shows the FIG. 39 fragments at a processing step subsequent to that of FIG. 42.

Referring to FIG. 43, a protective masking material 530 is provided over first feature pattern location 130 and first rim locations 132, while leaving second feature pattern location 134 and second rim locations 136 exposed. Alignment of masking material 530 is non-critical in the sense that the mask does not have to be tightly aligned to the rim location or feature pattern locations associated with fragment 102, but rather simply should cover such locations. It is noted that although masking material 530 is illustrated in FIG. 43 as being provided after removal of photoresist 510 (FIG. 42), the invention also encompasses embodiments wherein photoresist 510 is left in place during provision of masking material 530, and wherein the mask 530 is thus provided over photoresist 510.

Figure 44:
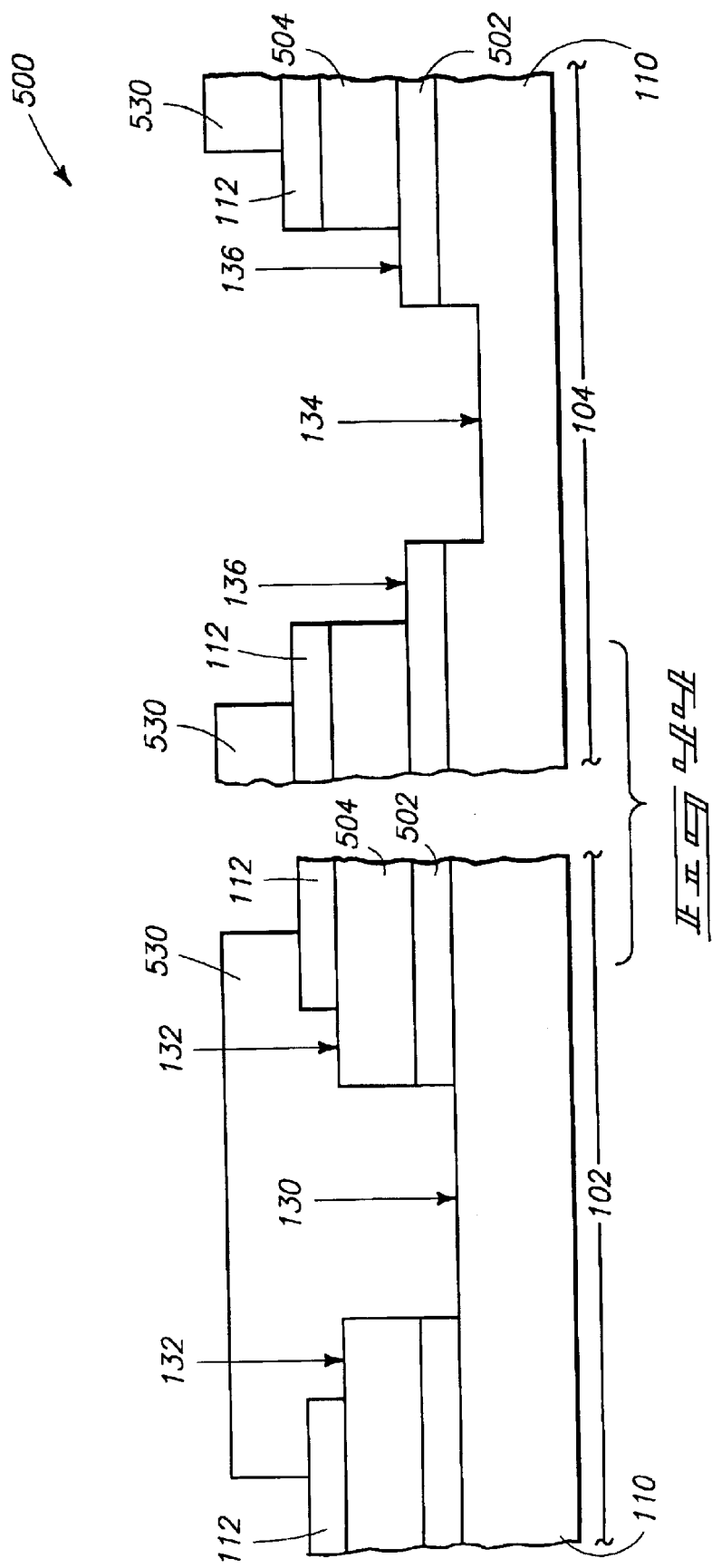
FIG. 44 shows the FIG. 39 fragments at a processing step subsequent to that of FIG. 43.

Referring to FIG. 44, the quartz materials of base 110 and layer 504 are etched to extend second rim locations 136 to an upper surface of layer 502, and to extend second feature pattern location 134 into base 110.

Referring to FIG. 45, protective mask 530 (FIG. 44) is removed. The resulting structure has a first feature pattern at location 130, first rims at locations 132, a second feature pattern at location 134, and second rims at locations 136. The construction of FIG. 45 can correspond to any of the radiation patterning tool constructions of FIGS. 1–5, 8 and 59–63. Light passing through the first feature pattern is preferably in phase with light passing through the second rims, and light passing through the second feature pattern is preferably in phase with light passing through the first rims. Further, light passing through the first feature pattern is preferably 180° out of phase relative to light passing through the first rims, and light passing through the second feature pattern is preferably 180° out of phase with light passing through the second rims.

The embodiments described with reference to FIGS. 9–45 utilize etching to form different thicknesses of materials, and then utilize the different thicknesses to generate phase differences in light passing through the materials. Another approach to generating a phase difference in light passing through material is to dope the material. Specifically, U.S. Pat. Nos. 5,208,125 and 5,217,830 describe various processes wherein a dopant can be utilized to induce a phase change in light passing through material. In particular aspects, the dopant can induce a phase shift of 180° in light passing through a material, without attenuating the light. Among the ions that are indicated as being suitable for inducing suitable changes in the light-transmitting characteristics of quartz materials are boron, indium, arsenic, antimony and phosphorous. The ion-doping methodologies can be incorporated into embodiments of the present invention, with exemplary embodiments being described with reference to FIGS. 46–58.

Referring initially to FIG. 46, a construction 600 is illustrated. Construction 600 is identical to the construction 100 of FIG. 9, and accordingly identical labeling is utilized in describing the construction 600 of FIG. 46, as was utilized in describing the structure of FIG. 9. Accordingly, structure 600 comprises a base 110 (which preferably comprises quartz), an opaque layer 112 (which preferably comprises chromium), and a patterned photoresist 114. Openings 120, 122 and 124 extend through the patterned photoresist to expose segments of opaque layer 112 at a first feature pattern location 130, and second rim locations 136.

Referring to FIG. 47, the exposed segments of opaque layer 112 (FIG. 46) are removed to extend openings 120, 122 and 124 to an upper surface of base 110. It is noted that when openings are described as extending "to" an upper surface herein, it is to be understood that the openings can terminate at the upper surface, or can extend into the surface.

Referring to FIG. 48, photoresist 114 is exposed to a solvent (or other suitable processing conditions) which removes thinned portions 118 (FIG. 47) of the photoresist to leave thick portions 116. The removal of the thinned portions of the photoresist exposes segments of opaque material 112 in first rim locations 132 and second feature pattern location 134. The exposed segments of opaque material 112 function as a mask during subsequent implant of a dopant 602, as illustrated in FIG. 49. The implanted dopant forms a first doped region 604 within first feature pattern location 130, and second doped regions 606 within second rim locations 136. It can be advantageous to process the resist prior to implanting dopant (as shown) in order to avoid processing the resist after properties of the resist may have been altered through implantation of ions into the resist. Additionally, a hard mask can be provided between resist 114 and opaque layer 112 if there is an effect of the implant on the remaining resist.

Referring to FIG. 50, exposed segments of opaque layer 112 (FIG. 49) are removed.

Referring to FIG. 51, photoresist 114 (FIG. 50) is removed. The construction of FIG. 51 comprises a first feature pattern at location 130, a second feature pattern at location 134, first rims at locations 132 and second rims at locations 136. The first feature pattern at location 130 and second rims at locations 136 are comprised by doped regions 604 and 606, respectively. Preferably, light passing through the first feature pattern is substantially in phase with light passing through the second rims; and light passing through the first rims is substantially in phase with light passing through the second feature pattern. Also preferably, light passing through the first rims has a phase which is shifted from about 170° to about 190° relative to the phase of light passing through the first feature pattern, and more preferably the phase is shifted by about 180°, or exactly 180°. Also, the light passing through the second rims is preferably shifted by from about 170° to about 190° relative to the light passing through the second feature pattern, and more preferably is shifted by about 180°, and even more preferably is shifted by exactly 180°. The construction of FIG. 51 can correspond to any of the radiation patterning tool constructions described previously with reference to FIGS. 1–5, 8 and 59–63.

Another embodiment of the invention is described with reference to FIGS. 52–58, and such utilizes ion doping in combination with one or more attenuating and/or phase shifting layers.

Referring to FIG. 52, a construction 700 is illustrated. The construction includes a first fragment 102 and a second fragment 104. Fragments 102 and 104 both comprise a base 110 and an opaque material 112. As described previously, base 110 can comprise quartz, and opaque material 112 can comprise chromium. An attenuating and/or phase shifting layer 702 is provided between base 110 and opaque material 112. Layer 702 can comprise, for example, molybdenum silicide.

A first feature pattern location 130, and first rim locations 132 are defined relative to fragment 102, and a second feature pattern location 134 and second rim locations 136 are defined relative to fragment 104. A patterned photoresist 710 is provided over opaque material 112. Photoresist 710 comprises openings 720 and 722 extending to first and second feature pattern locations 130 and 136, respectively. Resist 710 also comprises thinned regions 712 over first and second rim locations 132 and 134, and thick regions 714 outwardly of thinned regions 712.

Referring to FIG. 53, openings 720 and 722 are extended through opaque material 112 and layer 702 to a surface of base 110. The etch can stop at an upper surface of base 110, as shown, or can extend into base 110. In either event, the etch can be referred to as extending to base 110.

Referring to FIG. 54, resist 710 is exposed to a solvent (or other suitable processing conditions) which removes the thinned portions 712 (FIG. 53), while leaving the thicker portions 714. Such removal exposes segments of opaque material 112 within first rim locations 132 and second rim locations 134.

Figure 55:
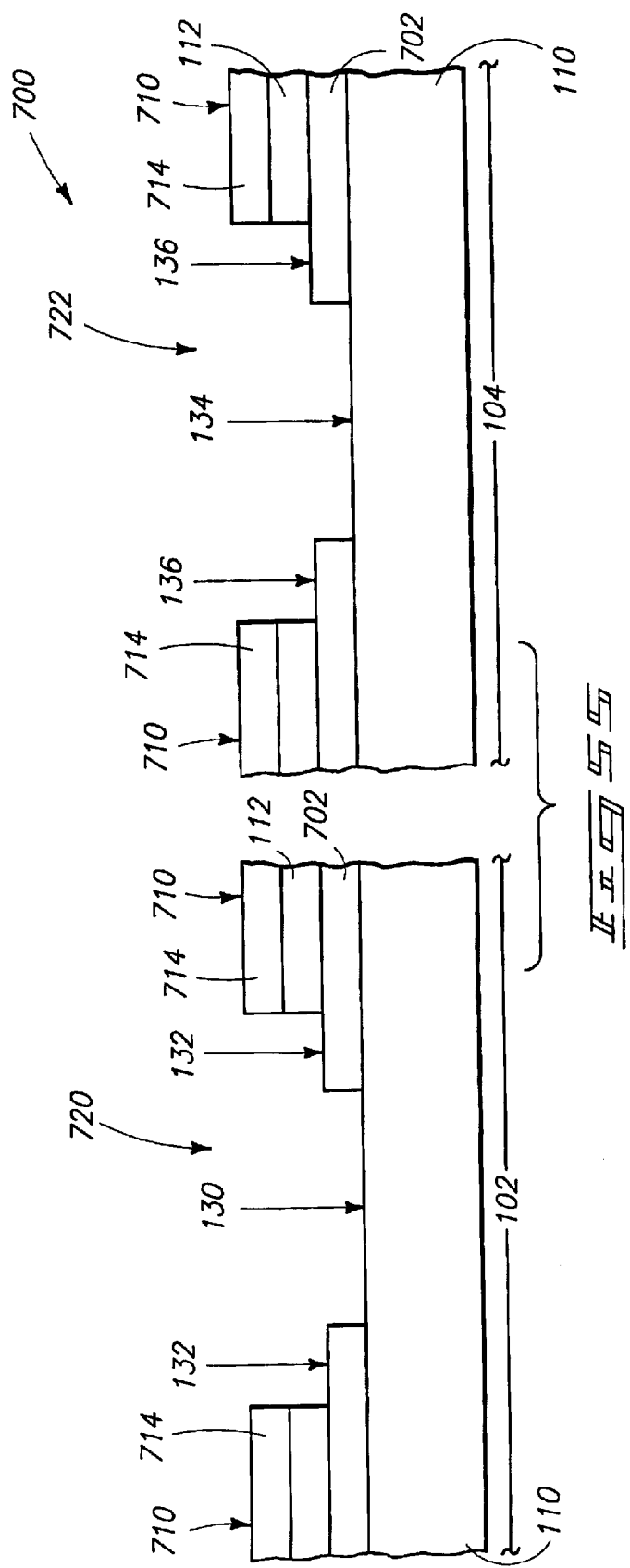
FIG. 55 shows the FIG. 52 fragments at a processing step subsequent to that of FIG. 54.

Referring to FIG. 55, the exposed segments of opaque material 112 (FIG. 54) are removed. Such extends first and second rim locations 132 and 136 to layer 702.

Figure 56:
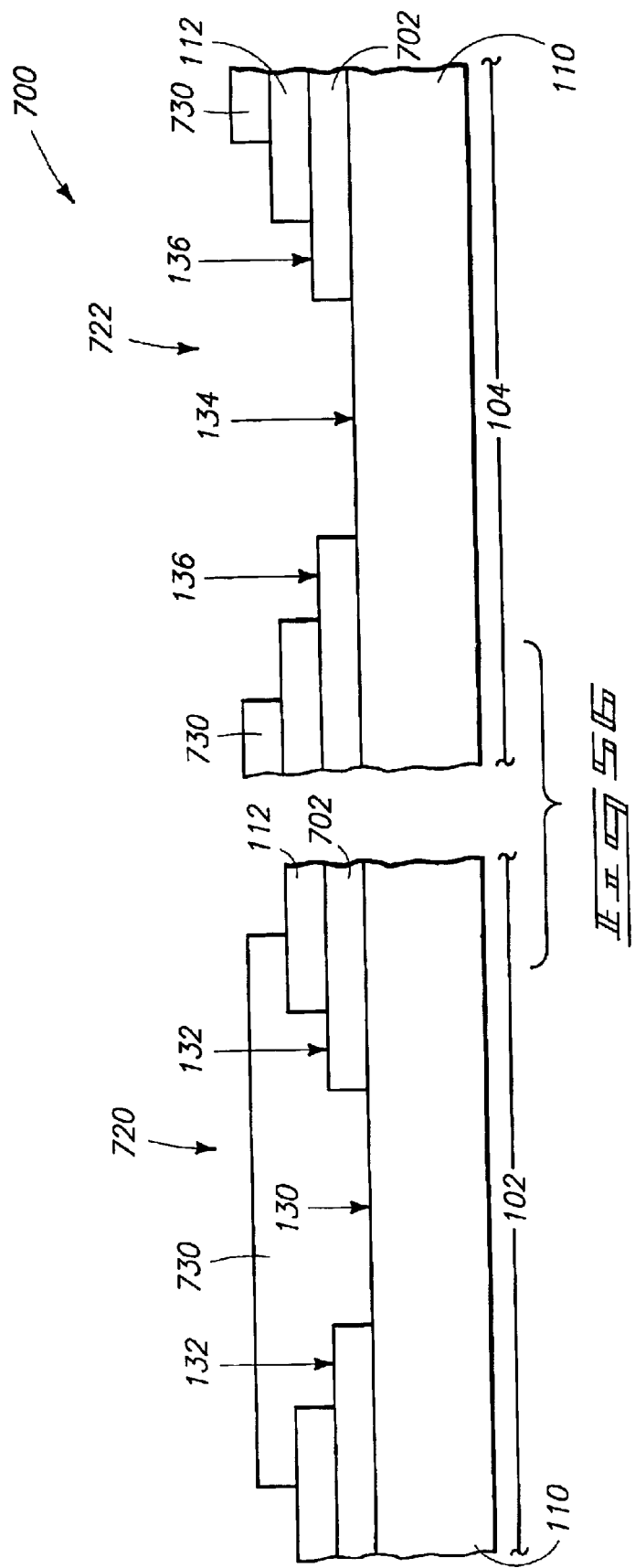
FIG. 56 shows the FIG. 52 fragments at a processing step subsequent to that of FIG. 55.

Referring to FIG. 56, a protective mask 730 is formed over fragment 102, and specifically over first feature pattern location 130 and first rim locations 132. The protective mask is shown being formed after removal of photoresist 710 (FIG. 55), but it is to be understood that the photoresist 710 could also be left in place during formation of protective mask 730. Second feature pattern location 134 and second rim locations 136 are left exposed after provision of mask 730. Mask 730 can comprise, for example, photoresist.

Figure 57:
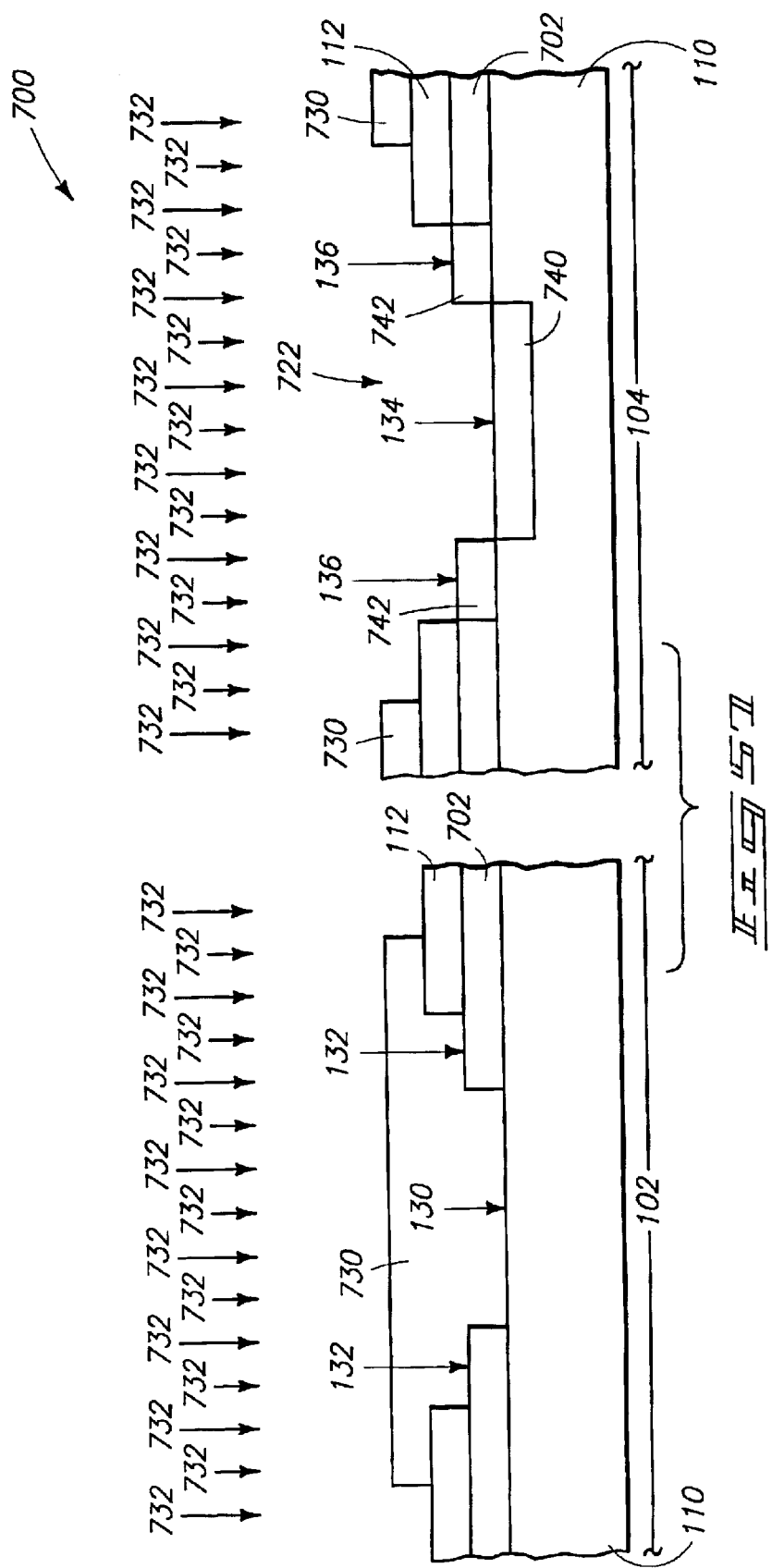
FIG. 57 shows the FIG. 52 fragments at a processing step subsequent to that of FIG. 56.

Referring to FIG. 57, a dopant 732 is implanted into second feature pattern location 134 and second rim locations 136 to form a doped region 740 within base 110, and doped regions 742 within layer 702.

Figure 58:
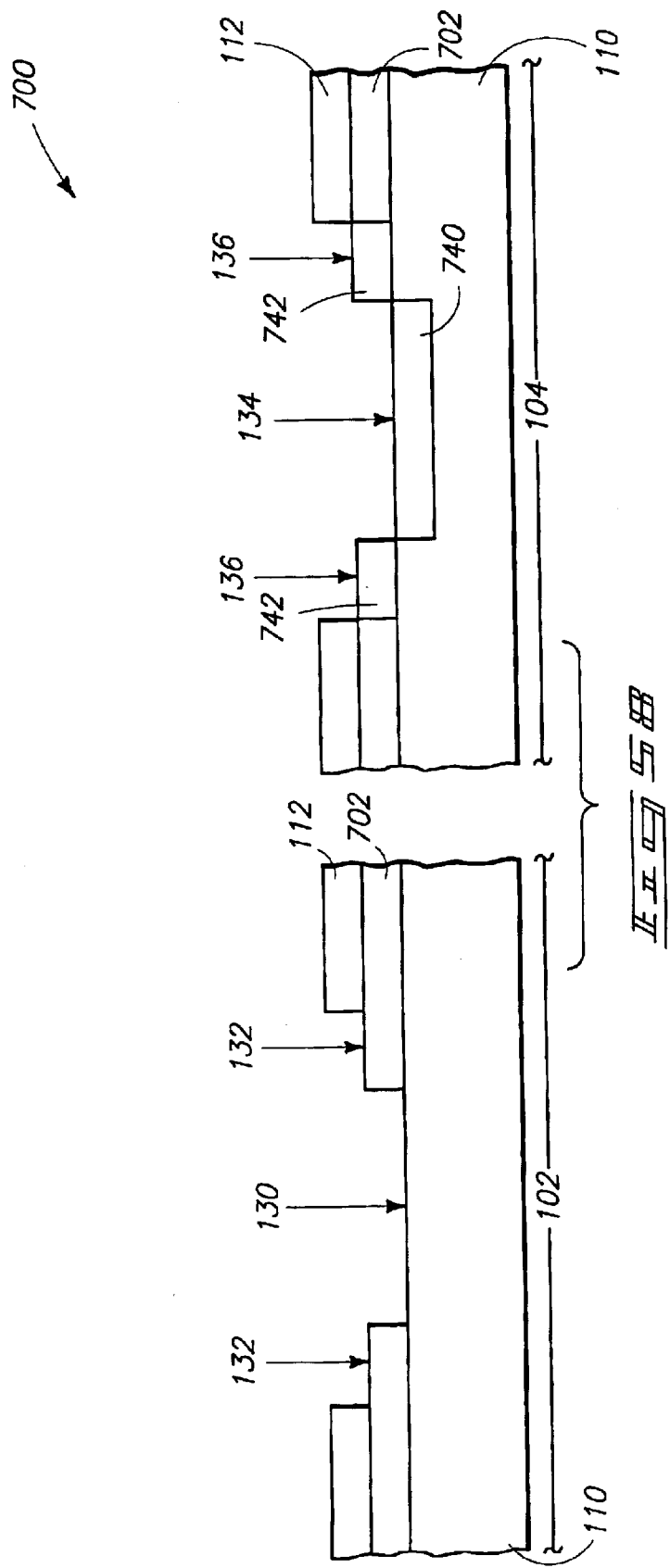
FIG. 58 shows the FIG. 52 fragments at a processing step subsequent to that of FIG. 57.
Figure 59:
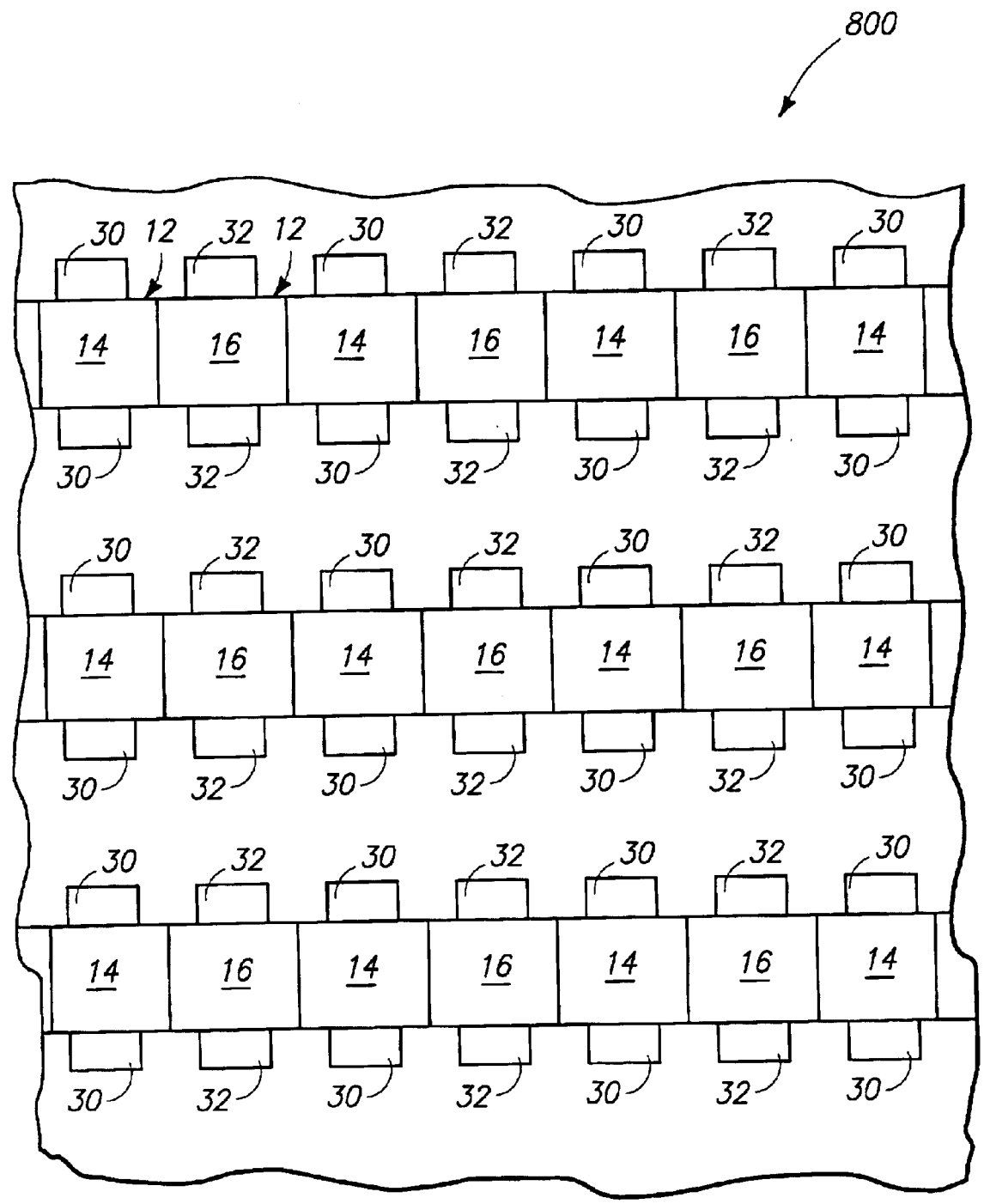
FIG. 59 is a diagrammatic, top view of a fragment of another embodiment radiation patterning tool encompassed by the present invention.
Figure 60:
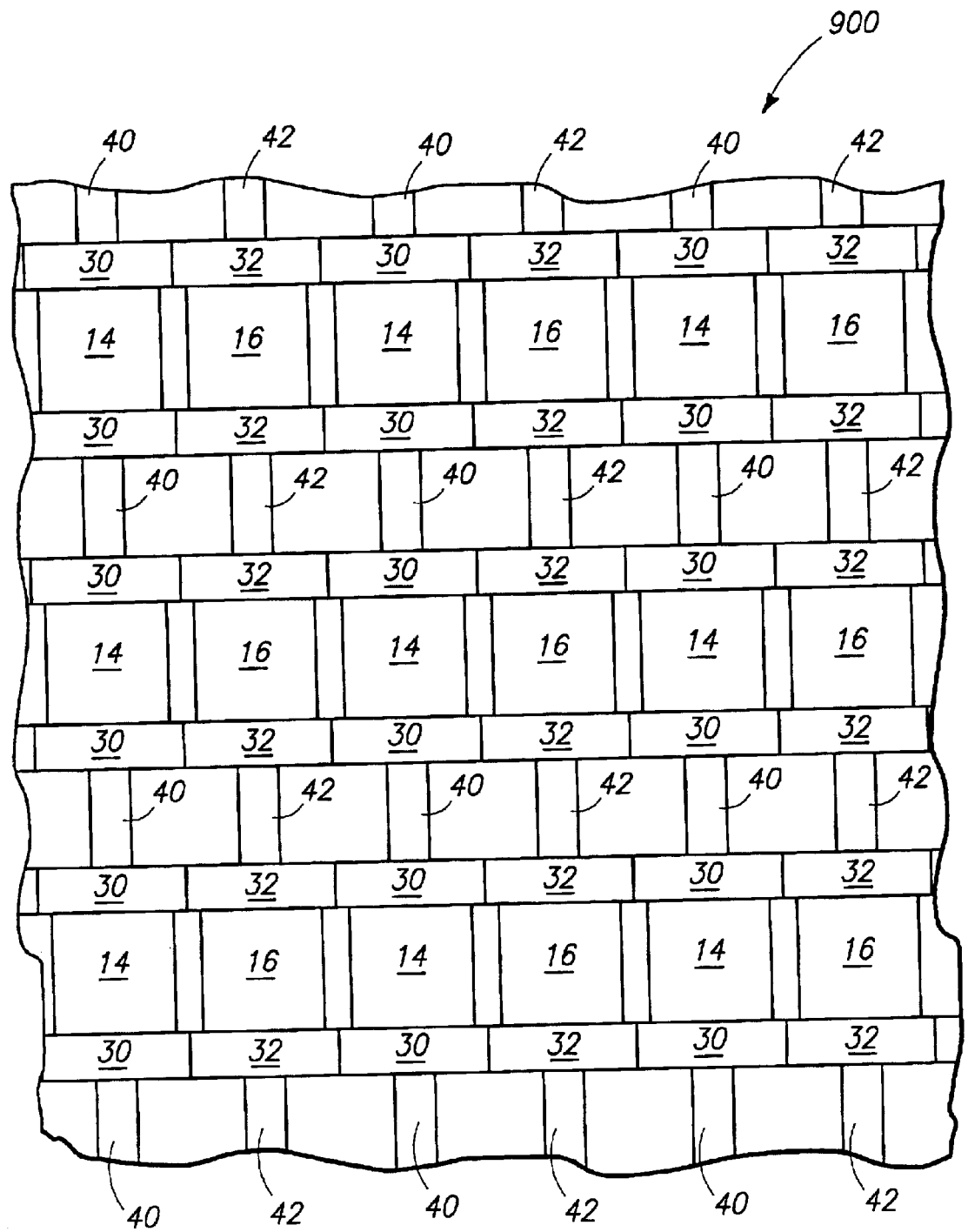
FIG. 60 is a diagrammatic, top view of a fragment of yet another embodiment radiation patterning tool encompassed by the present invention.
Figure 61:
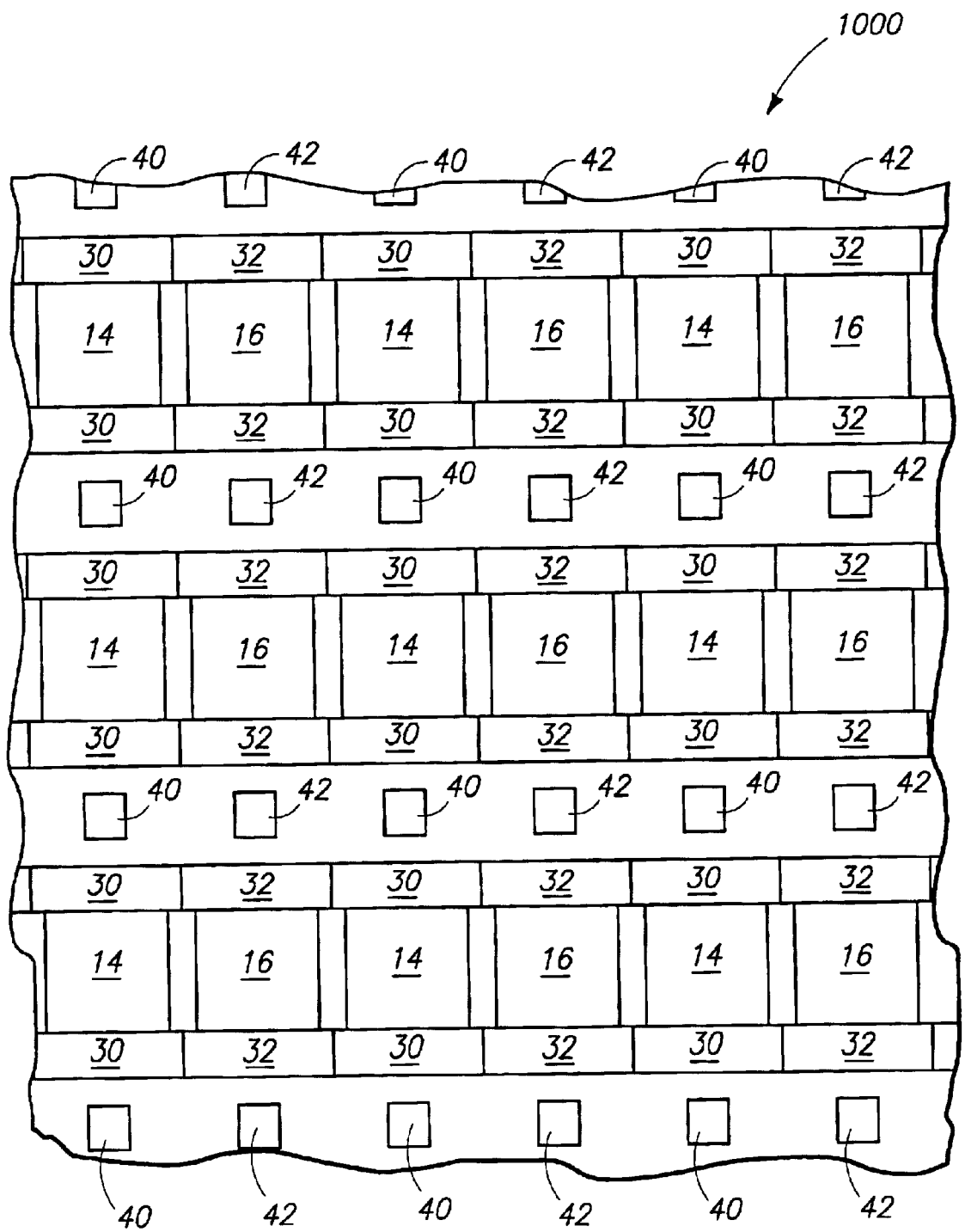
FIG. 61 is a diagrammatic, top view of a fragment of yet another embodiment radiation patterning tool encompassed by the present invention.
Figure 62:
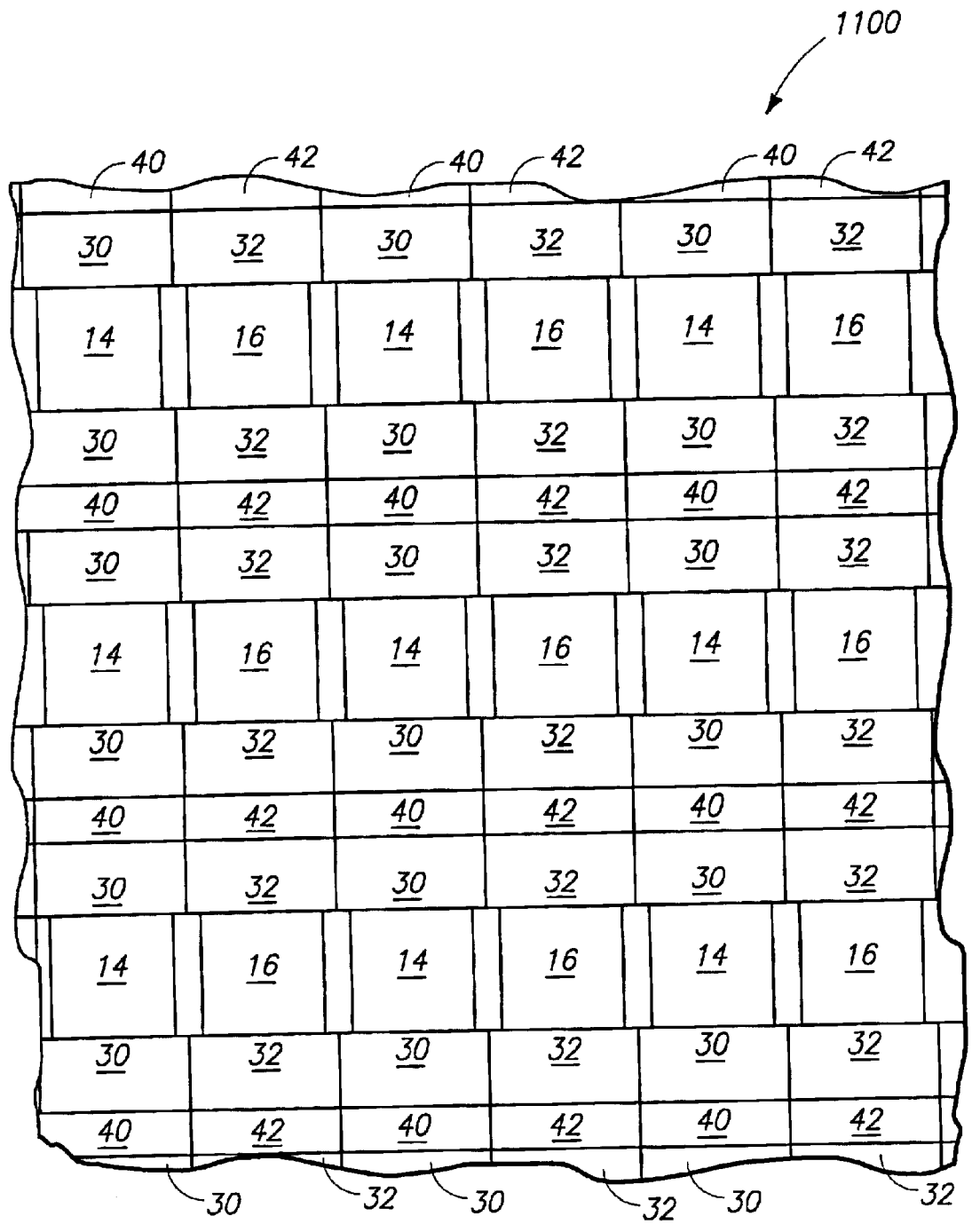
FIG. 62 is a diagrammatic, top view of a fragment of yet another embodiment radiation patterning tool encompassed by the present invention.

Referring to FIG. 58, protective mask 730 (FIG. 57) is removed. The construction of FIG. 58 comprises a first feature pattern at feature pattern location 130, first rims at locations 132, a second feature pattern at location 134, and second rims at locations 136. The dopant within region 740 is preferably provided to a concentration so that light passing through the second feature pattern is rotated in phase by from about 170° to about 190° relative to light passing through the first feature pattern, and more preferably is rotated by about 180°, and yet more preferably is rotated by exactly 180°. Further, the dopant concentration and type within regions 742 is preferably chosen such that light passing through the second rim locations is rotated by from about 170° to about 190° relative to light passing through the second feature location, and more preferably is rotated by about 180°, and yet more preferably is rotated by exactly 180°. Further, the thickness and type of layer 702 is chosen such that light passing through the first rims is rotated by from about 170° to about 190° relative to light passing through the first feature pattern, and more preferably so that light passing through the first rim locations is rotated by about 180°, yet more preferably by exactly 180°, relative to light passing through the first feature pattern. The construction of FIG. 58 can correspond to any of the radiation patterning tool constructions described with reference to FIGS. 1–5, 8 and 59–63.

It should be noted that the dopant utilized for forming regions 740 and 742 preferably provides little or no attenuation of a desired wavelength of light passing through the second feature pattern and second rims, but rather only provides a phase shift to the light. In particular applications, layer 702 already provides desired attenuation, and the ion implanted dopant provides a 180° phase shift without providing additional attenuation.

The fabrication methods described herein can enable self-alignment between regions. More specifically, it can be easier to expose one region, e.g. for 0 degrees, then cover it (with photoresist) and expose the remaining regions, to obtain 180 degrees, at least for the simplest designs. (It is noted that contacts and rims of the same phase as one another can be formed simultaneously.) The described methods which apply different levels of e-beam or laser-beam excitation of photoresist in different regions of a mask can be done with only one multi-dose exposure. Any additional alignment to further process the mask can result in uneven pattern sizes due to miss-alignments, uneven doses and uneven mask etching, thus affecting the aerial image on the wafer surface and therefore giving a distorted layout. In particular aspects, if additional resist exposure is desired, only coarsely aligned exposures occur.

A difficulty of imaging contacts by prior art methods occurs when separation between the contacts is smaller that a desired contact diameter. Specifically, it is difficult to image the contacts without imaging bridges between the contacts. It is typically easier to print isolated contacts with low spatial coherence ("sigma"). Particular applications of the present invention can enable optimization of process latitudes for both isolated and dense contacts.

The fabrication methods described herein can start with a mask blank that already includes the desired layers, such as, for example, quartz (substrate), MoSi-quartz (silica), and chromium. Alternatively, the methods can start with a "standard" mask blank comprising quartz-MoSi-chromium and then, in the middle of a fabrication process, an additional phase shifting layer can be deposited on top. It can be desired to apply additional lithography steps to strip this additional layer in selected areas, but such can create a risk of miss-alignment.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A radiation patterning tool comprising:
    a feature pattern having a periphery and configured to impart a first rotation in phase to a wavelength of light passing through the feature pattern; and
    a rim along a portion of the feature pattern periphery but not along an entirety of the feature pattern periphery; the rim being configured to impart a second rotation in phase to the wavelength of light when the wavelength passes through the rim; the second rotation in phase being from about 170 degrees to about 190 degrees relative to the first rotation in phase.

2. The radiation patterning tool of claim 1 wherein the second rotation in phase is about 180 degrees relative to the first rotation in phase.

3. The radiation patterning tool of claim 1 wherein the feature pattern has a rectangular shape comprising two pairs of opposing sides, and wherein the rim is provided along both opposing sides of one pair of the opposing sides of the rectangular shape and not on either of the opposing sides of the other pair of the opposing sides.

4. The radiation patterning tool of claim 1 wherein the feature pattern has a shape comprising a plurality of sides, and wherein the rim is not along at least one of the sides.

5. The radiation patterning tool of claim 1 comprising a substrate which includes a quartz base, a first phase shifting layer over the quartz base, a second phase shifting layer over the first phase shifting layer and having a different composition than the first phase shifting layer, and an opaque material over the second phase shifting layer; and wherein:
    the feature pattern comprises a pattern etched through the first phase shifting layer, second phase shifting layer, and opaque layer; and
    the rim comprises a pattern etched through the opaque layer and the second phase shifting layer, and to the first phase shifting layer.

6. The radiation patterning tool of claim 5 wherein the first phase shifting layer attenuates the light more than the second phase shifting layer.

7. The radiation patterning tool of claim 5 wherein:
the first phase shifting layer comprises molybdenum and silicon; and
the second phase shifting layer comprises silicon and one or both of oxygen and nitrogen.

8. The radiation patterning tool of claim 7 wherein the opaque layer comprises chromium.

9. The radiation patterning tool of claim 1 comprising a substrate which includes a quartz base, a first phase shifting layer over the quartz base, a second phase shifting layer over the first phase shifting layer and having a different composition than the first phase shifting layer, and an opaque material over the second phase shifting layer; and wherein:
the feature pattern includes a pattern etched through the first phase shifting layer, second phase shifting layer, and opaque layer, and into the base; and
the rim includes a pattern etched through the opaque layer and to the second phase shifting layer.

10. The radiation patterning tool of claim 9 wherein the first phase shifting layer attenuates the light more than the second phase shifting layer.

11. The radiation patterning tool of claim 9 wherein:
the first phase shifting layer comprises molybdenum and silicon; and
the second phase shifting layer comprises silicon and one or both of oxygen and nitrogen.

12. A radiation patterning tool comprising:
an array of feature patterns arranged in rows and columns; the feature patterns being configured rotate a phase of a wavelength of light as the light passes through the feature patterns; the feature patterns including a first type which imparts a first rotation to the phase, and a second type which imparts a second rotation to the phase, the second rotation being from about 170 degrees to about 190 degrees relative to the first rotation; the two types of feature patterns alternating with one another along the rows of the array;
a plurality of first rims configured to impart the first rotation to the phase of the wavelength of light, the first rims being along edges of the second type of feature patterns;
a plurality of second rims configured to impart the second rotation to the phase of the wavelength of light, the second rims being along edges of the first type of feature patterns; and
the first and second rims being along columns of the array.

13. The radiation patterning tool of claim 12 wherein the two types of feature patterns do not alternate with one another along the columns of the array.

14. The radiation patterning tool of claim 12 wherein the two types of feature patterns do not alternate with one another along the columns of the array, wherein adjacent feature patterns along the columns are separated from one another by a distance, and wherein the individual rims extend an entirety of the distance between adjacent feature patterns along the columns of the array.

15. The radiation patterning tool of claim 12 further comprising a plurality of side-lobe-suppressing patterns between adjacent rims along columns of the array.

16. The radiation patterning tool of claim 12 further comprising a plurality of side-lobe-suppressing patterns; individual side-lobe-suppressing patterns being between adjacent rims along columns of the array; the individual side-lobe-suppressing patterns being configured to rotate the wavelength of light by from about 170 degrees to about 190 degrees relative to the rotation imparted to the light by the rims on either side of the individual side-lobe-suppressing patterns.

17. The radiation patterning tool of claim 16 wherein adjacent rims along the columns are separated from one another by a distance, and wherein the individual side-lobe-suppressing patterns extend an entirety of the distance between adjacent rims along the columns of the array.

18. The radiation patterning tool of claim 16 wherein adjacent rims along the columns are separated from one another by a distance, and wherein the individual side-lobe-suppressing patterns do not extend an entirety of the distance between adjacent rims along the columns of the array.

19. The radiation patterning tool of claim 12 wherein the two types of feature patterns alternate with one another along the columns of the array.

20. The radiation patterning tool of claim 12 wherein two first rims are matched with each of the second type of feature patterns; and wherein two of the second rims are matched with each of the first type of feature patterns.

21. The radiation patterning tool of claim 12 wherein the second rims are not along rows of the array.

22. The radiation patterning tool of claim 12 wherein the first and second rims are not along rows of the array.

23. The radiation patterning tool of claim 12 comprising a quartz base, a first phase shifting layer over the quartz base, a second phase shifting layer over the first phase shifting layer and having a different composition than the first phase shifting layer, and an opaque material over the second phase shifting layer; and wherein:
the first type feature patterns are patterns etched through the first phase shifting layer, second phase shifting layer, and opaque layer; and
the second type feature patterns are patterns etched through the first phase shifting layer, second phase shifting layer, and opaque layer, and into the base.

24. The radiation patterning tool of claim 23 wherein:
the first rims are patterns etched through the opaque layer and the second phase shifting layer, and to the first phase shifting layer; and
the second rims are patterns etched through the opaque layer and to the second phase shifting layer.

25. The radiation patterning tool of claim 23 wherein the first phase shifting layer attenuates the light more than the second phase shifting layer.

26. The radiation patterning tool of claim 23 wherein:
the first phase shifting layer comprises molybdenum and silicon; and
the second phase shifting layer comprises silicon and one or both of oxygen and nitrogen.

27. A method of forming a radiation patterning tool, comprising:
providing a substrate;
forming a feature pattern supported by the substrate; the feature pattern having a periphery; the feature patterned being configured to impart a first rotation in phase to a wavelength of light passing through the feature pattern; and
forming a rim supported by the substrate; the rim being along a portion of the feature pattern periphery but not along an entirety of the feature pattern periphery; the rim being configured to impart a second rotation in phase to the wavelength of light when the wavelength passes through the rim; the second rotation in phase being from about 170 degrees to about 190 degrees relative to the first rotation in phase.

28. The method of claim 27 wherein the substrate comprises a material transparent the wavelength of light, wherein a layer opaque to the wavelength of light is provided over the substrate, and wherein the feature pattern and rim are formed by:

forming a layer of photoresist over the opaque material; a first portion of the photoresist being over a defined feature pattern location, and a second portion of the photoresist being over a defined rim location;

removing the first portion of the photoresist to expose a first segment of the layer in the feature pattern location;

removing the exposed first segment of the layer and etching into the substrate to form an opening in the feature pattern location of the substrate;

after forming the opening in the feature pattern location, removing the second portion of the photoresist to expose a second segment of the layer in the rim location; and removing the exposed second segment of the layer from the rim location.

29. The method of claim 28 wherein the substrate consists essentially of quartz, and wherein the layer opaque to the wavelength is formed physically against the quartz of the substrate and comprises chromium.

30. A method of forming a radiation patterning tool, comprising:

providing a substrate;

forming a first feature pattern supported by the substrate; the first feature pattern having a periphery; the first feature patterned being configured to impart a first rotation in phase to a wavelength of light when the wavelength passes through the first feature pattern;

forming a first rim supported by the substrate; the first rim being along a portion of the first feature pattern periphery but not along an entirety of the first feature pattern periphery; the first rim being configured to impart a second rotation in phase to the wavelength of light when the wavelength passes through the first rim; the second rotation in phase being from about 170 degrees to about 190 degrees relative to the first rotation in phase;

forming a second feature pattern supported by the substrate; the second feature pattern having a periphery; the second feature patterned being configured to impart a third rotation in phase to the wavelength of light passing through the second feature pattern; the third rotation in phase being from about 170 degrees to about 190 degrees relative to the first rotation in phase;

forming a second rim supported by the substrate; the second rim being along a portion of the second feature pattern periphery but not along an entirety of the second feature pattern periphery; the second rim being configured to impart a fourth rotation in phase to the wavelength of light when the wavelength passes through the second rim; the fourth rotation in phase being from about 170 degrees to about 190 degrees relative to the third rotation in phase.

31. The method of claim 30 wherein the first and second feature patterns are arranged in rows and columns; wherein the first and second feature patterns alternate with one another along the rows of the array; and wherein the first and second rims are along columns of the array.

32. The method of claim 31 wherein the first and second feature patterns do not alternate with one another along the columns of the array.

33. The method of claim 31 wherein the first and second feature patterns alternate with one another along the columns of the array.

34. The method of claim 30 wherein the substrate comprises a material transparent the wavelength of light, wherein a layer opaque to the wavelength of light is provided over the substrate, and wherein the first and second feature patterns and first and second rims are formed by:

forming a layer of photoresist over the opaque material; a first portion of the photoresist being over a first defined feature pattern location, a second portion of the photoresist being over a first defined rim location; a third portion of the photoresist being over a second defined feature pattern location, and a fourth portion of the photoresist being over a second defined rim location;

removing the first and fourth portions of the photoresist to expose segments of the layer in the first feature pattern location and second rim location;

removing the exposed segments of the layer from the first feature pattern location and second rim location; and etching into the substrate to form openings in the first feature pattern location and second rim location of the substrate;

after forming the openings in the first feature pattern location and second rim location, removing the second and third portions of the photoresist to expose segments of the layer in the first rim location and second feature pattern location; and removing the exposed segments of the layer from the first rim location and second feature pattern location.

35. The method of claim 34 further comprising, prior to removing the exposed segments of the layer from the first rim location and second feature pattern location; implanting a dopant into the first feature pattern location and second rim location.

36. The method of claim 35 wherein the dopant comprises boron, indium, arsenic, antimony or phosphorus.

37. The method of claim 30 wherein the substrate comprises a material transparent the wavelength of light, wherein a layer opaque to the wavelength of light is provided over the substrate, and wherein the first and second feature patterns and first and second rims are formed by:

forming a layer of photoresist over the opaque material; a first portion of the photoresist being over a first defined feature pattern location, a second portion of the photoresist being over a first defined rim location; a third portion of the photoresist being over a second defined feature pattern location, and a fourth portion of the photoresist being over a second defined rim location;

removing the first and third portions of the photoresist to expose segments of the layer in the first and second feature pattern locations;

removing the exposed segments of the layer from the first and second feature pattern locations; and etching into the substrate to form openings in the first and second feature pattern locations of the substrate;

after forming the openings in the first and second feature pattern locations, removing the second and fourth portions of the photoresist to expose segments of the layer in the first and second rim locations; and removing the exposed segments of the layer from the first and second rim locations.

38. The method of claim 37 wherein the substrate consists essentially of quartz, and wherein the layer opaque to the wavelength is formed physically against the quartz of the substrate and comprises chromium.

39. The method of claim 37 wherein the substrate comprises a quartz base, a first phase shifting layer over the quartz base, and a second phase shifting layer over the first phase shifting layer and having a different composition than the first phase shifting layer.

40. The method of claim 39 wherein the first phase shifting layer comprises molybdenum and silicon; and wherein the second phase shifting layer comprises silicon and one or both of oxygen and nitrogen.

41. The method of claim 39 wherein the opaque material is physically against the second phase shifting layer.

42. The method of claim 39 wherein the opening in the first feature pattern location is extended to no deeper than an upper surface of the quartz base, and wherein the opening in the second feature pattern location is extended into the quartz base.

43. The method of claim 39 wherein the openings in the first and second feature pattern locations are extended into the quartz base; and further comprising:

forming a protective mask over the first feature pattern location and first rim location;

while the protective mask is over the first feature pattern location and first rim location, extending the opening in the second feature pattern location and etching into the second phase shifting layer of the substrate to form an opening in the second rim location; and removing the protective mask from over the first feature pattern location and first rim location.

44. The method of claim 37 wherein the substrate comprises a quartz base, an attenuating layer over the quartz base, and a phase shifting layer over the attenuating layer and having a different composition than the attenuating layer.

45. The method of claim 44 wherein the attenuating layer comprises one or more of Cr, Mo and Al; and wherein the phase shifting layer comprises silicon and one or both of oxygen and nitrogen.

46. The method of claim 44 wherein the openings in the first and second feature pattern locations are extended to an upper surface of the quartz base; and further comprising:

forming a protective mask over the first feature pattern location and first rim location;

while the protective mask is over the first feature pattern location and first rim location, extending the opening in the second feature pattern location into the substrate, and forming an opening in the second rim location which extends to an upper surface of the attenuating layer; and removing the protective mask from over the first feature pattern location and first rim location.

47. The method of claim 37 further comprising, after removing the exposed segments of the layer from the first and second rim locations:

forming a protective mask over the first feature pattern location and first rim location;

while the protective mask is over the first feature pattern location and first rim location, extending the opening in the second feature pattern location and etching into the substrate to form an opening in the second rim location; and removing the protective mask from over the first feature pattern location and first rim location.

48. The method of claim 47 wherein the protective mask comprises photoresist.

49. The method of claim 37 further comprising, after removing the exposed segments of the layer from the first and second rim locations:

forming a protective mask over the first feature pattern location and first rim location;

while the protective mask is over the first feature pattern location and first rim location, implanting a dopant into the second rim location and second feature pattern location; and removing the protective mask from over the first feature pattern location and first rim location.

50. The method of claim 49 wherein the dopant comprises phosphorus, indium, arsenic, antimony or boron.

51. The method of claim 49 wherein the substrate comprises a quartz mass having a phase shifting layer thereover, wherein the opening formed in the second feature pattern location extends through the phase shifting layer and to the quartz mass; and wherein the dopant is implanted into the quartz mass of the second feature pattern location and into the phase shifting layer of the second rim location.

52. The method of claim 51 wherein the phase shifting layer comprises molybdenum and silicon.

53. A method of forming a radiation patterning tool, comprising:

providing a substrate; the substrate comprising a mass transparent to a wavelength of light, and comprising a layer opaque to the wavelength of light over the mass;

forming a layer of photoresist over the opaque material; a first portion of the photoresist being over a first defined feature pattern location, a second portion of the photoresist being over a first defined rim location; a third portion of the photoresist being over a second defined feature pattern location, and a fourth portion of the photoresist being over a second defined rim location;

removing the first and fourth portions of the photoresist to expose segments of the layer in the first feature pattern location and second rim location;

removing the exposed segments of the layer from the first feature pattern location and second rim location;

after removing the exposed segments of the layer, implanting dopant into the substrate in the first feature pattern location and second rim location;

after implanting the dopant, removing the second and third portions of the photoresist to expose segments of the layer in the first rim location and second feature pattern location;

removing the exposed segments of the layer from the first rim location and second feature pattern location; and wherein:

the doped region of the first feature pattern location is comprised by a first feature pattern configured to impart a first rotation in phase to the wavelength of light when the wavelength passes through the first feature pattern;

the first rim location comprises a first rim along a portion of the first feature pattern and configured to impart a second rotation in phase to the wavelength of light when the wavelength passes through the first rim; the second rotation in phase being from about 170 degrees to about 190 degrees relative to the first rotation in phase;

the second feature pattern location comprises a second feature pattern configured to impart a third rotation in phase to the wavelength of light passing through the second feature pattern; the third rotation in phase being from about 170 degrees to about 190 degrees relative to the first rotation in phase; and the doped region of the second rim location is comprised by a second rim along a portion of the second feature pattern and configured to impart a fourth rotation in phase to the wavelength of light when the wavelength passes through the second rim; the fourth rotation in phase being from about 170 degrees to about 190 degrees relative to the third rotation in phase.

54. The method of claim 53 wherein the substrate consists essentially of quartz, and wherein the layer opaque to the wavelength is formed physically against the quartz of the substrate and comprises chromium.

55. The method of claim 53 wherein the dopant comprises boron, indium, arsenic, antimony or phosphorus.

56. A method of forming a radiation patterning tool, comprising:

providing a substrate; the substrate comprising a mass transparent to a wavelength of light, and comprising a layer opaque to the wavelength of light over the mass;

forming a layer of photoresist over the opaque material; a first portion of the photoresist being over a first defined feature pattern location, a second portion of the photoresist being over a first defined rim location; a third portion of the photoresist being over a second defined feature pattern location, and a fourth portion of the photoresist being over a second defined rim location;

removing the first and third portions of the photoresist to expose segments of the layer in the first and second feature pattern locations;

removing the exposed segments of the layer from the first and second feature pattern locations;

after removing the exposed segments of the layer from the first and second feature pattern locations, removing the second and fourth portions of the photoresist to expose segments of the layer from the first and second rim locations, removing the exposed segments of the layer from the first and second rim locations;

after removing the exposed segments of the layer from the first and second rim locations; forming a photoresist mass over the first feature pattern location and first rim location;

after forming the photoresist mass, implanting dopant into the substrate in the second feature pattern location and second rim location;

after implanting the dopant, removing the photoresist mass; and wherein:
the first feature pattern location comprises a first feature pattern configured to impart a first rotation in phase to the wavelength of light when the wavelength passes through the first feature pattern;

the first rim location comprises a first rim along a portion of the first feature pattern and configured to impart a second rotation in phase to the wavelength of light when the wavelength passes through the first rim; the second rotation in phase being from about 170 degrees to about 190 degrees relative to the first rotation in phase;

the doped second feature pattern location is comprised by a second feature pattern configured to impart a third rotation in phase to the wavelength of light passing through the second feature pattern; the third rotation in phase being from about 170 degrees to about 190 degrees relative to the first rotation in phase; and the doped second rim location is comprised by a second rim along a portion of the second feature pattern and configured to impart a fourth rotation in phase to the wavelength of light when the wavelength passes through the second rim; the fourth rotation in phase being from about 170 degrees to about 190 degrees relative to the third rotation in phase.

57. The method of claim 53 wherein the substrate comprises a quartz mass having a phase shifting layer thereover, wherein the phase shifting layer comprises molybdenum and silicon, and wherein the layer opaque to the wavelength comprises chromium.

58. The method of claim 57 wherein the doped region of the second feature pattern location is within the quartz substrate, and wherein the doped region of the second rim location is within the phase shifting layer.

59. The method of claim 53 wherein the dopant comprises boron, indium, arsenic, antimony or phosphorus.

60. A method of forming a radiation patterning tool, comprising:

providing a substrate which includes a quartz base, a first phase shifting layer over the quartz base, a second phase shifting layer over the first phase shifting layer and having a different composition than the first phase shifting layer, and an opaque material over the second phase shifting layer;

etching a first pattern through the first phase shifting layer, second phase shifting layer, and opaque layer; the first pattern being a feature pattern; the feature pattern having a periphery and being configured to impart a first rotation in phase to wavelength of light passing through the feature pattern;

etching a second pattern through the opaque layer and the second phase shifting layer, and to the first phase shifting layer; the second pattern being a rim; the rim being along a portion of the feature pattern periphery but not along an entirety of the feature pattern periphery; the rim being configured to impart a second rotation in phase to the wavelength of light when the wavelength passes through the rim; the second rotation in phase being from about 170 degrees to about 190 degrees relative to the first rotation in phase.

61. The method of claim 60 wherein the etching to form the rim occurs simultaneously with the etching to form the feature pattern.

62. The method of claim 60 wherein the formation of the rim and feature pattern comprises:

forming a layer of photoresist over the opaque material; a first portion of the photoresist being over a defined feature pattern location, and a second portion of the photoresist being over a defined rim location;

reducing a thickness of the photoresist over the first portion relative to the second portion to form a stepped photoresist mask having a greater thickness over the rim location than over the feature pattern location;

subjecting the photoresist to an etch to remove the photoresist from over the feature pattern location while leaving the photoresist over the rim location, the removal of the photoresist from over the feature pattern location exposing a segment of the opaque layer;

etching into the feature pattern location to remove the exposed segment of the opaque layer and form a first opening extending into the feature pattern location;

extending the first opening through the second phase shifting layer;

after extending the first opening, removing the photoresist from over the rim location;

removing the opaque layer from over the rim pattern to form a second opening extending into the rim location; and extending the first and second openings to form the feature pattern to extend through to the quartz substrate and form the rim to extend to the first phase shifting layer.

63. The method of claim 62 wherein the formation of the stepped photoresist mask comprises;

exposing the first and second portions of the photoresist to radiation, the first portion of the photoresist being exposed to a different dose of the radiation than the second portion of the photoresist;

subjecting the photoresist to a developing solution, the developing solution removing more of the photoresist from the first portion than from the second portion to form the stepped photoresist mask.

64. The method of claim 60 wherein the first phase shifting layer attenuates the light more than the second phase shifting layer.

65. The method of claim 60 wherein:

the first phase shifting layer comprises molybdenum and silicon; and the second phase shifting layer comprises silicon and one or both of oxygen and nitrogen.

66. The method of claim 60 wherein the opaque layer comprises chromium.

67. The method of claim 60 wherein the second rotation in phase is about 180 degrees relative to the first rotation in phase.

68. The method of claim 60 wherein the feature pattern has a rectangular shape comprising two pairs of opposing sides, and wherein two of the rims are formed relative to the feature pattern, the two rims being provided along both opposing sides of one pair of the opposing sides of the rectangular shape.

69. The method of claim 60 wherein the feature pattern has a shape comprising a plurality of sides, and wherein there is no rim formed along at least one of the sides.

70. A method of forming a radiation patterning tool, comprising:

providing a substrate which includes a quartz base, a first phase shifting layer over the quartz base, a second phase shifting layer over the first phase shifting layer and having a different composition than the first phase shifting layer, and an opaque material over the second phase shifting layer;

etching a first pattern through the first phase shifting layer, second phase shifting layer, and opaque layer, and into the substrate; the first pattern being a feature pattern; the feature pattern having a periphery and being configured to impart a first rotation in phase to a wavelength of light passing through the feature pattern;

etching a second pattern through the opaque layer; the second pattern being a rim; the rim being along a portion of the feature pattern periphery but not along an entirety of the feature pattern periphery; the rim being configured to impart a second rotation in phase to the wavelength of light when the wavelength passes through the rim; the second rotation in phase being from about 170 degrees to about 190 degrees relative to the first rotation in phase.

71. The method of claim 70 wherein the formation of the rim and feature pattern comprises:

forming a layer of photoresist over the opaque material; a first portion of the photoresist being over a defined feature pattern location, and a second portion of the photoresist being over a defined rim location;

reducing a thickness of the photoresist over the first portion relative to the second portion to form a stepped photoresist mask having a greater thickness over the rim location than over the feature pattern location;

subjecting the photoresist to an etch to remove the photoresist from over the feature pattern location while leaving the photoresist over the rim location, the removal of the photoresist from over the feature pattern location exposing a segment of the opaque layer;

etching into the feature pattern location to remove the exposed segment of the opaque layer and form a first opening extending into the feature pattern location;

extending the first opening through the first and second phase shifting layers and into the substrate;

after extending the first opening, removing the photoresist from over the rim location; and removing the opaque layer from over the rim pattern to form the rim extending through the opaque layer and to the second phase shifting layer.

72. The method of claim 71 wherein the formation of the stepped photoresist mask comprises;

exposing the first and second portions of the photoresist to radiation, the first portion of the photoresist being exposed to a different dose of the radiation than the second portion of the photoresist;

subjecting the photoresist to a developing solution, the developing solution removing more of the photoresist from the first portion than from the second portion to form the stepped photoresist mask.

73. The method of claim 70 wherein the first phase shifting layer attenuates the light more than the second phase shifting layer.

74. The method of claim 70 wherein:

the first phase shifting layer comprises molybdenum and silicon; and the second phase shifting layer comprises silicon and one or both of oxygen and nitrogen.

75. The method of claim 70 wherein the opaque layer comprises chromium.

76. The method of claim 70 wherein the second rotation in phase is about 180 degrees relative to the first rotation in phase.

77. The method of claim 70 wherein the feature pattern has a rectangular shape comprising two pairs of opposing sides, and wherein two of the rims are formed relative to the feature pattern; the two rims being provided along both opposing sides of one pair of the opposing sides of the rectangular shape.

78. The method of claim 70 wherein the feature pattern has a shape comprising a plurality of sides, and wherein there is no rim formed along at least one of the sides.

79. A method of forming a radiation patterning tool, comprising:

providing a substrate which includes a quartz base, a first phase shifting layer over the quartz base, a second phase shifting layer over the first phase shifting layer and having a different composition than the first phase shifting layer, and an opaque material over the second phase shifting layer;

etching a first pattern through the first phase shifting layer, second phase shifting layer, and opaque layer, and into the substrate; the first pattern being a first feature pattern; the first feature pattern having a periphery and being configured to impart a first rotation in phase to a wavelength of light passing through the feature pattern;

etching a second pattern through the first phase shifting layer, second phase shifting layer, and opaque layer; the second pattern being a second feature pattern; the second feature pattern having a periphery and being configured to impart a second rotation in phase to a wavelength of light passing through the feature pattern; the second rotation in phase being from about 170 degrees to about 190 degrees relative to the first rotation in phase;

etching a third pattern through the opaque layer; the third pattern being a first rim; the first rim being along a portion of the first feature pattern periphery but not along an entirety of the first feature pattern periphery; the first rim being configured to impart a third rotation in phase to the wavelength of light when the wavelength passes through the first rim; the third rotation in phase being from about 170 degrees to about 190 degrees relative to the first rotation in phase; and etching a fourth pattern through the opaque layer and the second phase shifting layer, and to the first phase shifting layer; the fourth pattern being a second rim; the second rim being along a portion of the second feature pattern periphery but not along an entirety of the second feature pattern periphery; the second rim being configured to impart a fourth rotation in phase to the wavelength of light when the wavelength passes through the second rim; the fourth rotation in phase being from about 170 degrees to about 190 degrees relative to the second rotation in phase.

80. The method of claim 79 wherein the formation of the first rim and first feature pattern comprises:

forming a layer of photoresist over the opaque material; a first portion of the photoresist being over a defined first feature pattern location, and a second portion of the photoresist being over a defined first rim location;

reducing a thickness of the photoresist over the first portion relative to the second portion to form a stepped photoresist mask having a greater thickness over the first rim location than over the first feature pattern location;

subjecting the photoresist to an etch to remove the photoresist from over the first feature pattern location while leaving the photoresist over the first rim location, the removal of the photoresist from over the first feature pattern location exposing a segment of the opaque layer;

etching into the first feature pattern location to remove the exposed segment of the opaque layer and form a first opening extending into the first feature pattern location;

extending the first opening through the first and second phase shifting layers and into the substrate;

after extending the first opening, removing the photoresist from over the first rim location; and removing the opaque layer from over the first rim pattern to form the first rim extending through the opaque layer and to the second phase shifting layer.

81. The method of claim 80 wherein the formation of the stepped photoresist mask comprises;

exposing the first and second portions of the photoresist to radiation, the first portion of the photoresist being exposed to a different dose of the radiation than the second portion of the photoresist;

subjecting the photoresist to a developing solution, the developing solution removing more of the photoresist from the first portion than from the second portion to form the stepped photoresist mask.

82. The method of claim 79 wherein the formation of the second rim and second feature pattern comprises:

forming a layer of photoresist over the opaque material; a first portion of the photoresist being over a defined second feature pattern location, and a second portion of the photoresist being over a defined second rim location;

reducing a thickness of the photoresist over the first portion relative to the second portion to form a stepped photoresist mask having a greater thickness over the second rim location than over the second feature pattern location;

subjecting the photoresist to an etch to remove the photoresist from over the second feature pattern location while leaving the photoresist over the second rim location, the removal of the photoresist from over the second feature pattern location exposing a segment of the opaque layer;

etching into the second feature pattern location to remove the exposed segment of the opaque layer and form a first opening extending into the second feature pattern location;

extending the first opening through the second phase shifting layer;

after extending the first opening, removing the photoresist from over the second rim location;

removing the opaque layer from over the second rim pattern to form a second opening extending into the second rim location; and extending the first and second openings to form the second feature pattern to extend through to the quartz substrate and form the second rim to extend to the first phase shifting layer.

83. The method of claim 82 wherein the formation of the stepped photoresist mask comprises;

exposing the first and second portions of the photoresist to radiation, the first portion of the photoresist being exposed to a different dose of the radiation than the second portion of the photoresist;

subjecting the photoresist to a developing solution, the developing solution removing more of the photoresist from the first portion than from the second portion to form the stepped photoresist mask.

84. The method of claim 79 wherein the formation of the first feature pattern and second feature pattern comprises:

forming a patterned layer of photoresist over the opaque material; a portion of the photoresist being over a defined second feature pattern location, and a defined first feature location being exposed through an opening in the patterned photoresist;

while the patterned photoresist covers the second feature pattern location, etching into the first feature pattern location to remove a segment of the opaque layer and form a first opening extending into the first feature pattern location;

extending the first opening through the second phase shifting layer;

after extending the first opening, removing the photoresist from over the second feature pattern location;

removing the opaque layer from over the second feature pattern location to form a second opening extending into the second feature location; and extending the first opening through the second phase shifting layer and into the substrate while extending the second opening through the first and second phase shifting layers and to the substrate.

85. The method of claim 79 wherein the first phase shifting layer attenuates the light more than the second phase shifting layer.

86. The method of claim 79 wherein:

the first phase shifting layer comprises molybdenum and silicon; and the second phase shifting layer comprises silicon and one or both of oxygen and nitrogen.

87. The method of claim 79 wherein the opaque layer comprises chromium.

88. The method of claim 79 wherein the first and second feature patterns are arranged in rows and columns; wherein the first and second feature patterns alternate with one another along the rows of the array; and wherein the first and second rims are along columns of the array.

89. The method of claim 88 wherein the first and second feature patterns do not alternate with one another along the columns of the array.

90. The method of claim 88 wherein the first and second feature patterns alternate with one another along the columns of the array.

91. The method of claim 88 wherein the first and second feature patterns do not alternate with one another along the columns of the array, wherein adjacent feature patterns along the columns are separated from one another by a distance, and wherein the rims extend an entirety of the distance between adjacent feature patterns along the columns of the array.

92. The method of claim 88 further comprising forming a plurality of side-lobe-suppressing patterns between adjacent rims along columns of the array.

93. The method of claim 88 further comprising forming a plurality of side-lobe-suppressing patterns between adjacent rims along columns of the array; individual side-lobe-suppressing patterns being between adjacent rims along columns of the array; the individual side-lobe-suppressing patterns being configured to rotate the wavelength of light by from about 170 degrees to about 190 degrees relative to the rotation imparted to the light by the rims on either side of the individual side-lobe-suppressing patterns.

94. The method of claim 93 wherein adjacent rims along the columns of the array are separated from one another by a distance, and wherein the individual side-lobe-suppressing patterns are formed to extend an entirety of the distance between adjacent rims along the columns of the array.

95. The method of claim 93 wherein adjacent rims along the columns of the array are separated from one another by a distance, and wherein the individual side-lobe-suppressing patterns are formed to not extend an entirety of the distance between adjacent rims along the columns of the array.

96. The method of claim 88 wherein the first and second rims are not formed along rows of the array.

* * * * *

UNITED STATES PATENT AND TRADEMARK OFFICE
CERTIFICATE OF CORRECTION

PATENT NO. : 6,841,310 B2
DATED : January 11, 2005
INVENTOR(S) : Dulman

It is certified that error appears in the above-identified patent and that said Letters Patent is hereby corrected as shown below:

Title page,
Item [56], References Cited, U.S. PATENT DOCUMENTS, please insert the following:
-- 5,629,113    5/1997        Watanabe
   6,007,324    12/1999       Tzu et al.
   5,384,219    1/1995        Dao et al.
   5,300,379    4/1994        Dao et al.
   5,897,975    4/1999        Ahn et al. --.
Please insert the following:
-- FOREIGN PATENT DOCUMENTS
US/03/02288           1/2003       PCT Search Report
0 395 425 A2/A3       4/1990       EPO
0 583 942 A2          8/1993       EPO --.
OTHER PUBLICATIONS, please insert the following:
-- Cui, Z. et al., "Partial Rim: A New Design of Rim Phase Shift Mask for Submicron Contact Holes", SPIE Vol. 2440, Feb. 1995, pp. 541-549. --.

Column 2,
Line 57, replace "with" with -- which --.

Column 3,
Line 29, insert -- is -- after "Fig. 6".

Column 4,
Line 48, insert -- subsequent -- after "step".

Column 7,
Line 50, replace "that were" with -- there would --.

Column 9,
Line 54, replace "number" with -- numbers --.

Column 16,
Line 7, insert -- rotation -- after "the".

Column 22,
Line 6, replace "that" with -- than --.

UNITED STATES PATENT AND TRADEMARK OFFICE
CERTIFICATE OF CORRECTION

| | |
|---|---|
| PATENT NO. | : 6,841,310 B2 |
| DATED | : January 11, 2005 |
| INVENTOR(S) | : Dulman |

It is certified that error appears in the above-identified patent and that said Letters Patent is hereby corrected as shown below:

<u>Column 22, line 33 - Column 36, line 29,</u>
Replace the text with the following:

--1. A radiation patterning tool comprising:
a substrate which includes a quartz base, a first phase shifting layer over the quartz base, a second phase shifting layer over the first phase shifting layer and having a different composition than the first phase shifting layer, and an opaque material over the second phase shifting layer;
a feature pattern having a periphery and configured to impart a first rotation in phase to a wavelength of light passing through the feature pattern; the feature pattern comprising a pattern etched through the first phase shifting layer, second phase shifting layer, and opaque layer; and
a rim along a portion of the feature pattern periphery but not along an entirety of the feature pattern periphery; the rim being configured to impart a second rotation in phase to the wavelength of light when the wavelength passes through the rim; the second rotation in phase being from about 170 degrees to about 190 degrees relative to the first rotation in phase; the rim comprising a pattern etched through the opaque layer and the second phase shifting layer, and to the first phase shifting layer.

2. The radiation patterning tool of claim 1 wherein the first phase shifting layer attenuates the light more than the second phase shifting layer.

3. The radiation patterning tool of claim 1 wherein:
the first phase shifting layer comprises molybdenum and silicon; and
the second phase shifting layer comprises silicon and one or both of oxygen and nitrogen.

4. The radiation patterning tool of claim 3 wherein the opaque layer comprises chromium.

5. A radiation patterning tool comprising:
an array of feature patterns arranged in rows and columns; the feature patterns being configured rotate a phase of a wavelength of light as the light passes through the feature patterns; the feature patterns including a first type which imparts a first rotation to the phase, and a second type which imparts a second rotation to the phase, the second rotation being from about 170 degrees to about 190 degrees relative to the first rotation; the two types of feature patterns alternating with one another along the rows of the array;
a plurality of first rims configured to impart the first rotation to the phase of the wavelength of light, the first rims being along edges of the second type of feature patterns;
a plurality of second rims configured to impart the second rotation to the phase of the wavelength of light, the second rims being along edges of the first type of feature patterns; and
the first and second rims being along columns of the array.

6. The radiation patterning tool of claim 5 wherein the two types of feature patterns do not alternate with one another along the columns of the array.

UNITED STATES PATENT AND TRADEMARK OFFICE
CERTIFICATE OF CORRECTION

PATENT NO. : 6,841,310 B2
DATED : January 11, 2005
INVENTOR(S) : Dulman

It is certified that error appears in the above-identified patent and that said Letters Patent is hereby corrected as shown below:

Column 22, line 33 - Column 36, line 29 (cont'd),

7. The radiation patterning tool of claim 5 wherein the two types of feature patterns do not alternate with one another along the columns of the array, wherein adjacent feature patterns along the columns are separated from one another by a distance, and wherein the individual rims extend an entirety of the distance between adjacent feature patterns along the columns of the array.

8. The radiation patterning tool of claim 5 further comprising a plurality of side-lobe-suppressing patterns between adjacent rims along columns of the array.

9. The radiation patterning tool of claim 5 further comprising a plurality of side-lobe-suppressing patterns; individual side-lobe-suppressing patterns being between adjacent rims along columns of the array; the individual side-lobe-suppressing patterns being configured to rotate the wavelength of light by from about 170 degrees to about 190 degrees relative to the rotation imparted to the light by the rims on either side of the individual side-lobe-suppressing patterns.

10. The radiation patterning tool of claim 9 wherein adjacent rims along the columns are separated from one another by a distance, and wherein the individual side-lobe-suppressing patterns extend an entirety of the distance between adjacent rims along the columns of the array.

11. The radiation patterning tool of claim 9 wherein adjacent rims along the columns are separated from one another by a distance, and wherein the individual side-lobe-suppressing patterns do not extend an entirety of the distance between adjacent rims along the columns of the array.

12. The radiation patterning tool of claim 5 wherein the two types of feature patterns alternate with one another along the columns of the array.

13. The radiation patterning tool of claim 5 wherein two first rims are matched with each of the second type of feature patterns; and wherein two of the second rims are matched with each of the first type of feature patterns.

14. The radiation patterning tool of claim 5 wherein the second rims are not along rows of the array.

15. The radiation patterning tool of claim 5 wherein the first and second rims are not along rows of the array.

16. The radiation patterning tool of claim 5 comprising a quartz base, a first phase shifting layer over the quartz base, a second phase shifting layer over the first phase shifting layer and having a different composition than the first phase shifting layer, and an opaque material over the second phase shifting layer; and wherein:
the first type feature patterns are patterns etched through the first phase shifting layer, second phase shifting layer, and opaque layer; and
the second type feature patterns are patterns etched through the first phase shifting layer, second phase shifting layer, and opaque layer, and into the base.

UNITED STATES PATENT AND TRADEMARK OFFICE
CERTIFICATE OF CORRECTION

| | | |
|---|---|---|
| PATENT NO. | : 6,841,310 B2 | Page 4 of 13 |
| DATED | : January 11, 2005 | |
| INVENTOR(S) | : Dulman | |

It is certified that error appears in the above-identified patent and that said Letters Patent is hereby corrected as shown below:

<u>Column 22, line 33 - Column 36, line 29 (cont'd),</u>

17. The radiation patterning tool of claim 16 wherein:
the first rims are patterns etched through the opaque layer and the second phase shifting layer, and to the first phase shifting layer; and
the second rims are patterns etched through the opaque layer and to the second phase shifting layer.

18. The radiation patterning tool of claim 16 wherein the first phase shifting layer attenuates the light more than the second phase shifting layer.

19. The radiation patterning tool of claim 16 wherein:
the first phase shifting layer comprises molybdenum and silicon; and
the second phase shifting layer comprises silicon and one or both of oxygen and nitrogen.

20. A method of forming a radiation patterning tool, comprising:
providing a substrate;
forming a first feature pattern supported by the substrate; the first feature pattern having a periphery; the first feature patterned being configured to impart a first rotation in phase to a wavelength of light when the wavelength passes through the first feature pattern;
forming a first rim supported by the substrate; the first rim being along a portion of the first feature pattern periphery but not along an entirety of the first feature pattern periphery; the first rim being configured to impart a second rotation in phase to the wavelength of light when the wavelength passes through the first rim; the second rotation in phase being from about 170 degrees to about 190 degrees relative to the first rotation in phase;
forming a second feature pattern supported by the substrate; the second feature pattern having a periphery; the second feature patterned being configured to impart a third rotation in phase to the wavelength of light passing through the second feature pattern; the third rotation in phase being from about 170 degrees to about 190 degrees relative to the first rotation in phase; and
forming a second rim supported by the substrate; the second rim being along a portion of the second feature pattern periphery but not along an entirety of the second feature pattern periphery; the second rim being configured to impart a fourth rotation in phase to the wavelength of light when the wavelength passes through the second rim; the fourth rotation in phase being from about 170 degrees to about 190 degrees relative to the third rotation in phase.

21. The method of claim 20 wherein the first and second feature patterns are arranged in rows and columns; wherein the first and second feature patterns alternate with one another along the rows of the array; and wherein the first and second rims are along columns of the array.

22. The method of claim 21 wherein the first and second feature patterns do not alternate with one another along the columns of the array.

23. The method of claim 21 wherein the first and second feature patterns alternate with one another along the columns of the array.

UNITED STATES PATENT AND TRADEMARK OFFICE
CERTIFICATE OF CORRECTION

PATENT NO. : 6,841,310 B2  
DATED : January 11, 2005  
INVENTOR(S) : Dulman

It is certified that error appears in the above-identified patent and that said Letters Patent is hereby corrected as shown below:

Column 22, line 33 - Column 36, line 29 (cont'd),

24. The method of claim 20 wherein the substrate comprises a material transparent to the wavelength of light, wherein a layer opaque to the wavelength of light is provided over the substrate, and wherein the first and second feature patterns and first and second rims are formed by:
forming a layer of photoresist over the opaque material; a first portion of the photoresist being over a first defined feature pattern location, a second portion of the photoresist being over a first defined rim location; a third portion of the photoresist being over a second defined feature pattern location, and a fourth portion of the photoresist being over a second defined rim location;
removing the first and fourth portions of the photoresist to expose segments of the layer in the first feature pattern location and second rim location;
removing the exposed segments of the layer from the first feature pattern location and second rim location; and etching into the substrate to form openings in the first feature pattern location and second rim location of the substrate;
after forming the openings in the first feature pattern location and second rim location, removing the second and third portions of the photoresist to expose segments of the layer in the first rim location and second feature pattern location; and
removing the exposed segments of the layer from the first rim location and second feature pattern location.

25. The method of claim 24 further comprising, prior to removing the exposed segments of the layer from the first rim location and second feature pattern location; implanting a dopant into the first feature pattern location and second rim location.

26. The method of claim 25 wherein the dopant comprises boron, indium, arsenic, antimony or phosphorus.

27. The method of claim 20 wherein the substrate comprises a material transparent to the wavelength of light, wherein a layer opaque to the wavelength of light is provided over the substrate, and wherein the first and second feature patterns and first and second rims are formed by:
forming a layer of photoresist over the opaque material; a first portion of the photoresist being over a first defined feature pattern location, a second portion of the photoresist being over a first defined rim location; a third portion of the photoresist being over a second defined feature pattern location, and a fourth portion of the photoresist being over a second defined rim location;
removing the first and third portions of the photoresist to expose segments of the layer in the first and second feature pattern locations;
removing the exposed segments of the layer from the first and second feature pattern locations; and etching into the substrate to form openings in the first and second feature pattern locations of the substrate;
after forming the openings in the first and second feature pattern locations, removing the second and fourth portions of the photoresist to expose segments of the layer in the first and second rim locations; and
removing the exposed segments of the layer from the first and second rim locations.

UNITED STATES PATENT AND TRADEMARK OFFICE
CERTIFICATE OF CORRECTION

PATENT NO.   : 6,841,310 B2
DATED        : January 11, 2005
INVENTOR(S)  : Dulman It is certified that error appears in the above-identified patent and that said Letters Patent is hereby corrected as shown below:

Column 22, line 33 - Column 36, line 29 (cont'd),

28. The method of claim 27 wherein the substrate consists essentially of quartz, and wherein the layer opaque to the wavelength is formed physically against the quartz of the substrate and comprises chromium.

29. The method of claim 27 wherein the substrate comprises a quartz base, a first phase shifting layer over the quartz base, and a second phase shifting layer over the first phase shifting layer and having a different composition than the first phase shifting layer.

30. The method of claim 29 wherein the first phase shifting layer comprises molybdenum and silicon; and wherein the second phase shifting layer comprises silicon and one or both of oxygen and nitrogen.

31. The method of claim 29 wherein the opaque material is physically against the second phase shifting layer.

32. The method of claim 29 wherein the opening in the first feature pattern location is extended to no deeper than an upper surface of the quartz base, and wherein the opening in the second feature pattern location is extended into the quartz base.

33. The method of claim 29 wherein the openings in the first and second feature pattern locations are extended into the quartz base; and further comprising:
forming a protective mask over the first feature pattern location and first rim location;
while the protective mask is over the first feature pattern location and first rim location, extending the opening in the second feature pattern location and etching into the second phase shifting layer of the substrate to form an opening in the second rim location; and
removing the protective mask from over the first feature pattern location and first rim location.

34. The method of claim 27 wherein the substrate comprises a quartz base, an attenuating layer over the quartz base, and a phase shifting layer over the attenuating layer and having a different composition than the attenuating layer.

35. The method of claim 34 wherein the attenuating layer comprises one or more of Cr, Mo and Al; and wherein the phase shifting layer comprises silicon and one or both of oxygen and nitrogen.

36. The method of claim 34 wherein the openings in the first and second feature pattern locations are extended to an upper surface of the quartz base; and further comprising:
forming a protective mask over the first feature pattern location and first rim location;
while the protective mask is over the first feature pattern location and first rim location, extending the opening in the second feature pattern location into the substrate, and forming an opening in the second rim location which extends to an upper surface of the attenuating layer; and
removing the protective mask from over the first feature pattern location and first rim location.

UNITED STATES PATENT AND TRADEMARK OFFICE
CERTIFICATE OF CORRECTION

PATENT NO. : 6,841,310 B2
DATED : January 11, 2005
INVENTOR(S) : Dulman

It is certified that error appears in the above-identified patent and that said Letters Patent is hereby corrected as shown below:

Column 22, line 33 - Column 36, line 29 (cont'd),

37. The method of claim 27 further comprising, after removing the exposed segments of the layer from the first and second rim locations:
forming a protective mask over the first feature pattern location and first rim location;
while the protective mask is over the first feature pattern location and first rim location, extending the opening in the second feature pattern location and etching into the substrate to form an opening in the second rim location; and
removing the protective mask from over the first feature pattern location and first rim location.

38. The method of claim 37 wherein the protective mask comprises photoresist.

39. The method of claim 27 further comprising, after removing the exposed segments of the layer from the first and second rim locations:
forming a protective mask over the first feature pattern location and first rim location;
while the protective mask is over the first feature pattern location and first rim location, implanting a dopant into the second rim location and second feature pattern location; and
removing the protective mask from over the first feature pattern location and first rim location.

40. The method of claim 39 wherein the dopant comprises phosphorus, indium, arsenic, antimony or boron.

41. The method of claim 39 wherein the substrate comprises a quartz mass having a phase shifting layer thereover, wherein the opening formed in the second feature pattern location extends through the phase shifting layer and to the quartz mass; and wherein the dopant is implanted into the quartz mass of the second feature pattern location and into the phase shifting layer of the second rim location.

42. The method of claim 41 wherein the phase shifting layer comprises molybdenum and silicon.

43. A method of forming a radiation patterning tool, comprising:
providing a substrate; the substrate comprising a mass transparent to a wavelength of light, and comprising a layer opaque to the wavelength of light over the mass;
forming a layer of photoresist over the opaque material; a first portion of the photoresist being over a first defined feature pattern location, a second portion of the photoresist being over a first defined rim location; a third portion of the photoresist being over a second defined feature pattern location, and a fourth portion of the photoresist being over a second defined rim location;
removing the first and fourth portions of the photoresist to expose segments of the layer in the first feature pattern location and second rim location;
removing the exposed segments of the layer from the first feature pattern location and second rim location;

UNITED STATES PATENT AND TRADEMARK OFFICE
CERTIFICATE OF CORRECTION

PATENT NO. : 6,841,310 B2
DATED : January 11, 2005
INVENTOR(S) : Dulman

It is certified that error appears in the above-identified patent and that said Letters Patent is hereby corrected as shown below:

Column 22, line 33 - Column 36, line 29 (cont'd), after removing the exposed segments of the layer, implanting dopant into the substrate in the first feature pattern location and second rim location;
    after implanting the dopant, removing the second and third portions of the photoresist to expose segments of the layer in the first rim location and second feature pattern location;
    removing the exposed segments of the layer from the first rim location and second feature pattern location; and
    wherein:
        the doped region of the first feature pattern location is comprised by a first feature pattern configured to impart a first rotation in phase to the wavelength of light when the wavelength passes through the first feature pattern;
        the first rim location comprises a first rim along a portion of the first feature pattern and configured to impart a second rotation in phase to the wavelength of light when the wavelength passes through the first rim; the second rotation in phase being from about 170 degrees to about 190 degrees relative to the first rotation in phase;
        the second feature pattern location comprises a second feature pattern configured to impart a third rotation in phase to the wavelength of light passing through the second feature pattern; the third rotation in phase being from about 170 degrees to about 190 degrees relative to the first rotation in phase; and
        the doped region of the second rim location is comprised by a second rim along a portion of the second feature pattern and configured to impart a fourth rotation in phase to the wavelength of light when the wavelength passes through the second rim; the fourth rotation in phase being from about 170 degrees to about 190 degrees relative to the third rotation in phase.

44. The method of claim 43 wherein the substrate consists essentially of quartz, and wherein the layer opaque to the wavelength is formed physically against the quartz of the substrate and comprises chromium.

45. The method of claim 43 wherein the dopant comprises boron, indium, arsenic, antimony or phosphorus.

46. A method of forming a radiation patterning tool, comprising:
    providing a substrate; the substrate comprising a mass transparent to a wavelength of light, and comprising a layer opaque to the wavelength of light over the mass;
    forming a layer of photoresist over the opaque material; a first portion of the photoresist being over a first defined feature pattern location, a second portion of the photoresist being over a first defined rim location; a third portion of the photoresist being over a second defined feature pattern location, and a fourth portion of the photoresist being over a second defined rim location;
    removing the first and third portions of the photoresist to expose segments of the layer in the first and second feature pattern locations;

UNITED STATES PATENT AND TRADEMARK OFFICE
CERTIFICATE OF CORRECTION

PATENT NO. : 6,841,310 B2
DATED : January 11, 2005
INVENTOR(S) : Dulman

It is certified that error appears in the above-identified patent and that said Letters Patent is hereby corrected as shown below:

Column 22, line 33 - Column 36, line 29 (cont'd), removing the exposed segments of the layer from the first and second feature pattern locations;
   after removing the exposed segments of the layer from the first and second feature pattern locations, removing the second and fourth portions of the photoresist to expose segments of the layer from the first and second rim locations,
   removing the exposed segments of the layer from the first and second rim locations;

after removing the exposed segments of the layer from the first and second rim locations; forming a photoresist mass over the first feature pattern location and first rim location;
   after forming the photoresist mass, implanting dopant into the substrate in the second feature
   pattern location and second rim location;
   after implanting the dopant, removing the photoresist mass; and
         wherein:
            the first feature pattern location comprises a first feature pattern configured to impart a first rotation in phase to the wavelength of light when the wavelength passes through the first feature pattern;
            the first rim location comprises a first rim along a portion of the first feature pattern and configured to impart a second rotation in phase to the wavelength of light when the wavelength passes through the first rim; the second rotation in phase being from about 170 degrees to about 190 degrees relative to the first rotation in phase;
            the doped second feature pattern location is comprised by a second feature pattern configured to impart a third rotation in phase to the wavelength of light passing through the second feature pattern; the third rotation in phase being from about 170 degrees to about 190 degrees relative to the first rotation in phase; and
            the doped second rim location is comprised by a second rim along a portion of the second feature pattern and configured to impart a fourth rotation in phase to the wavelength of light when the wavelength passes through the second rim; the fourth rotation in phase being from about 170 degrees to about 190 degrees relative to the third rotation in phase.

47. The method of claim 46 wherein the substrate comprises a quartz mass having a phase shifting layer thereover, wherein the phase shifting layer comprises molybdenum and silicon, and wherein the layer opaque to the wavelength comprises chromium.

48. The method of claim 47 wherein the doped region of the second feature pattern location is within the quartz mass, and wherein the doped region of the second rim location is within the phase shifting layer.

49. The method of claim 46 wherein the dopant comprises boron, indium, arsenic, antimony or phosphorus.

UNITED STATES PATENT AND TRADEMARK OFFICE
CERTIFICATE OF CORRECTION

PATENT NO. : 6,841,310 B2
DATED : January 11, 2005
INVENTOR(S) : Dulman

It is certified that error appears in the above-identified patent and that said Letters Patent is hereby corrected as shown below:

Column 22, line 33 - Column 36, line 29 (cont'd),

50. A method of forming a radiation patterning tool, comprising:
providing a substrate which includes a quartz base, a first phase shifting layer over the quartz base, a second phase shifting layer over the first phase shifting layer and having a different composition than the first phase shifting layer, and an opaque material over the second phase shifting layer;
etching a first pattern through the first phase shifting layer, second phase shifting layer, and opaque layer, and into the substrate; the first pattern being a first feature pattern; the first feature pattern having a periphery and being configured to impart a first rotation in phase to a wavelength of light passing through the feature pattern;
etching a second pattern through the first phase shifting layer, second phase shifting layer, and opaque layer; the second pattern being a second feature pattern; the second feature pattern having a periphery and being configured to impart a second rotation in phase to a wavelength of light passing through the feature pattern; the second rotation in phase being from about 170 degrees to about 190 degrees relative to the first rotation in phase;
etching a third pattern through the opaque layer; the third pattern being a first rim; the first rim being along a portion of the first feature pattern periphery but not along an entirety of the first feature pattern periphery; the first rim being configured to impart a third rotation in phase to the wavelength of light when the wavelength passes through the first rim; the third rotation in phase being from about 170 degrees to about 190 degrees relative to the first rotation in phase; and
etching a fourth pattern through the opaque layer and the second phase shifting layer, and to the first phase shifting layer; the fourth pattern being a second rim; the second rim being along a portion of the second feature pattern periphery but not along an entirety of the second feature pattern periphery; the second rim being configured to impart a fourth rotation in phase to the wavelength of light when the wavelength passes through the second rim; the fourth rotation in phase being from about 170 degrees to about 190 degrees relative to the second rotation in phase.

51. The method of claim 50 wherein the formation of the first rim and first feature pattern comprises:
forming a layer of photoresist over the opaque material; a first portion of the photoresist being over a defined first feature pattern location, and a second portion of the photoresist being over a defined first rim location;
reducing a thickness of the photoresist over the first portion relative to the second portion to form a stepped photoresist mask having a greater thickness over the first rim location than over the first feature pattern location;
subjecting the photoresist to an etch to remove the photoresist from over the first feature pattern location while leaving the photoresist over the first rim location, the removal of the photoresist from over the first feature pattern location exposing a segment of the opaque layer;
etching into the first feature pattern location to remove the exposed segment of the opaque layer and form a first opening extending into the first feature pattern location;
extending the first opening through the first and second phase shifting layers and into the substrate;
after extending the first opening, removing the photoresist from over the first rim location; and

UNITED STATES PATENT AND TRADEMARK OFFICE
CERTIFICATE OF CORRECTION

PATENT NO. : 6,841,310 B2
DATED : January 11, 2005
INVENTOR(S) : Dulman

It is certified that error appears in the above-identified patent and that said Letters Patent is hereby corrected as shown below:

Column 22, line 33 - Column 36, line 29 (cont'd), removing the opaque layer from over the first rim pattern to form the first rim extending through the opaque layer and to the second phase shifting layer.

52. The method of claim 51 wherein the formation of the stepped photoresist mask comprises;
exposing the first and second portions of the photoresist to radiation, the first portion of the photoresist being exposed to a different dose of the radiation than the second portion of the photoresist; and
subjecting the photoresist to a developing solution, the developing solution removing more of the photoresist from the first portion than from the second portion to form the stepped photoresist mask.

53. The method of claim 50 wherein the formation of the second rim and second feature pattern comprises:
forming a layer of photoresist over the opaque material; a first portion of the photoresist being over a defined second feature pattern location, and a second portion of the photoresist being over a defined second rim location;
reducing a thickness of the photoresist over the first portion relative to the second portion to form a stepped photoresist mask having a greater thickness over the second rim location than over the second feature pattern location;
subjecting the photoresist to an etch to remove the photoresist from over the second feature pattern location while leaving the photoresist over the second rim location, the removal of the photoresist from over the second feature pattern location exposing a segment of the opaque layer;
etching into the second feature pattern location to remove the exposed segment of the opaque layer and form a first opening extending into the second feature pattern location;
extending the first opening through the second phase shifting layer;
after extending the first opening, removing the photoresist from over the second rim location;
removing the opaque layer from over the second rim pattern to form a second opening extending into the second rim location; and
extending the first and second openings to form the second feature pattern to extend through to the quartz substrate and form the second rim to extend to the first phase shifting layer.

54. The method of claim 53 wherein the formation of the stepped photoresist mask comprises;
exposing the first and second portions of the photoresist to radiation, the first portion of the photoresist being exposed to a different dose of the radiation than the second portion of the photoresist; and
subjecting the photoresist to a developing solution, the developing solution removing more of the photoresist from the first portion than from the second portion to form the stepped photoresist mask.

UNITED STATES PATENT AND TRADEMARK OFFICE
CERTIFICATE OF CORRECTION

PATENT NO.     : 6,841,310 B2
DATED          : January 11, 2005
INVENTOR(S)    : Dulman It is certified that error appears in the above-identified patent and that said Letters Patent is hereby corrected as shown below:

<u>Column 22, line 33 - Column 36, line 29 (cont'd),</u>

55. The method of claim 50 wherein the formation of the first feature pattern and second feature pattern comprises:
forming a patterned layer of photoresist over the opaque material; a portion of the photoresist being over a defined second feature pattern location, and a defined first feature location being exposed through an opening in the patterned photoresist;
while the patterned photoresist covers the second feature pattern location, etching into the first feature pattern location to remove a segment of the opaque layer and form a first opening extending into the first feature pattern location;
extending the first opening through the second phase shifting layer;
after extending the first opening, removing the photoresist from over the second feature pattern location;
removing the opaque layer from over the second feature pattern location to form a second opening extending into the second feature location; and
extending the first opening through the second phase shifting layer and into the substrate while extending the second opening through the first and second phase shifting layers and to the substrate.

56. The method of claim 50 wherein the first phase shifting layer attenuates the light more than the second phase shifting layer.

57. The method of claim 50 wherein:
the first phase shifting layer comprises molybdenum and silicon; and
the second phase shifting layer comprises silicon and one or both of oxygen and nitrogen.

58. The method of claim 50 wherein the opaque layer comprises chromium.

59. The method of claim 50 wherein the first and second feature patterns are arranged in rows and columns; wherein the first and second feature patterns alternate with one another along the rows of the array; and wherein the first and second rims are along columns of the array.

60. The method of claim 59 wherein the first and second feature patterns do not alternate with one another along the columns of the array.

61. The method of claim 59 wherein the first and second feature patterns alternate with one another along the columns of the array.

62. The method of claim 59 wherein the first and second feature patterns do not alternate with one another along the columns of the array, wherein adjacent feature patterns along the columns are separated from one another by a distance, and wherein the rims extend an entirety of the distance between adjacent feature patterns along the columns of the array.

63. The method of claim 59 further comprising forming a plurality of side-lobe-suppressing patterns between adjacent rims along columns of the array.

UNITED STATES PATENT AND TRADEMARK OFFICE
CERTIFICATE OF CORRECTION

PATENT NO. : 6,841,310 B2
DATED : January 11, 2005
INVENTOR(S) : Dulman

It is certified that error appears in the above-identified patent and that said Letters Patent is hereby corrected as shown below:

<u>Column 22, line 33 - Column 36, line 29 (cont'd),</u>

64. The method of claim 59 further comprising forming a plurality of side-lobe-suppressing patterns between adjacent rims along columns of the array; individual side-lobe-suppressing patterns being between adjacent rims along columns of the array; the individual side-lobe-suppressing patterns being configured to rotate the wavelength of light by from about 170 degrees to about 190 degrees relative to the rotation imparted to the light by the rims on either side of the individual side-lobe-suppressing patterns.

65. The method of claim 64 wherein adjacent rims along the columns of the array are separated from one another by a distance, and wherein the individual side-lobe-suppressing patterns are formed to extend an entirety of the distance between adjacent rims along the columns of the array.

66. The method of claim 64 wherein adjacent rims along the columns of the array are separated from one another by a distance, and wherein the individual side-lobe-suppressing patterns are formed to not extend an entirety of the distance between adjacent rims along the columns of the array.

67. The method of claim 59 wherein the first and second rims are not formed along rows of the array.

Signed and Sealed this

Sixteenth Day of August, 2005

JON W. DUDAS
*Director of the United States Patent and Trademark Office*